United States Patent
Kao et al.

(10) Patent No.: US 12,142,695 B2
(45) Date of Patent: Nov. 12, 2024

(54) TRANSISTOR DEVICE HAVING FIN-SHAPED CHANNEL AND METHODS FOR FORMING THE SAME

(71) Applicant: Taiwan Semiconductor Manufacturing Company Limited, Hsinchu (TW)

(72) Inventors: Yun-Feng Kao, Hsinchu (TW); Katherine H. Chiang, New Taipei (TW)

(73) Assignee: Taiwan Semiconductor Manufacturing Company Limited, Hsinchu (TW)

(*) Notice: Subject to any disclaimer, the term of this patent is extended or adjusted under 35 U.S.C. 154(b) by 419 days.

(21) Appl. No.: 17/575,800

(22) Filed: Jan. 14, 2022

(65) Prior Publication Data
US 2023/0008554 A1    Jan. 12, 2023

Related U.S. Application Data

(60) Provisional application No. 63/219,842, filed on Jul. 9, 2021.

(51) Int. Cl.
*H01L 29/786*    (2006.01)
*H01L 21/02*    (2006.01)
(Continued)

(52) U.S. Cl.
CPC .. *H01L 29/78696* (2013.01); *H01L 21/02565* (2013.01); *H01L 29/401* (2013.01);
(Continued)

(58) Field of Classification Search
CPC ......... H01L 29/78696; H01L 21/02565; H01L 29/401; H01L 29/41733; H01L 29/66969; H01L 29/78603; H01L 29/7869; H01L 21/823412; H01L 21/823431; H01L 21/823475; H01L 27/0886; H01L 21/823821; H01L 21/845; H01L 27/0924; H01L 27/10826; H01L 27/10879; H01L 27/1211; H01L 29/41791;
(Continued)

(56) References Cited

U.S. PATENT DOCUMENTS

2020/0411669 A1*  12/2020  Sharma ............... H01L 29/7869

* cited by examiner

*Primary Examiner* — Mohammad A Rahman
(74) *Attorney, Agent, or Firm* — The Marbury Law Group, PLLC

(57) ABSTRACT

A transistor device including source and drain electrodes, a fin structure extending between and contacting respective sidewalls of the source and drain electrodes, a semiconductor channel layer over the upper surface and side surfaces of the fin structure and including a first and second vertical portions over the side surfaces of the fin structure, and the first and second vertical portions of the semiconductor channel layer both contact the respective sidewalls of the source electrode and the drain electrode, a gate dielectric layer over the semiconductor channel layer, and a gate electrode over the gate dielectric layer. By forming the semiconductor channel layer over a fin structure extending between sidewalls of the source and drain electrodes, a contact area between the semiconductor channel and the source and drain electrodes may be increased, which may provide increased driving current for the transistor device without increasing the device size.

20 Claims, 40 Drawing Sheets

(51) Int. Cl.
*H01L 29/40* (2006.01)
*H01L 29/417* (2006.01)
*H01L 29/66* (2006.01)

(52) U.S. Cl.
CPC .. *H01L 29/41733* (2013.01); *H01L 29/66969* (2013.01); *H01L 29/78603* (2013.01); *H01L 29/7869* (2013.01)

(58) Field of Classification Search
CPC . H01L 29/66795–66818; H01L 29/785–7856; H01L 2029/7857–7858; H01L 2924/13067; H01L 29/04–045; H01L 29/16–1608; H01L 29/18–185; H01L 29/22–2206; H01L 29/36–365

See application file for complete search history.

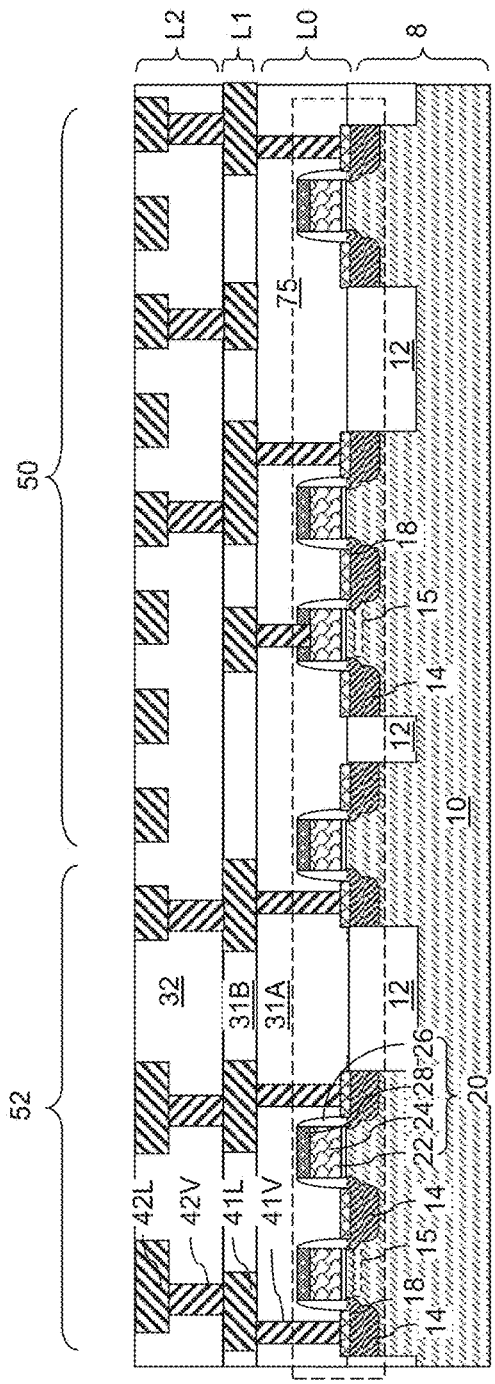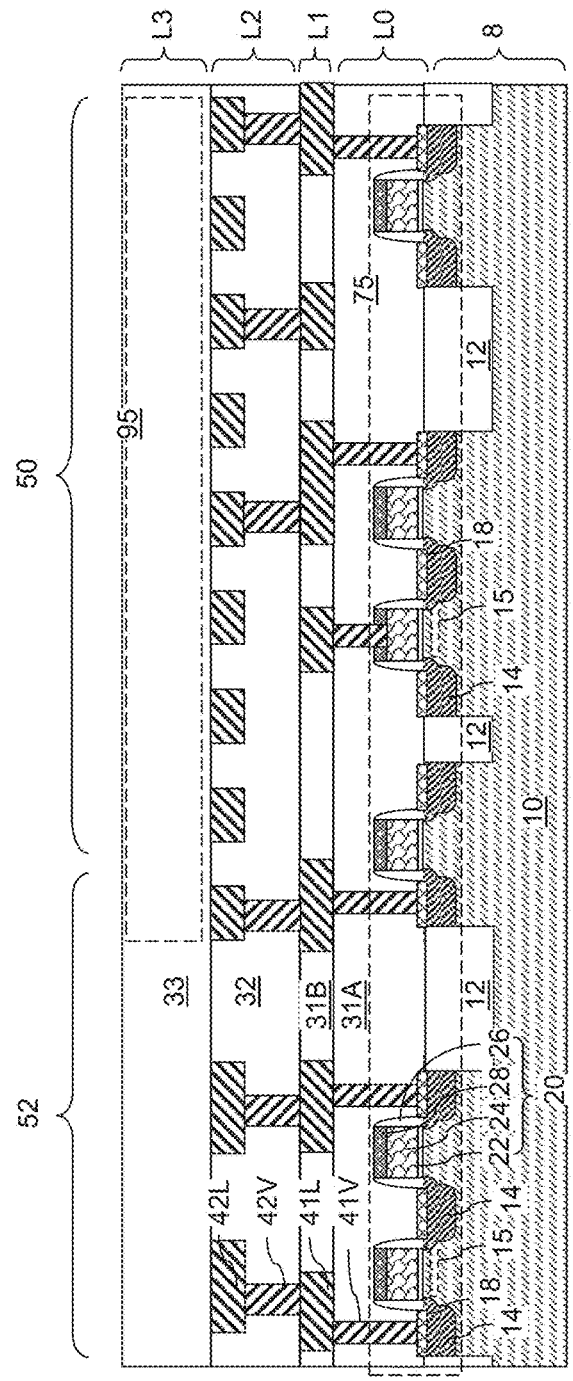

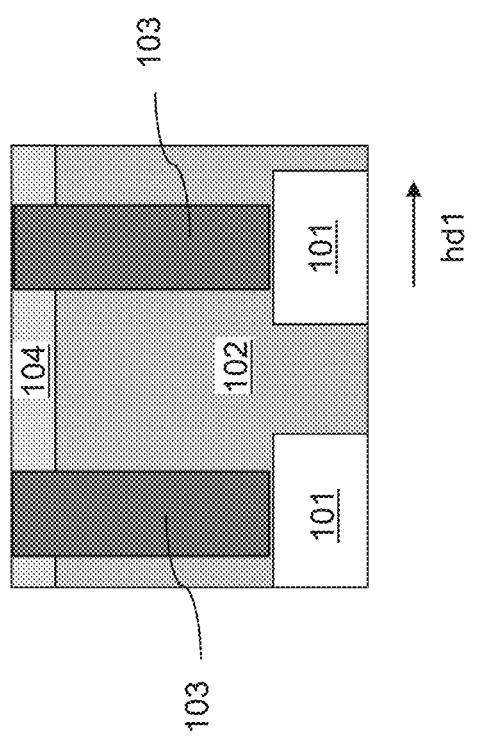

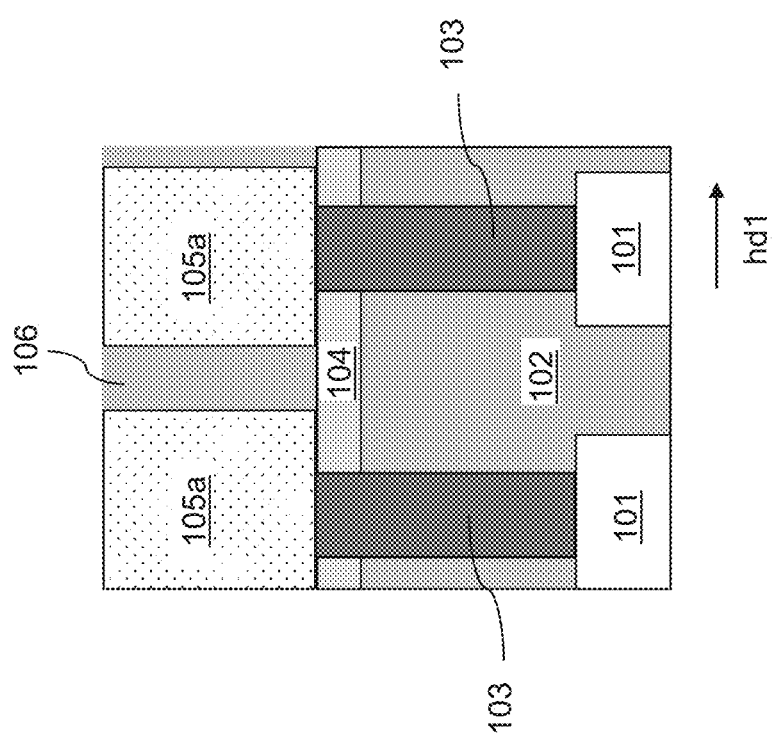

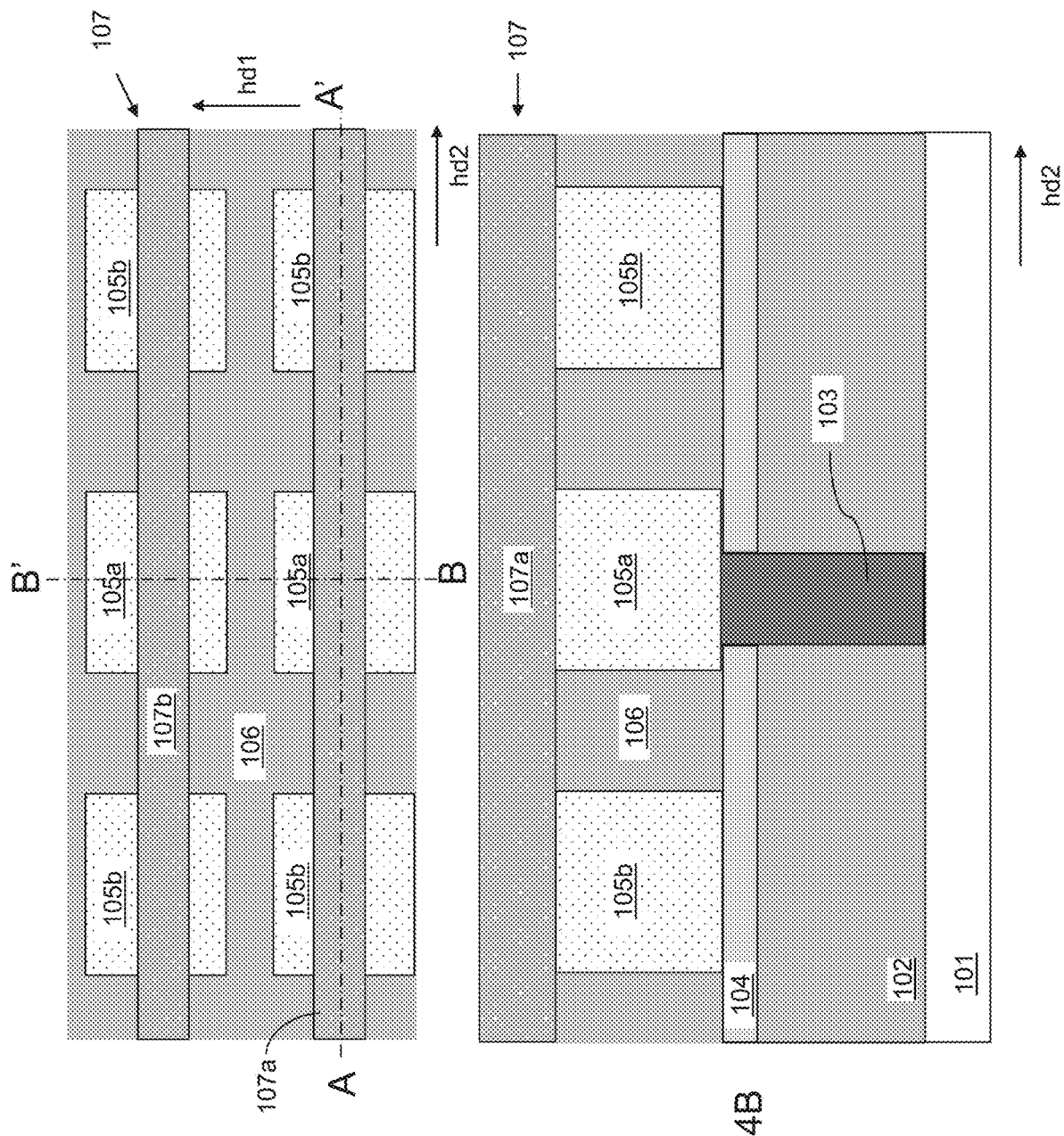

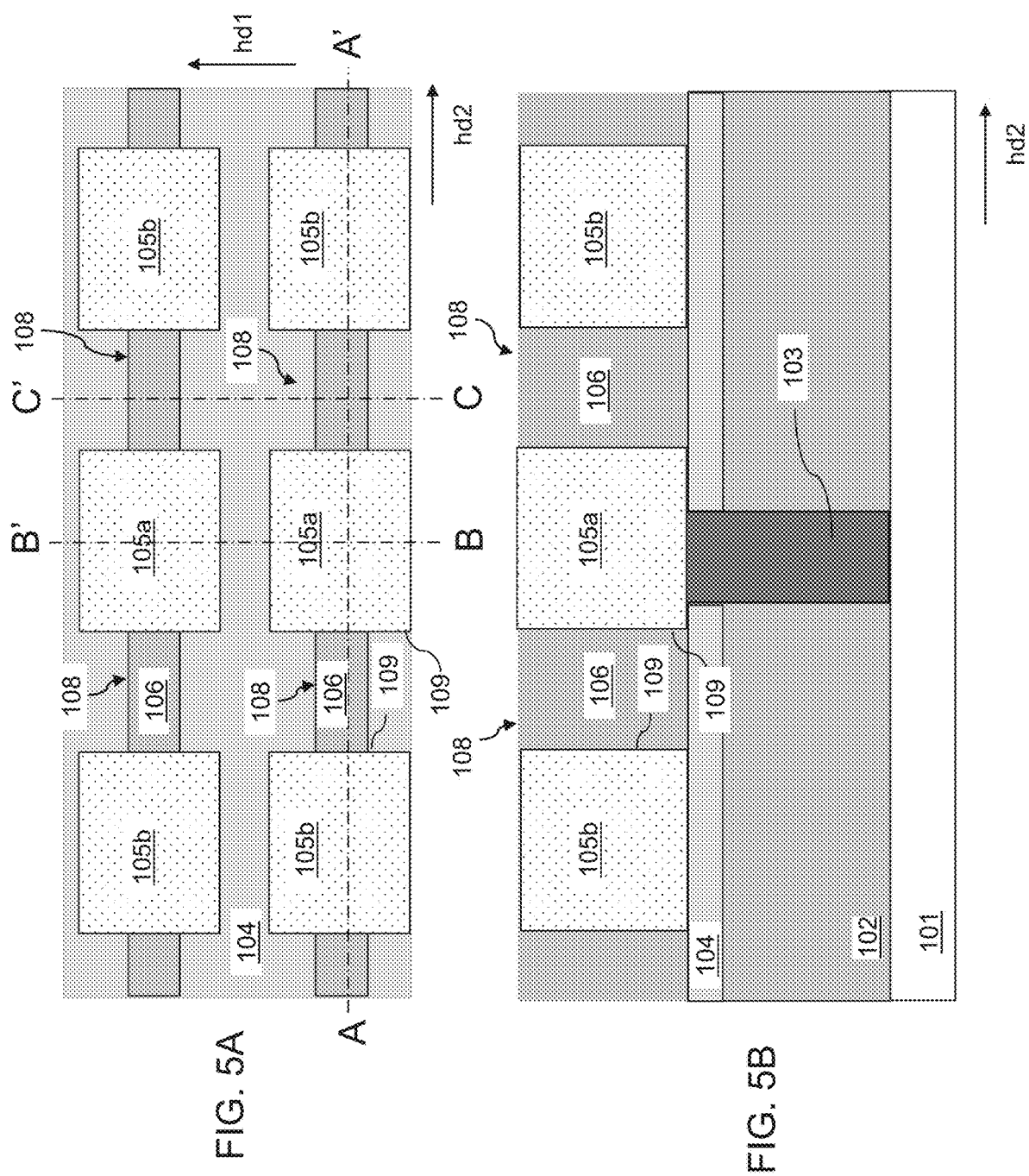

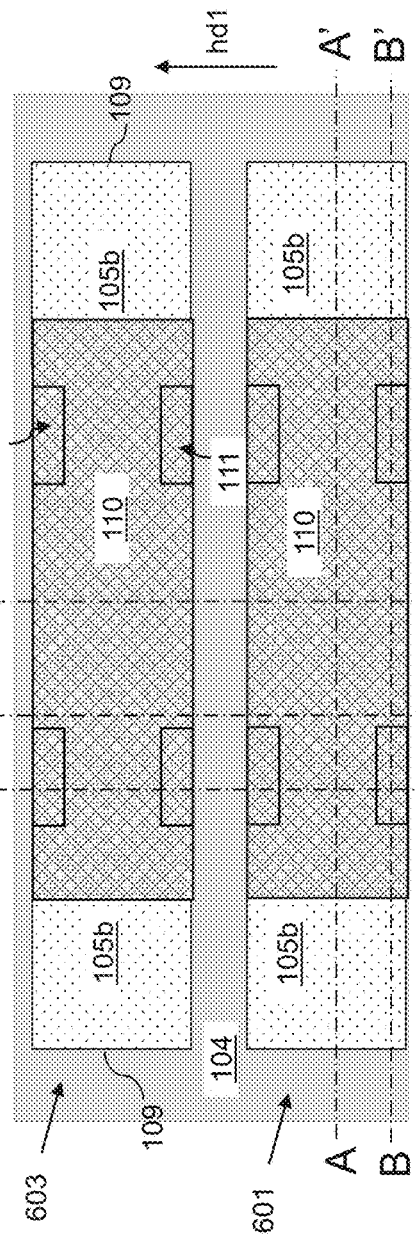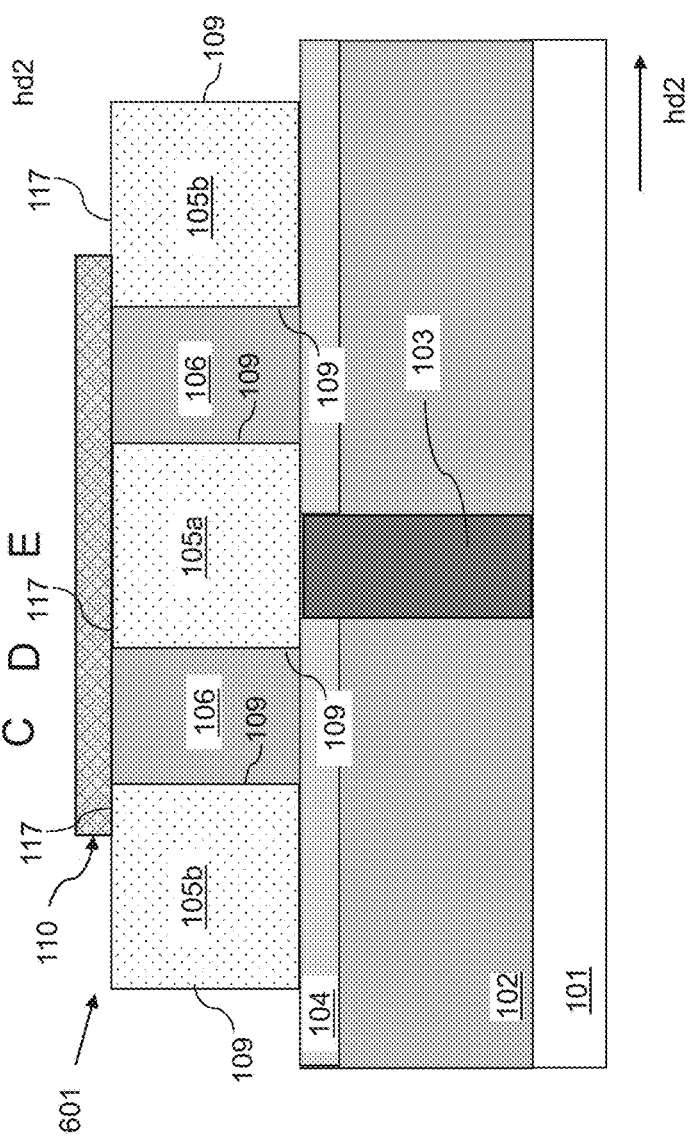
FIG. 6A
FIG. 6B

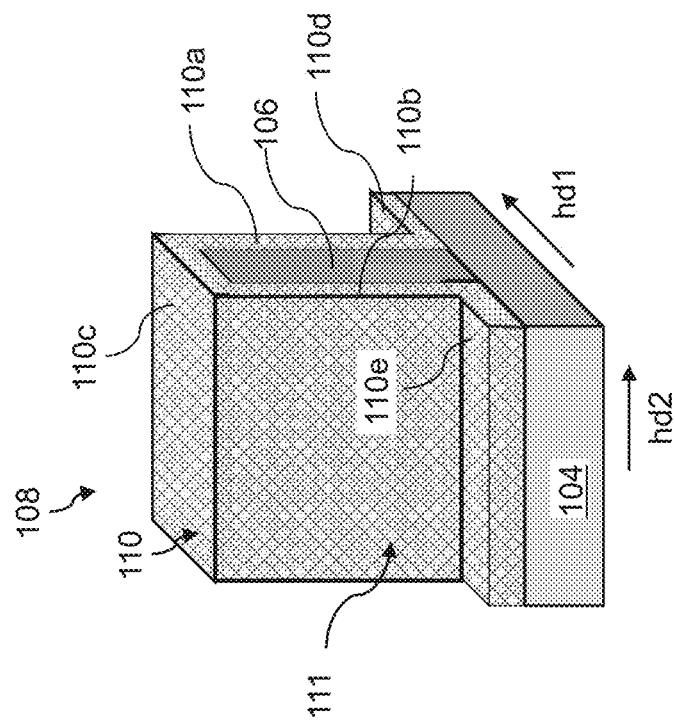
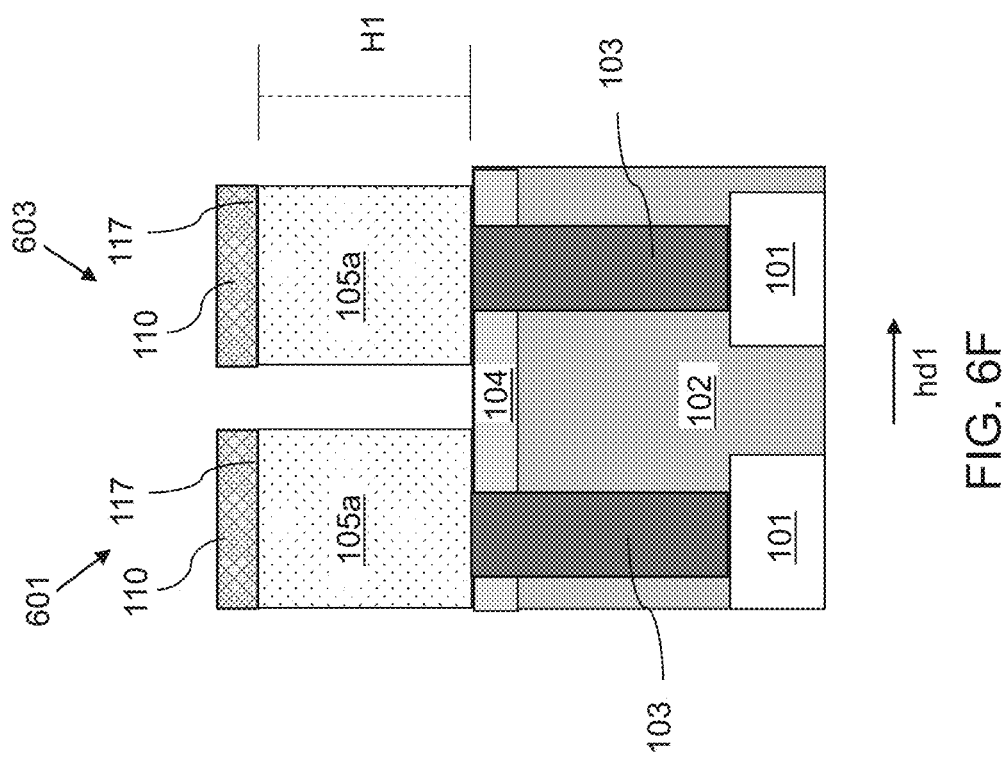
FIG. 6G
FIG. 6F

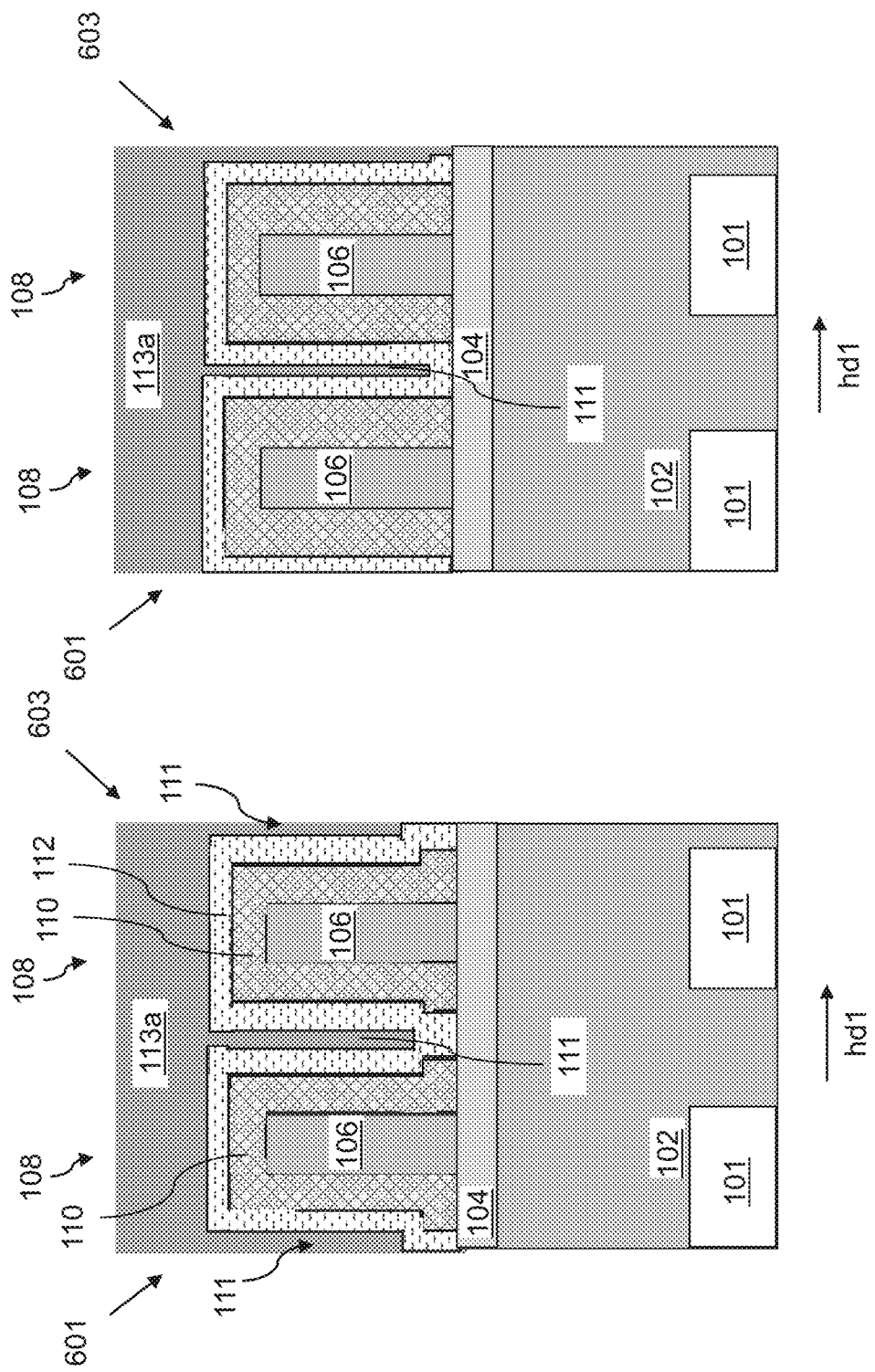

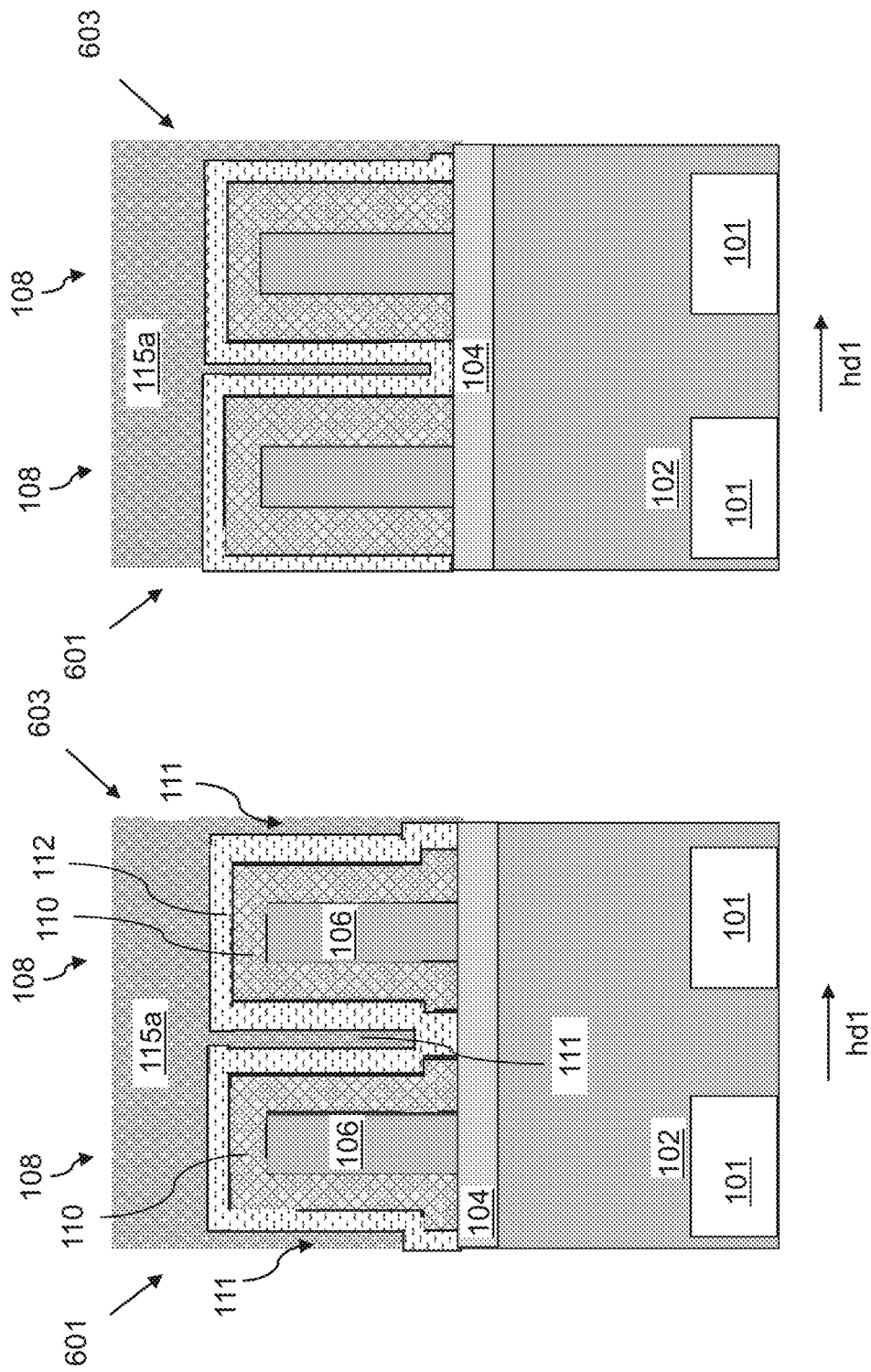

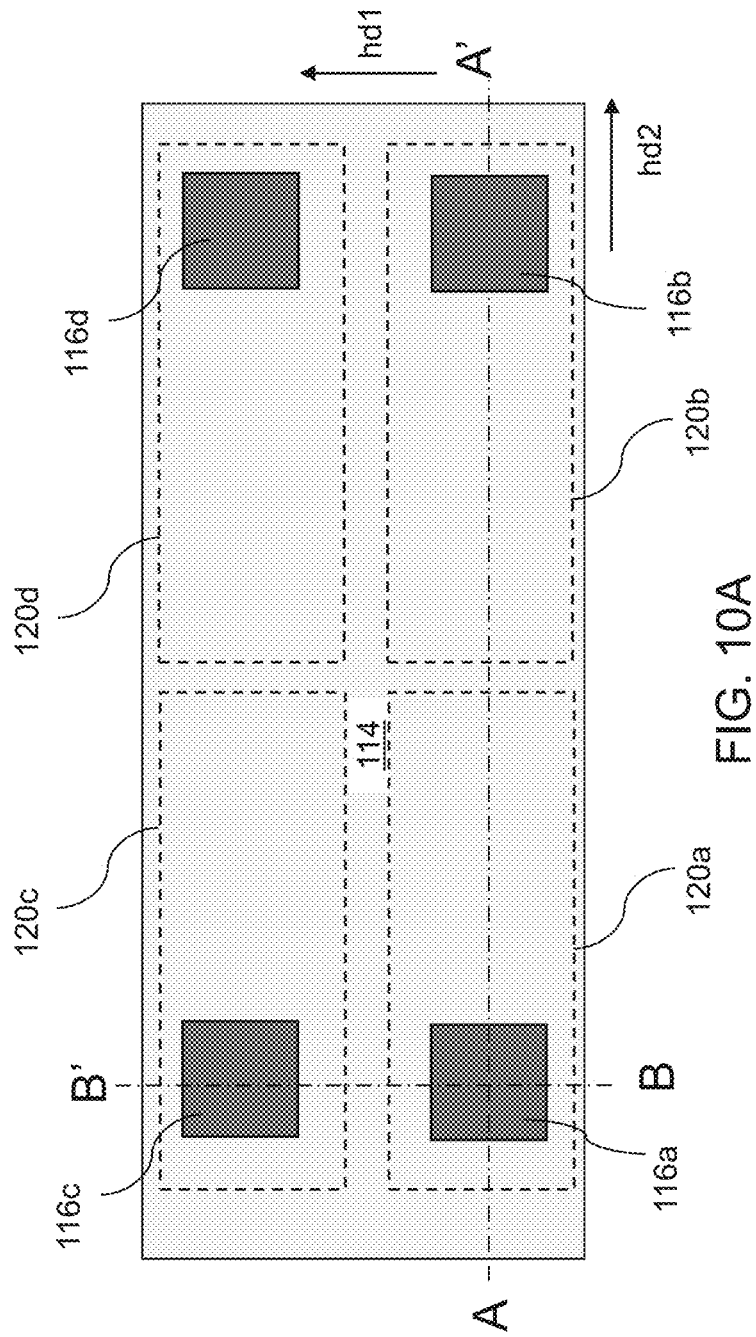

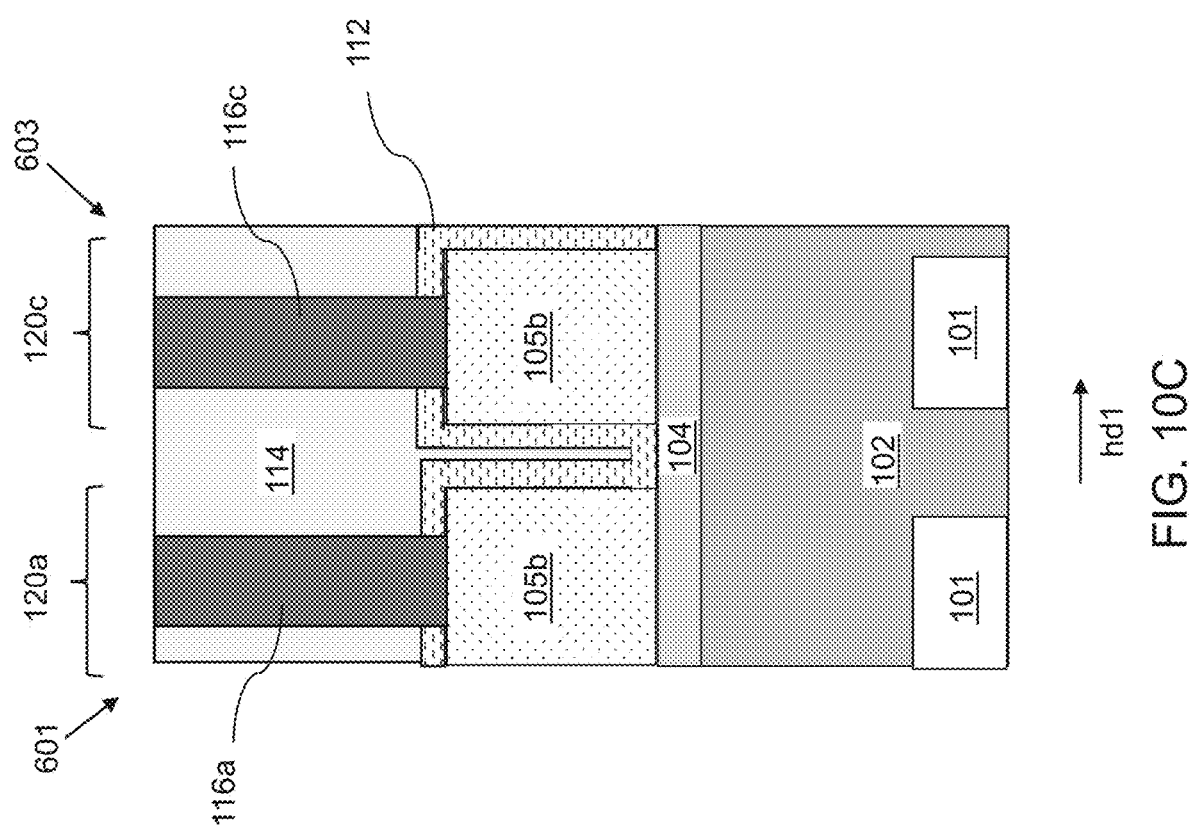

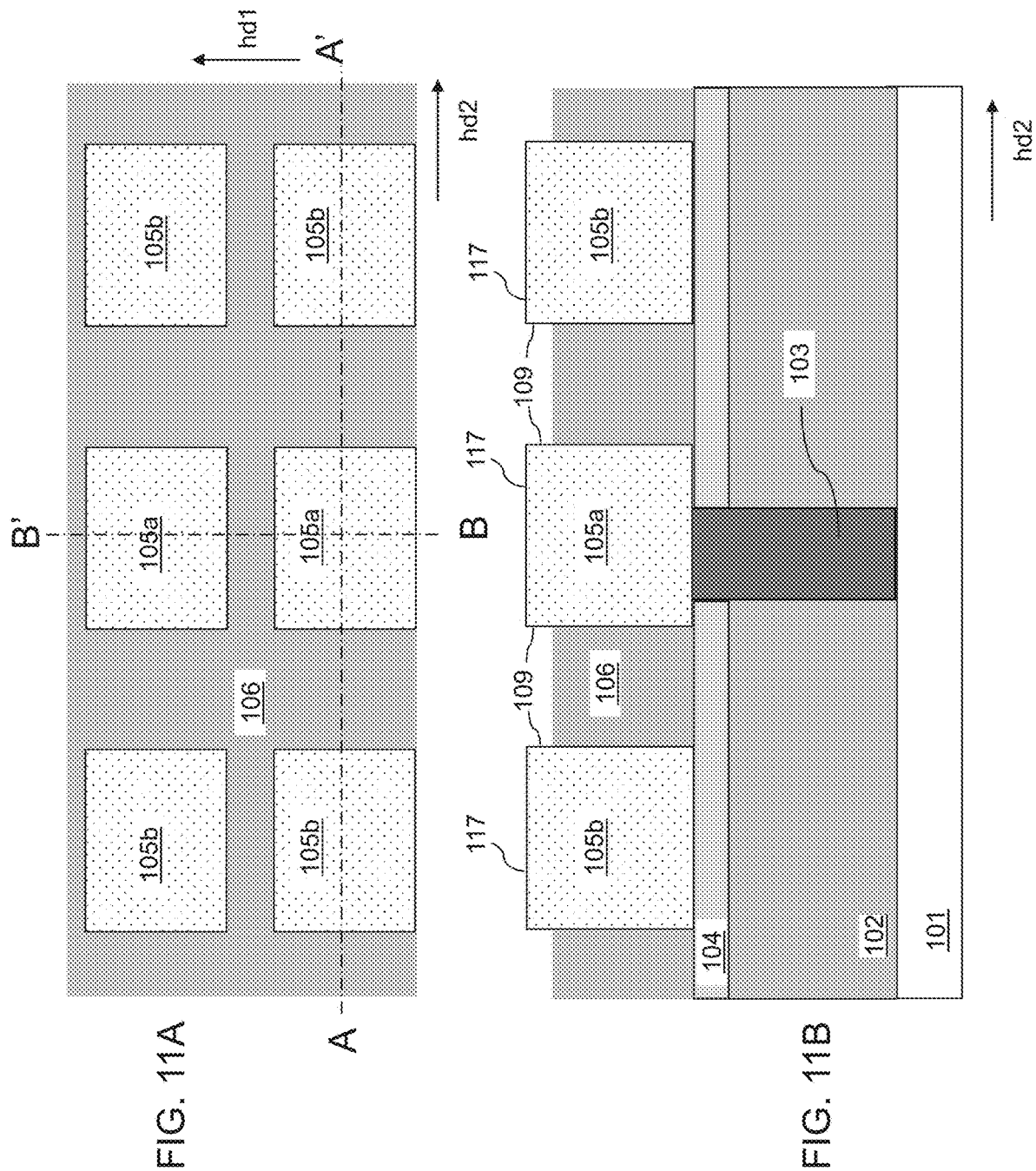

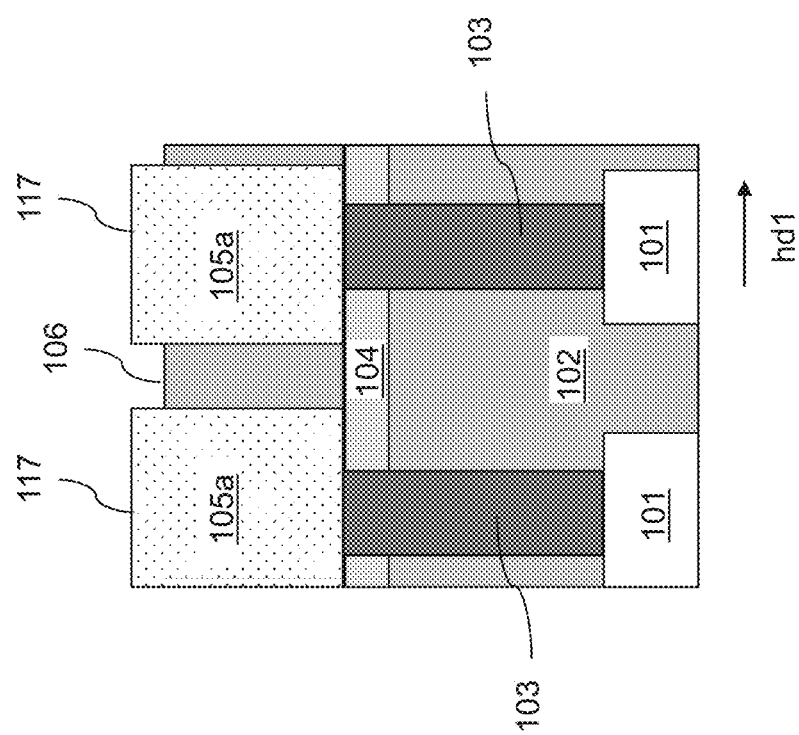

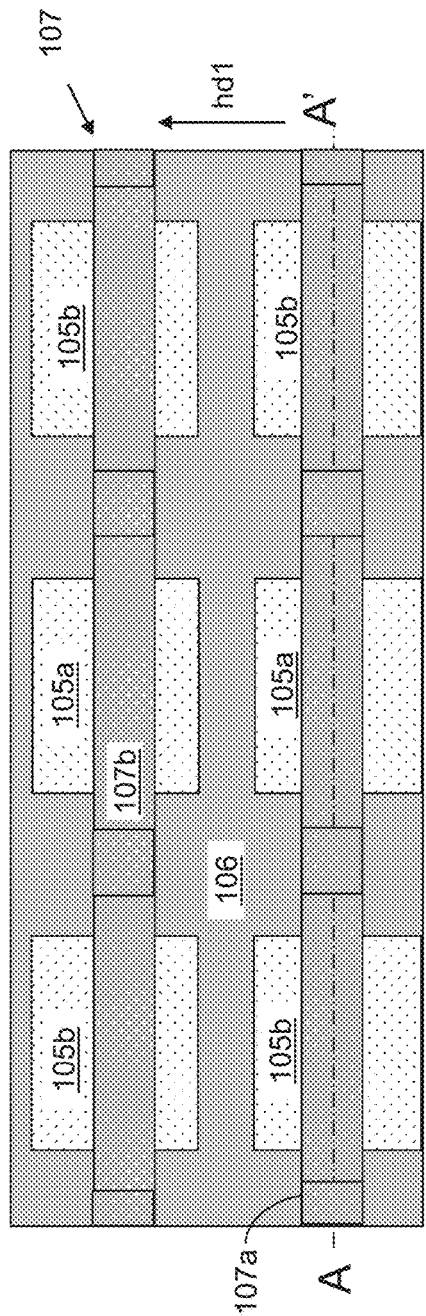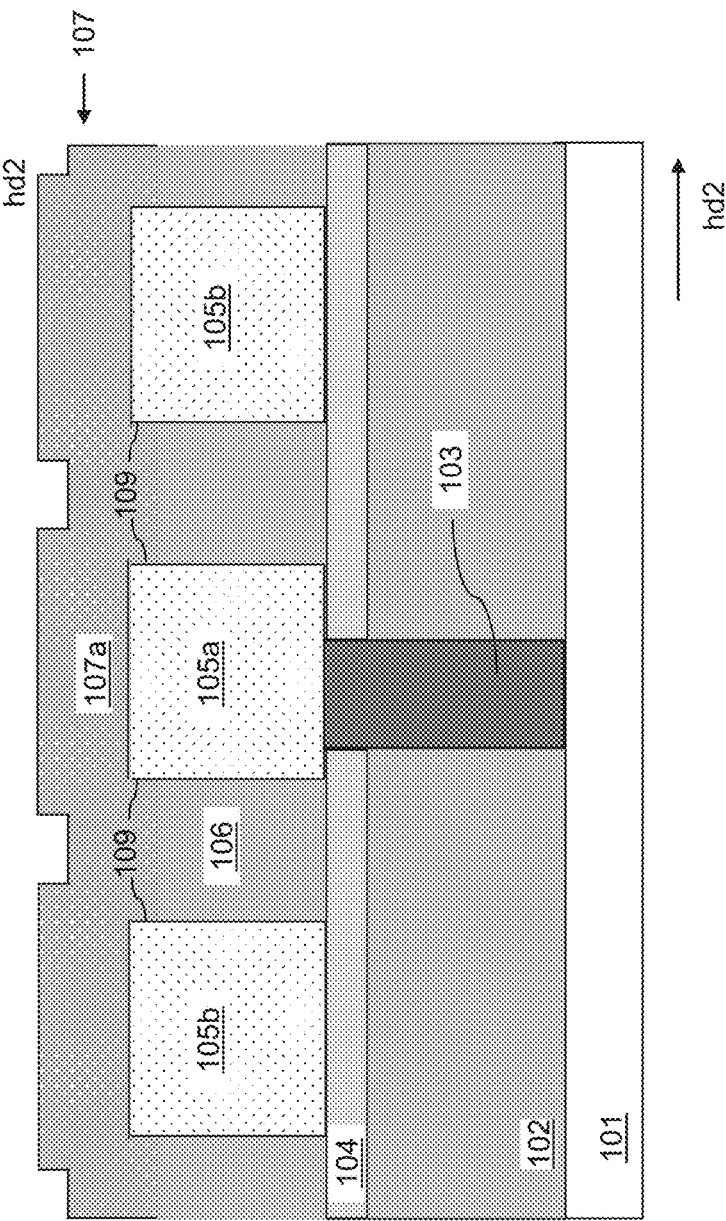

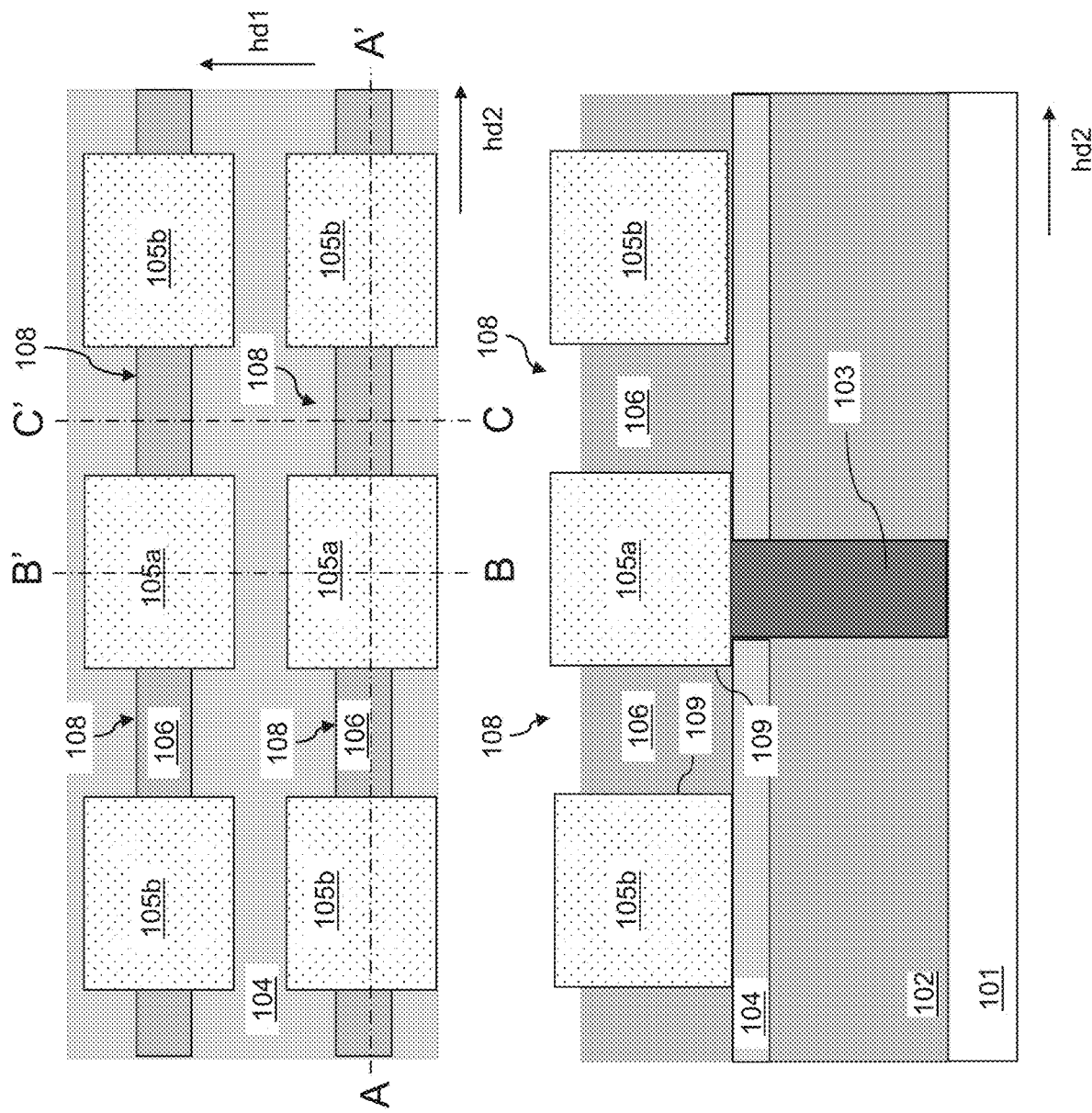

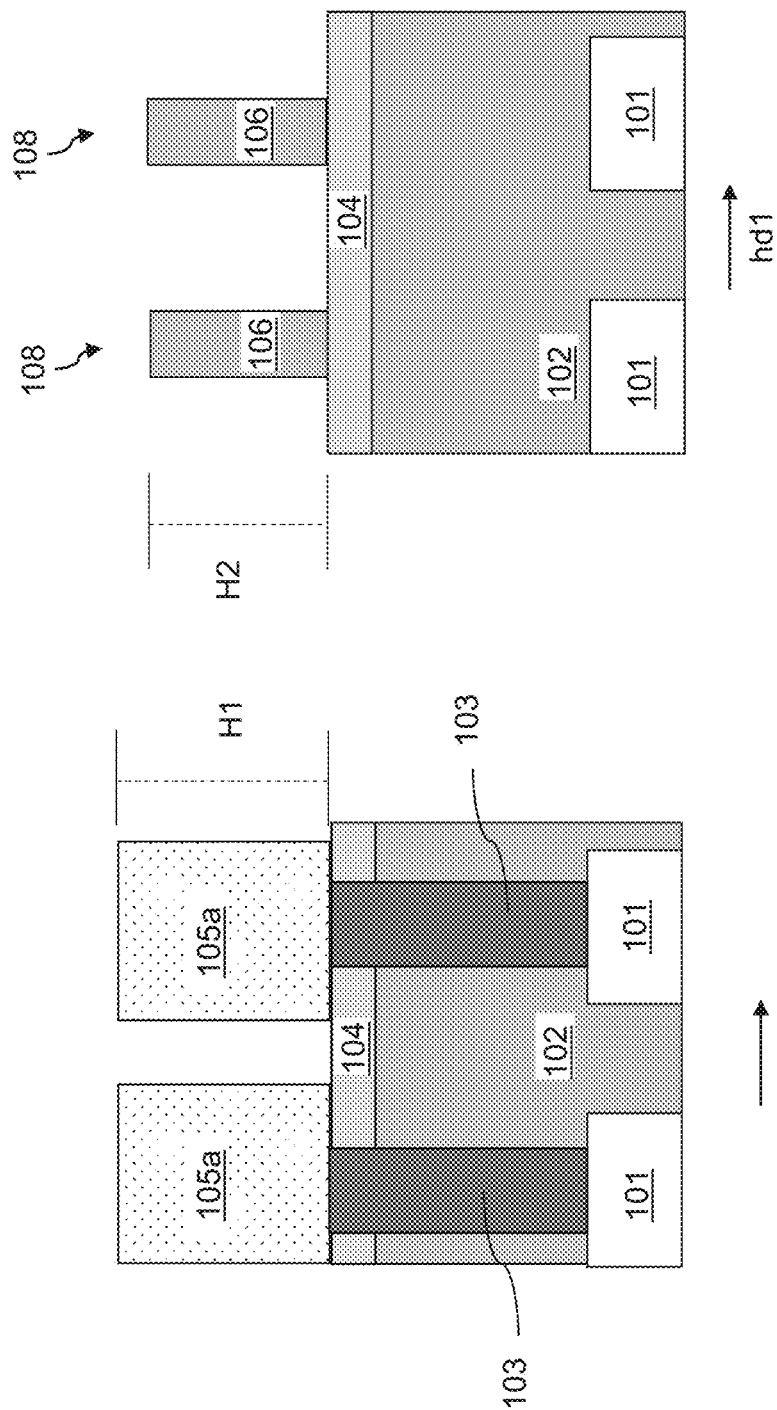

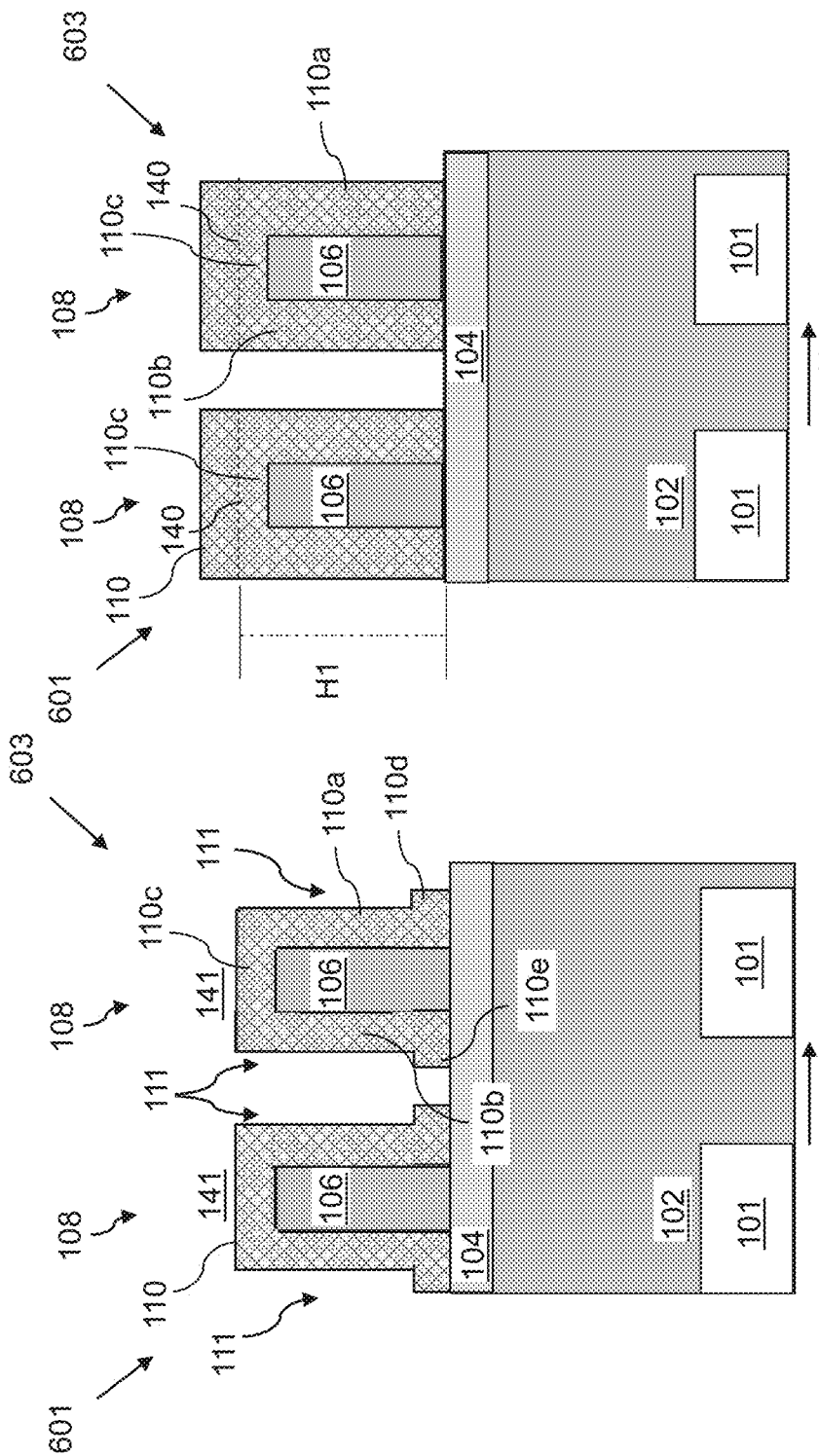

TRANSISTOR DEVICE HAVING FIN-SHAPED CHANNEL AND METHODS FOR FORMING THE SAME

RELATED APPLICATIONS

This application claims priority to U.S. Provisional Patent Application No. 63/219,842 entitled "Fin-channel Thin Film Transistor in BEOL for High-Density Memory Applications" filed on Jul. 9, 2021, the entire contents of which are hereby incorporated by reference for all purposes.

BACKGROUND

A variety of transistor structures have been developed to meet various design criteria. Thin film transistors (TFT), including TFTs having oxide semiconductor channel layers, are an attractive option for back-end-of-line (BEOL) integration since the TFT fabrication process typically operates as a lower temperature and is compatible with existing BEOL processes and may not damage previously fabricated devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1A is a vertical cross-sectional view of a first exemplary structure prior to formation of an array of transistor devices according to an embodiment of the present disclosure.

FIG. 1B is a vertical cross-sectional view of the first exemplary structure during formation of the array of transistor devices according to an embodiment of the present disclosure.

FIG. 2C is a vertical cross-section view of the exemplary structure along line B-B' in FIG. 2A.

FIG. 3C is a vertical cross-section view of the exemplary structure along line B-B' in FIG. 3A.

FIG. 4A is a top view of an exemplary structure during a process of forming a plurality of transistor devices showing a patterned mask over the upper surfaces of the first electrodes, the second electrodes, and the dielectric layer according to an embodiment of the present disclosure.

FIG. 4B is a vertical cross-section view of the exemplary structure along line A-A' in FIG. 4A.

FIG. 5A is a top view of an exemplary structure during a process of forming a plurality of transistor devices following an etching process to remove portions of the dielectric layer and form fin structures contacting the first electrodes and the second electrodes according to an embodiment of the present disclosure.

FIG. 5B is a vertical cross-section view of the exemplary structure along line A-A' in FIG. 5A.

FIG. 6A is a top view of an exemplary structure during a process of forming a plurality of transistor devices showing a semiconductor channel layer formed over the upper surfaces of the first electrodes and the second electrodes, and over the upper surface and side surfaces of the fin structures according to an embodiment of the present disclosure.

FIG. 6B is a vertical cross-section view of the exemplary structure along line A-A' in FIG. 6A.

FIG. 6F is a vertical cross-section view of the exemplary structure along line E-E' in FIG. 6A.

FIG. 6G is a perspective view showing the semiconductor channel layer over a fin structure according to an embodiment of the present disclosure.

FIG. 8D is a vertical cross-section view of the exemplary structure along line C-C' in FIG. 8A.

FIG. 8E is a vertical cross-section view of the exemplary structure along line D-D' in FIG. 8A.

FIG. 9D is a vertical cross-section view of the exemplary structure along line C-C' in FIG. 9A.

FIG. 9E is a vertical cross-section view of the exemplary structure along line D-D' in FIG. 9A.

FIG. 10A is a top view of an exemplary structure showing a plurality of transistor devices including conductive vias formed through the dielectric material layer according to an embodiment of the present disclosure.

FIG. 10C is a vertical cross-section view of the exemplary structure along line B-B' in FIG. 10A.

FIG. 11A is a top view of an exemplary structure during a process of forming a plurality of transistor devices showing first electrodes and second electrodes embedded in a dielectric material layer having an upper surface that is recessed an embodiment of the present disclosure.

FIG. 11B is a vertical cross-section view of the exemplary structure along line A-A' in FIG. 11A.

FIG. 11C is a vertical cross-section view of the exemplary structure along line B-B' in FIG. 11A.

FIG. 12A is a top view of an exemplary structure during a process of forming a plurality of transistor devices showing a patterned mask over the upper surfaces of the first electrodes, the second electrodes, and the dielectric material according to an embodiment of the present disclosure.

FIG. 12B is a vertical cross-section view of the exemplary structure along line A-A' in FIG. 12A.

FIG. 13A is a top view of an exemplary structure during a process of forming a plurality of transistor devices following an etching process to remove portions of a dielectric layer and form fin structures contacting the first electrodes and the second electrodes according to an embodiment of the present disclosure.

FIG. 13B is a vertical cross-section view of the exemplary structure along line A-A' in FIG. 13A.

FIG. 13C is a vertical cross-section view of the exemplary structure along line B-B' in FIG. 13A.

FIG. 13D is a vertical cross-section view of the exemplary structure along line C-C' in FIG. 13A.

FIG. 14C is a vertical cross-section view of the exemplary structure along line B-B' in FIG. 14A.

FIG. 14D is a vertical cross-section view of the exemplary structure along line C-C' in FIG. 14A.

DETAILED DESCRIPTION

Figure 1C:
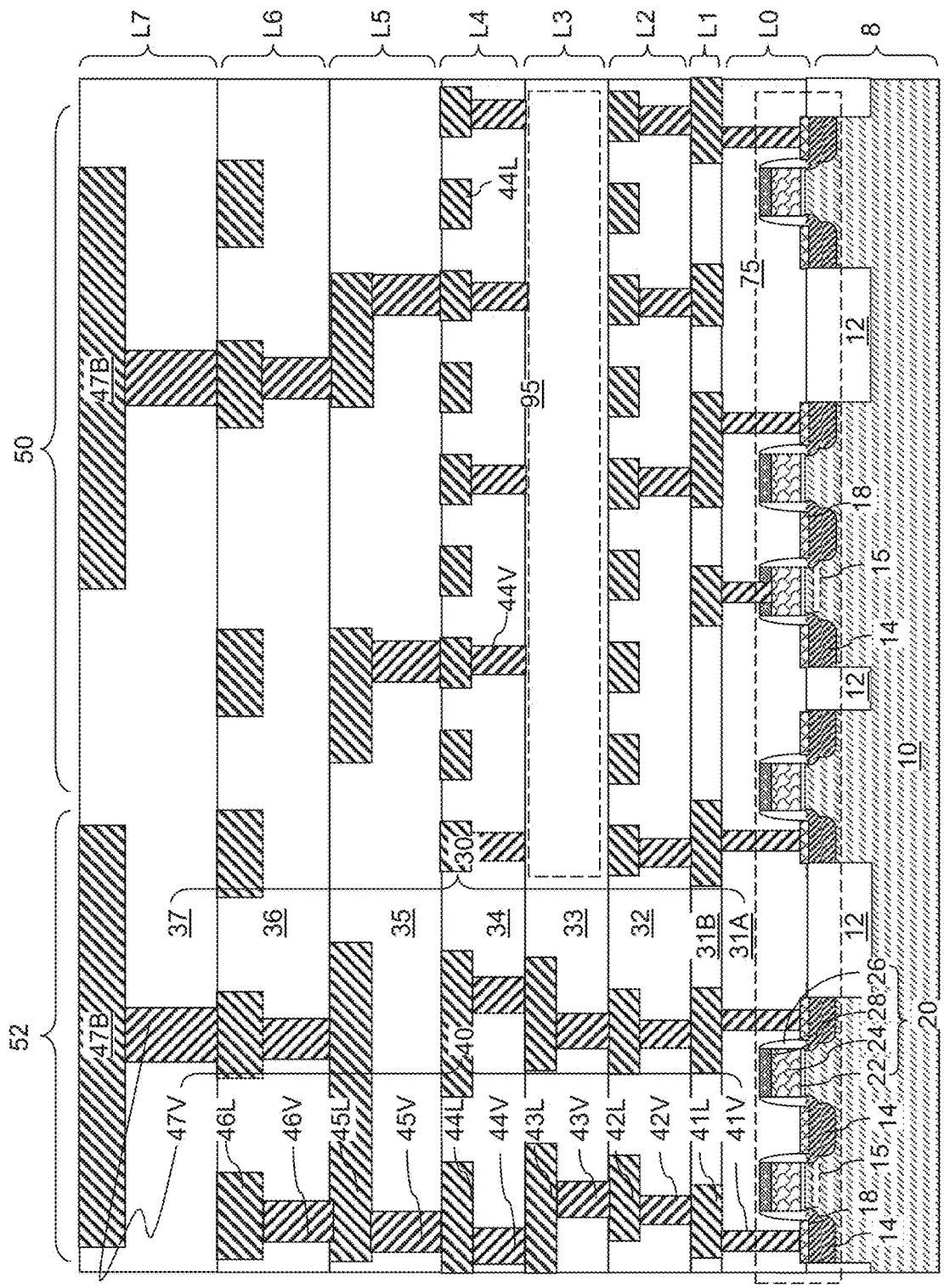
FIG. 1C is a vertical cross-sectional view of the first exemplary intermediate structure after formation of upper-level metal interconnect structures according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

Generally, the structures and methods of the present disclosure may be used to form a semiconductor structure including at least one transistor (e.g., a thin film transistor (TFT)) such as a plurality of transistors (e.g., a plurality of TFTs). The transistors may be formed over any substrate, which may be an insulating substrate, a conductive substrate, or a semiconductor substrate. In embodiments that utilize a conductive substrate or a semiconductor substrate, at least one insulating layer may be used to provide electrical isolation between the thin film transistors and the underlying substrate. In embodiments in which a semiconductor substrate such as a single crystalline silicon substrate is used, field effect transistors using portions of the semiconductor substrate as semiconductor channels may be formed on the semiconductor substrate, and metal interconnect structures embedded in interconnect-level dielectric layers may be formed over the field effect transistors. The transistors may be formed over the field effect transistors including semiconductor channels and over the metal interconnect structures, which are herein referred to as lower-level metal interconnect structures. In some embodiments, the transistors according to various embodiments of the present disclosure may form or may be part of a semiconductor memory device.

The fabrication of transistor devices, such as TFT devices, including oxide semiconductors, is an attractive option for back-end-of-line (BEOL) integration since TFTs may be processed at low temperatures and thus will not damage previously fabricated devices.

One issue with some TFT devices, including some TFT devices formed using a back-end-of-the-line (BEOL) process, is that the driving currents of the transistors may be relatively small. One way in which the driving current may be increased is to increase the contact area between the source and drain electrodes and the semiconductor channel of the TFT devices. However, for a planar TFT device, in which the source and drain electrodes contact a horizontal surface of the semiconductor channel that extends parallel to the surface of the supporting substrate, increasing the contact area between the source and drain electrodes and the semiconductor channel of the TFT devices will generally result in larger TFT devices that take up additional space on a chip.

An alternative design includes rotating the TFT device structure by 90° so that the contact area between the source and drain electrodes and the semiconductor channel extends in a vertical direction, perpendicular to the surface of the supporting substrate. Such a design may help to conserve valuable real estate on the chip. However, it can be difficult to maintain effective contact between the semiconductor channel and the source and drain electrodes along a vertical direction. Such vertical devices are prone to misalignment errors between the surface of the semiconductor channel and the corresponding surfaces of the source and/or drain electrodes, which can render the TFT device inoperable.

Accordingly, various embodiments provide transistor devices (e.g., TFT devices), and methods of forming transistor devices, having a fin-shaped semiconductor channel layer contacting respective sidewalls of the source electrodes and drain electrodes. In various embodiments, the semiconductor channel layer may be formed over fin structures, which extend between and contact the respective sidewalls of the source electrodes and drain electrodes. By forming the channel layer over a fin structure extending between the sidewalls of the source electrode and drain electrode, the semiconductor channel layer may have a fin-shaped structure including a pair of vertically-extending portions over the opposing side surfaces of the fin structure and a horizontally-extending portion over the upper surface of the fin structure. The vertically-extending portions of the fin-shaped semiconductor channel layer may contact the respective sidewalls of the source electrode and drain electrode. In some embodiments, both the vertically-extending portions and the horizontally-extending portion of the fin-shaped semiconductor channel layer may contact the sidewalls of the source electrode and drain electrode. The semiconductor channel layer may also contact the upper surfaces of the source electrode and drain electrode. A transistor device (e.g., TFT device) having a fin-shaped semiconductor channel layer in accordance with various embodiments may increase a contact area between the semiconductor channel layer and the source electrode and drain electrode of the transistor device, which may result in an increased driving current for the transistor device without requiring any significant increase in the size of the transistor device. Further, because the semiconductor channel layer may be deposited over a fin structure extending between and contacting respective sidewalls of the source electrode and drain electrode, misalignment between the semiconductor channel layer and the source electrode and drain electrode may be avoided and effective contact between the semiconductor channel layer and the source electrode and drain electrode of the transistor device may be maintained.

Referring to FIG. 1A, a vertical cross-sectional view of a first exemplary structure according to an embodiment of the present disclosure is illustrated prior to formation of an array of thin film transistor (TFT) devices, according to various embodiments of the present disclosure. The first exemplary structure includes a substrate 8 that contains a semiconductor material layer 10. The substrate 8 may include a bulk semiconductor substrate such as a silicon substrate in which the semiconductor material layer continuously extends from a top surface of the substrate 8 to a bottom surface of the substrate 8, or a semiconductor-on-insulator layer including the semiconductor material layer 10 as a top semiconductor layer overlying a buried insulator layer (such as a silicon oxide layer). The exemplary structure may include various devices regions 50 and 52. In one non-limiting embodiment, device region 50 may be a memory array region 50 in which at least one array of volatile or non-volatile memory cells may be subsequently formed. Device region 52 may be a peripheral logic region 52 in which electrical connections between an array of memory cells and a peripheral circuit including field effect transistors may be subsequently formed. Areas of the memory array region 50 and the logic region 52 may be employed to form various elements of the peripheral circuit.

Semiconductor devices such as field effect transistors (FETs) may be formed on, and/or in, the semiconductor material layer 10 during a front-end-of-line (FEOL) operation. For example, shallow trench isolation structures 12 may be formed in an upper portion of the semiconductor material layer 10 by forming shallow trenches and subsequently filling the shallow trenches with a dielectric material such as silicon oxide. Other suitable dielectric materials are within the contemplated scope of disclosure. Various doped wells (not expressly shown) may be formed in various regions of the upper portion of the semiconductor material layer 10 by performing masked ion implantation processes.

Gate structures 20 may be formed over the top surface of the substrate 8 by depositing and patterning a gate dielectric layer, a gate electrode layer, and a gate cap dielectric layer. Each gate structure 20 may include a vertical stack of a gate dielectric 22, a gate electrode 24, and a gate cap dielectric 28, which is herein referred to as a gate stack (22, 24, 28). Ion implantation processes may be performed to form extension implant regions, which may include source extension regions and drain extension regions. Dielectric gate spacers 26 may be formed around the gate stacks (22, 24, 28). Each assembly of a gate stack (22, 24, 28) and a dielectric gate spacer 26 constitutes a gate structure 20. Additional ion implantation processes may be performed that use the gate structures 20 as self-aligned implantation masks to form deep active regions. Such deep active regions may include deep source regions and deep drain regions. Upper portions of the deep active regions may overlap with portions of the extension implantation regions. Each combination of an extension implantation region and a deep active region may constitute an active region 14, which may be a source region or a drain region depending on electrical biasing. A semiconductor channel 15 may be formed underneath each gate stack (22, 24, 28) between a neighboring pair of active regions 14. Metal-semiconductor alloy regions 18 may be formed on the top surface of each active region 14. Field effect transistors may be formed on the semiconductor material layer 10. Each field effect transistor may include a gate structure 20, a semiconductor channel 15, a pair of active regions 14 (one of which functions as a source region and another of which functions as a drain region), and optional metal-semiconductor alloy regions 18. Complementary metal-oxide-semiconductor (CMOS) circuits 75 may be provided on the semiconductor material layer 10, which may include a periphery circuit for the array(s) of transistors, such as thin film transistors (TFTs), and memory devices to be subsequently formed.

Various interconnect-level structures may be subsequently formed, which are formed prior to formation of an array of fin back gate field effect transistors and are herein referred to as lower interconnect-level structures (L0, L1, L2). In case a two-dimensional array of TFTs and memory devices are to be subsequently formed over two levels of interconnect-level metal lines, the lower interconnect-level structures (L0, L1, L2) may include a contact-level structure L0, a first interconnect-level structure L1, and a second interconnect-level structure L2. The contact-level structure L0 may include a planarization dielectric layer 31A including a planarizable dielectric material such as silicon oxide and various contact via structures 41V contacting a respective one of the active regions 14 or the gate electrodes 24 and formed within the planarization dielectric layer 31A. The first interconnect-level structure L1 includes a first interconnect level dielectric (ILD) layer 31B and first metal lines 41L formed within the first ILD layer 31B. The first ILD layer 31B is also referred to as a first line-level dielectric layer. The first metal lines 41L may contact a respective one of the contact via structures 41V. The second interconnect-level structure L2 includes a second ILD layer 32, which may include a stack of a first via-level dielectric material layer and a second line-level dielectric material layer or a line-and-via-level dielectric material layer. The second ILD layer 32 may have formed there within second interconnect-level metal interconnect structures (42V, 42L), which includes first metal via structures 42V and second metal lines 42L. Top surfaces of the second metal lines 42L may be coplanar with the top surface of the second ILD layer 32.

FIG. 1B is a vertical cross-sectional view of the first exemplary structure during formation of an array of TFT devices according to an embodiment of the present disclosure. Referring to FIG. 1B, an array 95 of TFT devices may be formed in device region 50 over the second interconnect-level structure L2. The details for the structure and the processing steps for the array 95 of TFT devices are subsequently described in detail below. A third ILD layer 33 may be formed during formation of the array 95 of TFT devices. The set of all structures formed at the level of the array 95 of TFT devices is herein referred to as a third interconnect-level structure L3.

FIG. 1C is a vertical cross-sectional view of the first exemplary structure after formation of upper-level metal interconnect structures according to an embodiment of the present disclosure. Referring to FIG. 1C, third interconnect-level metal interconnect structures (43V, 43L) may be formed in the third ILD layer 33. The third interconnect-level metal interconnect structures (43V, 43L) may include second metal via structures 43V and third metal lines 43L. Additional interconnect-level structures may be subsequently formed, which are herein referred to as upper interconnect-level structures (L4, L5, L6, L7). For example, the upper interconnect-level structures (L4, L5, L6, L7) may include a fourth interconnect-level structure L4, a fifth interconnect-level structure L5, a sixth interconnect-level structure L6, and a seventh interconnect-level structure L7.

The fourth interconnect-level structure L4 may include a fourth ILD layer 34 having formed therein fourth interconnect-level metal interconnect structures (44V, 44L), which may include third metal via structures 44V and fourth metal lines 44L. The fifth interconnect-level structure L5 may include a fifth ILD layer 35 having formed therein fifth interconnect-level metal interconnect structures (45V, 45L), which may include fourth metal via structures 45V and fifth metal lines 45L. The sixth interconnect-level structure L6 may include a sixth ILD layer 36 having formed therein sixth interconnect-level metal interconnect structures (46V, 46L), which may include fifth metal via structures 46V and sixth metal lines 46L. The seventh interconnect-level structure L7 may include a seventh ILD layer 37 having formed therein sixth metal via structures 47V (which are seventh interconnect-level metal interconnect structures) and metal bonding pads 47B. The metal bonding pads 47B may be configured for solder bonding (which may employ C4 ball bonding or wire bonding), or may be configured for metal-to-metal bonding (such as copper-to-copper bonding).

Each ILD layer may be referred to as an ILD layer 30. Each of the interconnect-level metal interconnect structures may be referred to as a metal interconnect structure 40. Each contiguous combination of a metal via structure and an overlying metal line located within a same interconnect-level structure (L2-L7) may be formed sequentially as two distinct structures by employing two single damascene processes, or may be simultaneously formed as a unitary structure employing a dual damascene process. Each of the metal interconnect structure 40 may include a respective metallic liner (such as a layer of TiN, TaN, or WN having a thickness in a range from 2 nanometers (nm) to 20 nm) and a respective metallic fill material (such as W, Cu, Co, Mo, Ru, other elemental metals, or an alloy or a combination thereof). Other suitable materials for use as a metallic liner and metallic fill material are within the contemplated scope of disclosure. Various etch stop dielectric layers and dielectric capping layers may be inserted between vertically neighboring pairs of ILD layers 30, or may be incorporated into one or more of the ILD layers 30.

While the present disclosure is described employing an embodiment in which the array 95 of TFT devices may be formed as a component of a third interconnect-level structure L3, embodiments are expressly contemplated herein in which the array 95 of TFT devices may be formed as components of any other interconnect-level structure (e.g., L1-L7). Further, while the present disclosure is described using an embodiment in which a set of eight interconnect-level structures are formed, embodiments are expressly contemplated herein in which a different number of interconnect-level structures is used. In addition, embodiments are expressly contemplated herein in which two or more arrays 95 of TFT devices may be provided within multiple interconnect-level structures. While the present disclosure is described employing an embodiment in which an array 95 of TFT devices may be formed in a single interconnect-level structure, embodiments are expressly contemplated herein in which an array 95 of TFT devices may be formed over two vertically adjoining interconnect-level structures. Furthermore, embodiments are expressly contemplated herein in which an array 95 of TFT devices may be formed on or within the semiconductor material layer 10 (e.g., in a front-end-of-line (FEOL) operation).

FIGS. 2A-10C are sequential views of an exemplary structure during a process of forming a plurality of TFT devices according to various embodiments of the present disclosure. The plurality of TFT devices may form all or a portion of an array 95 of TFT devices such as shown in FIG. 1C.

Figure 2A:
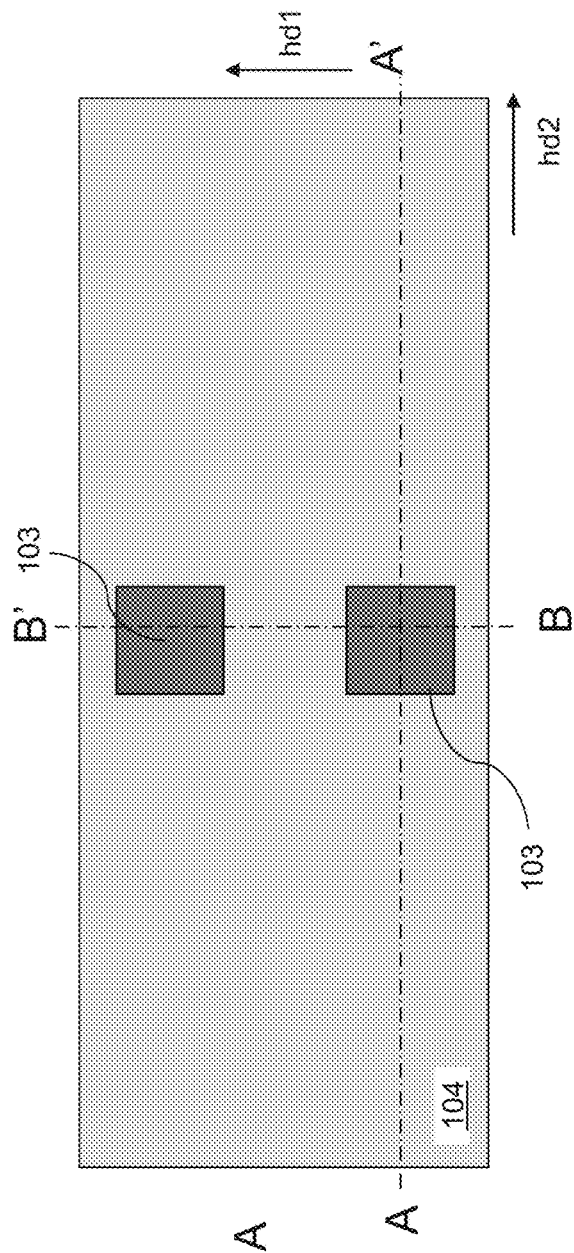
FIG. 2A is a top view of an exemplary structure during a process of forming a plurality of transistor devices according to an embodiment of the present disclosure.
Figure 2B:
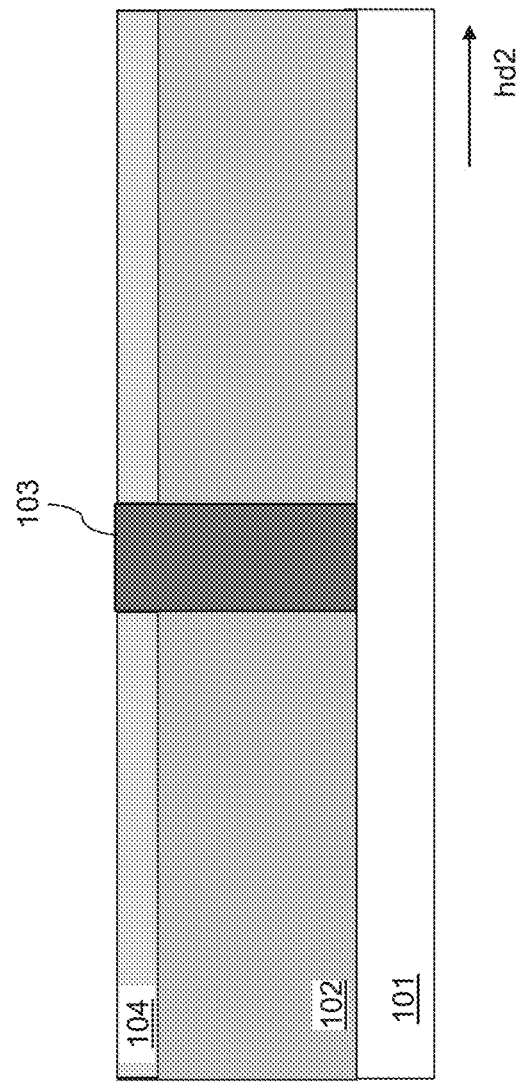
FIG. 2B is a vertical cross-section view of the exemplary structure along line A-A' in FIG. 2A.

FIG. 2A is a top view of an exemplary structure during a process of forming a plurality of TFT devices according to various embodiments of the present disclosure. FIG. 2B is a vertical cross-section view of the exemplary structure along line A-A' in FIG. 2A. FIG. 2C is a vertical cross-section view of the exemplary structure along line B-B' in FIG. 2A.

Referring to FIGS. 2A-2C, a first dielectric layer 102 may be deposited over a substrate (not shown in FIGS. 2A-2C). The substrate may be any suitable substrate, such as a substrate 8 shown in FIGS. 1A-1C. The substrate may include device structures formed on or in the substrate 8 during FEOL processes. In some embodiments, one or more additional dielectric layers, such as ILD layers, may be deposited between the substrate 8 and the first dielectric layer 102. In such embodiments, the first dielectric layer 102 may be deposited over an ILD layer, which may be an ILD layer as discussed above with respect to FIGS. 1A-1C.

The first dielectric layer 102 may be formed of any suitable dielectric material such as silicon oxide, silicon nitride, silicon oxynitride, silicon carbide, phosphosilicate glass (PSG), undoped silicate glass (USG), a doped silicate glass, organosilicate glass, amorphous fluorinated carbon, porous variants thereof, or combinations thereof. Other dielectric materials are within the contemplated scope of disclosure. The first dielectric layer 102 may be deposited using any suitable deposition process. Herein, a suitable deposition processes may include chemical vapor deposition (CVD), physical vapor deposition (PVD), atomic layer deposition (ALD), high density plasma CVD (HDPCVD), metalorganic CVD (MOCVD), plasma enhanced CVD (PECVD), sputtering, laser ablation, or the like. Other suitable deposition processes are within the contemplated scope of disclosure.

Referring again to FIGS. 2B and 2C, a second dielectric layer 104 may optionally be deposited over the upper surface of the first dielectric layer 102. The second dielectric layer 104 may be composed of a suitable dielectric material as described above, and may be deposited using a suitable deposition process as described above. In various embodiments, the second dielectric layer 104 may be composed of a different dielectric material than the first dielectric layer 102. In some embodiments, the second dielectric layer 104 may be an etch stop layer having different etch characteristics (i.e., a higher etch resistivity) than the material of the first dielectric layer 102. In one non-limiting embodiment, the first dielectric layer 102 may include silicon oxide, and the second dielectric layer 104 may include silicon nitride.

In some embodiments, the second dielectric layer 104 may be omitted, and the upper surface of the exemplary structure shown in FIGS. 2A-2C may include the upper surface of the first dielectric layer 102.

Referring again to FIGS. 2A-2C, a plurality of metal features 101 and 103 may contact the first dielectric layer 102 and/or the second dielectric layer 104. In some embodiments, the metal features 101 and 103 may be at least partially embedded within the first dielectric layer 102 and/or the second dielectric layer 104. Referring to FIGS. 2B and 2C, a plurality of conductive metal lines 101 may contact the first dielectric layer 102 and may extend along a horizontal direction hd2. The conductive metal lines 101 may extend parallel to one another, and may be separated from one another along a horizontal direction hd1 that is perpendicular to horizontal direction hd2. In embodiments, each of the conductive metal lines 101 may contact the first dielectric layer 102 over the upper surfaces of the metal lines 101, and may optionally be laterally surrounded by the first dielectric layer 102. Alternatively, a separate layer of dielectric material underlying the first dielectric layer 102 (not shown in FIGS. 2A-2C) may laterally surround the metal lines 101. In various embodiments, the conductive metal lines 101 may also be referred to as "bit lines."

In various embodiments, the conductive metal lines 101 may be formed by depositing a layer of the first dielectric layer 102 material, etching the layer of the first dielectric layer 102 material through a patterned mask to form trenches in the layer of the first dielectric layer 102 material extending along horizontal direction hd2, and depositing a metal material (which may include, for example, a metallic liner material and a metallic fill material over the metallic liner material) over the upper surface of the layer of dielectric material and within the trenches. A planarization process, such as chemical mechanical planarization (CMP) process, may be used to remove portions of the metal material from over the upper surface of the layer of the first dielectric layer 102 material, leaving discrete metal lines 101 filling the trenches and laterally separated from one another by the layer of the first dielectric layer 102 material. An additional layer of the first dielectric layer 102 material may be deposited over the upper surfaces of the metal lines 101 and the previously-deposited layer of the first dielectric layer 102 material to form the first dielectric layer 102, where the conductive metal lines 101 may contact the first dielectric layer 102.

The conductive metal lines 101 may include any suitable electrically conductive material, such as copper (Cu), aluminum (Al), zirconium (Zr), titanium (Ti), titanium nitride (TiN), tungsten (W), tantalum (Ta), tantalum nitride (TaN), molybdenum (Mo), ruthenium (Ru), palladium (Pd), platinum (Pt), cobalt (Co), nickel (Ni), iridium (Ir), iron (Fe), beryllium (Be), chromium (Cr), antimony (Sb), osmium (Os), thorium (Th), vanadium (V), alloys thereof, and combinations of the same. Other suitable electrically conductive materials for the conductive metal lines 101 are within the contemplated scope of disclosure.

The conductive metal lines 101 may be deposited using any suitable deposition process. For example, suitable deposition processes may include physical vapor deposition (PVD), sputtering, chemical vapor deposition (CVD), atomic layer deposition (ALD), plasma-enhanced chemical vapor deposition (PECVD), electrochemical deposition, or combinations thereof. Other suitable deposition processes are within the contemplated scope of disclosure.

Referring to FIGS. 2A-2C, a plurality of conductive vias 103 may extend through the second dielectric layer 104 and the first dielectric layer 102 and may contact an upper surface of a metal line 101. As shown in the vertical cross-section view of the exemplary structure in FIG. 2C, a pair of conductive vias 103 may extend through the second dielectric layer 104 and the first dielectric layer 102 and contact respective metal lines 101. An upper surface of each of the conductive vias 103 may be substantially coplanar with an upper surface of the second dielectric layer 104.

In various embodiments, the conductive vias 103 may be formed by forming a patterned mask (not shown in FIGS. 2A-2C) over the second dielectric layer 104 (or first dielectric material 102 in embodiments in which the second dielectric layer 104 is not used), where the patterned mask includes openings through the mask corresponding to the locations of conductive vias to be subsequently formed. The mask, which may include a layer of photoresist and/or a hard mask, may be patterned using a photolithographic technique to form the openings through the mask corresponding to the locations of the conductive vias to be subsequently formed. An etching process, such as an anisotropic etching process, may be used to etch the second dielectric layer 104 and the first dielectric layer 102 through the mask to form via openings extending through the second dielectric layer 104 and the first dielectric layer 102. The etching process may expose the upper surface of a metal line 101 at the bottom of each of the via openings. Following the etching process, the patterned mask may be removed using a suitable process, such as by ashing or by dissolution using a solvent. A metal material (which may include, for example, a metallic liner material and a metallic fill material over the metallic liner material) may be deposited over the upper surface of the second dielectric layer 104 and within the via openings to contact the exposed upper surfaces of the metal lines 101. A planarization process, such as chemical mechanical planarization (CMP) process, may be used to remove portions of the metal material from over the upper surface of the second dielectric layer 104, leaving discrete conductive vias 103 extending through the second dielectric layer 104 and the first dielectric layer 102 and contacting a metal line 101. The conductive vias 103 may include any suitable conductive material as described above, and may be deposited using any suitable deposition process as described above.

Figure 3A:
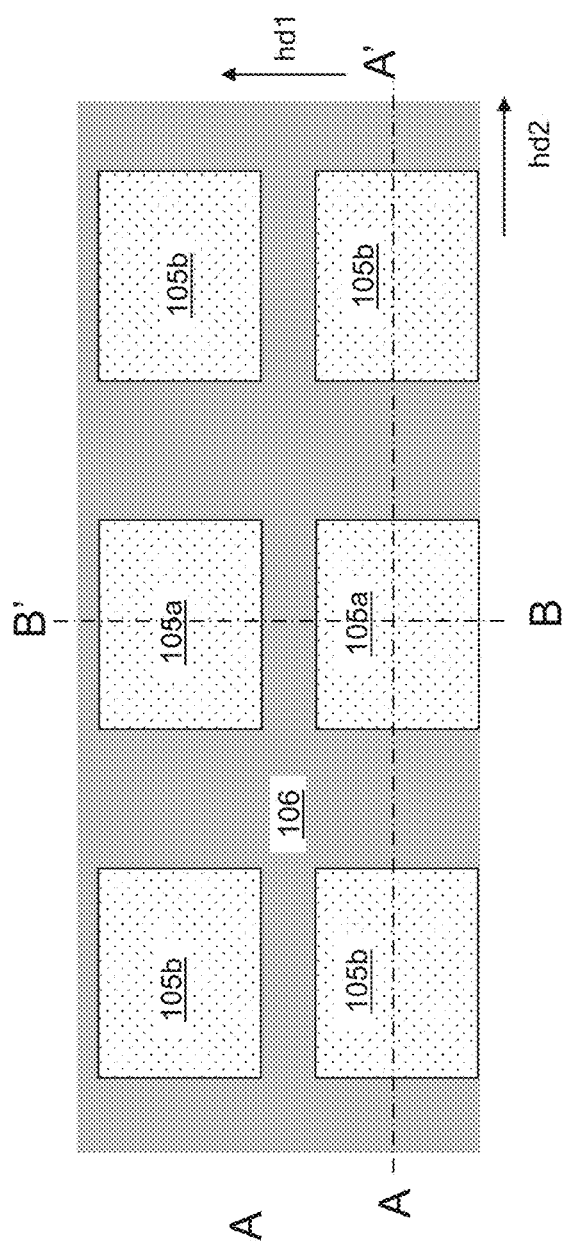
FIG. 3A is a top view of an exemplary structure during a process of forming a plurality of transistor devices showing first electrodes and second electrodes embedded in a dielectric layer according to an embodiment of the present disclosure.
Figure 3B:
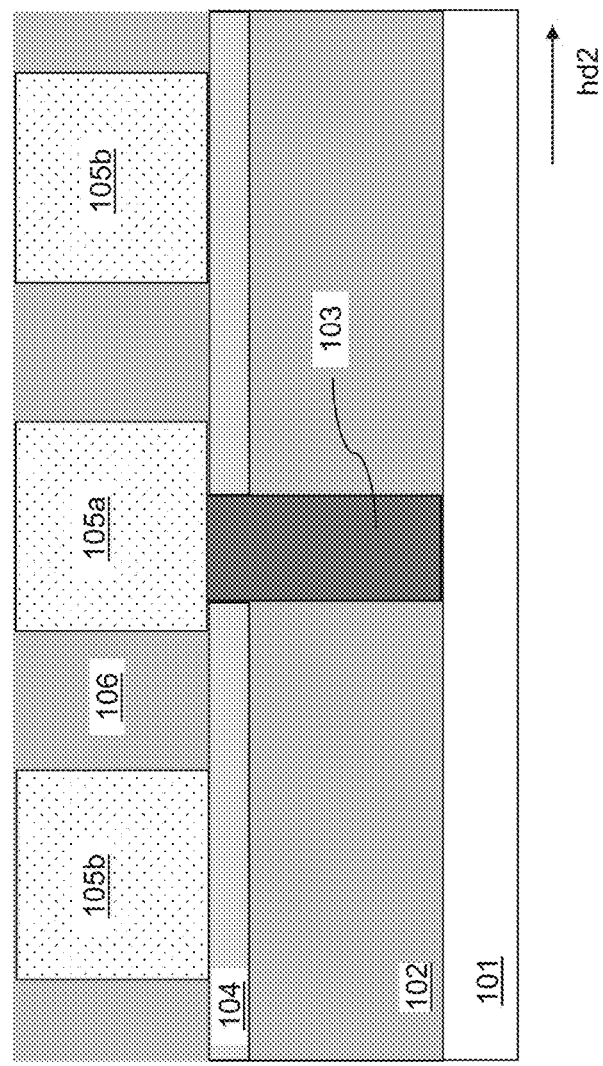
FIG. 3B is a vertical cross-section view of the exemplary structure along line A-A' in FIG. 3A.

FIG. 3A is a top view of an exemplary structure during a process of forming a plurality of TFT devices showing first electrodes 105a and second electrodes 105b embedded in a third dielectric layer 106 according to various embodiments of the present disclosure. FIG. 3B is a vertical cross-section view of the exemplary structure along line A-A' in FIG. 3A. FIG. 3C is a vertical cross-section view of the exemplary structure along line B-B' in FIG. 3A.

Referring to FIGS. 3A-3C, the first electrodes 105a and the second electrodes 105b may be formed on the second dielectric layer 104. In embodiments in which the second dielectric layer 104 is not present, the first electrodes 105a and the second electrodes 105b may be formed on the first dielectric layer 102. The first electrodes 105a may be formed over the upper surface of a conductive via 103, such that a lower surface of each first electrode 105a contacts an upper surface of a respective conductive via 103. The second electrodes 105b may not contact the upper surface of a conductive via 103. In one non-limiting embodiment, the first electrodes 105a may form drain electrodes, and the second electrodes 105b may form source electrodes, of TFT devices to be subsequently formed. Alternatively, the first electrodes 105a may form source electrodes and the second electrodes 105b may form drain electrodes of the subsequently-formed TFT devices.

In the exemplary structure shown in FIGS. 3A-3C, a pair of first electrodes 105a (which for ease of description may also be referred to as "drain electrodes") may be located over respective conductive vias 103 and may be laterally spaced from one another along horizontal direction hd1. A pair of second electrodes 105b (which for ease of description may also be referred to as "source electrodes") may be located on opposite sides of each of the first electrodes 105a, and may be laterally separated from a first electrode 105a along horizontal direction hd2. A third dielectric layer 106 may laterally surround each of the first electrodes 105a and the second electrodes 105b. An upper surface of the third dielectric layer 106 may be substantially co-planar with the upper surfaces of each of the first electrodes 105a and the second electrodes 105b.

In various embodiments, the exemplary structure shown in FIGS. 3A-3C may be fabricated by depositing the third dielectric layer 106 over the upper surface of the second dielectric layer 104 and the upper surfaces of the conductive vias 103. In embodiments in which the second dielectric layer 104 is not present, the third dielectric layer 106 may be deposited over the upper surface of the first dielectric layer 102 and the upper surfaces of the conductive vias 103. The third dielectric layer 106 may be composed of a suitable dielectric material as described above, and may be deposited using any suitable deposition process as described above. In some embodiments, the third dielectric layer 106 may be composed of the same dielectric material as the first dielectric layer 102. Alternatively, the third dielectric layer 106 may be composed of a different dielectric material as the first dielectric layer 102.

In various embodiments, the third dielectric layer 106 may be composed of a different dielectric material than the second dielectric layer 104. In some embodiments, the second dielectric layer 104 may be an etch stop layer having different etch characteristics (i.e., a higher etch resistivity) than the material of the third dielectric layer 106. In one non-limiting embodiment, the third dielectric layer 106 may include silicon oxide, and the second dielectric layer 104 may include silicon nitride.

In various embodiments, the first electrodes 105a and the second electrodes 105b may be formed by forming a patterned mask (not shown in FIGS. 3A-3C) over the upper surface of the third dielectric layer 106. The patterned mask may include openings through the mask corresponding to the locations of the first electrodes 105a and the second electrodes 105b to be subsequently formed. The patterned mask, which may include a layer of photoresist material and/or a hard mask, may be patterned using a photolithographic technique to form the openings through the mask corresponding to the locations of the electrodes 105a, 105b to be subsequently formed. An etching process, such as an anisotropic etching process, may be used to etch portions of the third dielectric layer 106 that are exposed through the mask. The etching process may stop at the second dielectric layer 104, thereby forming a plurality of openings through the third dielectric layer 106, where the upper surface of the second dielectric layer 104 may be exposed in the bottom surface of each of the openings. The upper surfaces of the conductive vias 103 may also be exposed in the bottom surfaces of the openings corresponding to the locations where the first electrodes 105a are to be subsequently formed. Following the etching process, the patterned mask may be removed using a suitable process, such as by ashing or by dissolution using a solvent.

A metal material (which may include, for example, a metallic liner material and a metallic fill material over the metallic liner material) may then be deposited over the upper surface of the third dielectric layer 106 and within the plurality of openings formed through the third dielectric layer 106. The metal material may be composed of any suitable conductive material as described above, and may be deposited using a suitable deposition process as described above. Following the deposition of the metal material, a planarization process, such as chemical mechanical planarization (CMP) process, may be used to remove portions of the metal material from over the upper surface of the third dielectric layer 106, leaving discrete first electrodes 105a and second electrodes 105b laterally surrounded by the third dielectric layer 106. Each of the first electrodes 105a may have a lower surface that contacts the upper surface of the second dielectric layer 104 (or in embodiments in which the second dielectric layer 104 is not present, the upper surface of the first dielectric layer 102), as well as the exposed upper surface of a conductive via 103. Each of the second electrodes 105b may have a lower surface that contacts the upper surface of the second dielectric layer 104 (or in embodiments in which the second dielectric layer 104 is not present, the upper surface of the first dielectric layer 102).

Figure 4C:
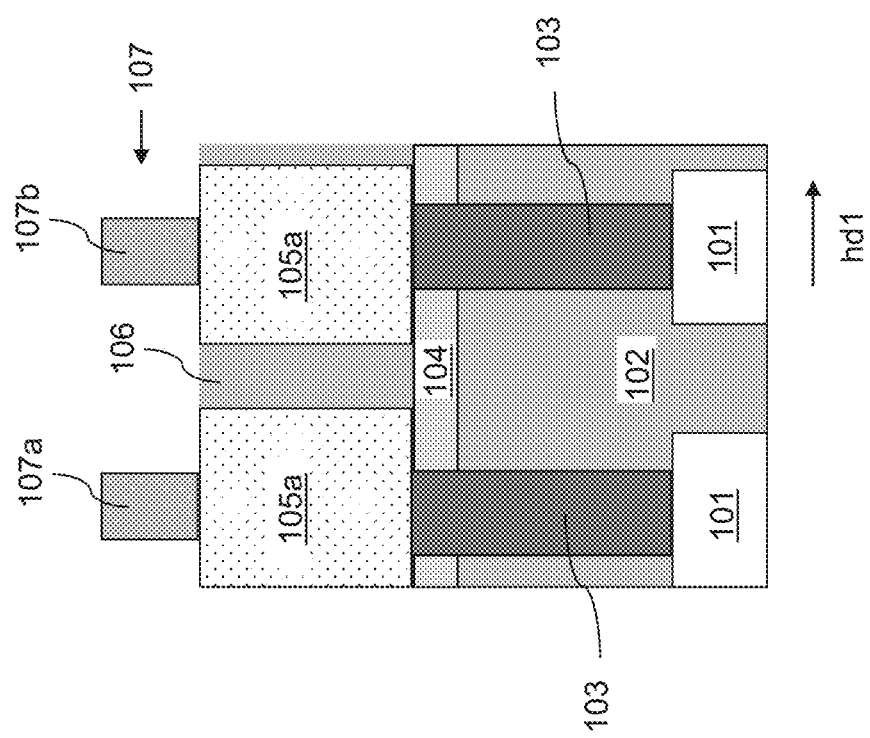
FIG. 4C is a vertical cross-section view of the exemplary structure along line B-B' in FIG. 4A.

FIG. 4A is a top view of an exemplary structure during a process of forming a plurality of TFT devices showing a patterned mask 107 over the upper surfaces of the first electrodes 105a, the second electrodes 105b, and the third dielectric layer 106. FIG. 4B is a vertical cross-section view of the exemplary structure along line A-A' in FIG. 4A. FIG. 4C is a vertical cross-section view of the exemplary structure along line B-B' in FIG. 4A.

Referring to FIGS. 4A-4C, the patterned mask 107 may include strip-shaped mask portions 107a and 107b extending along horizontal direction hd2. Each of the strip-shaped mask portions 107a and 107b may extend over a portion of the third dielectric layer 106 and the central portions of a first electrode 105a and the pair of second electrodes 105b on opposite sides of the first electrode 105a. The remaining portions of the third dielectric layer 106, the first electrodes 105a and the second electrodes 105b may be exposed through the patterned mask 107.

In various embodiments, the patterned mask 107 may include a suitable mask material, such as a photoresist material. The patterned mask 107 may be formed by depositing a continuous layer of a mask material (e.g., a photoresist material) over the upper surfaces of the third dielectric layer 106 the first electrodes 105a, and the second electrodes 105b, and patterning the mask material using a photolithographic technique to remove portions of the mask material and leave strip-shaped mask portions 107a and 107b as shown in FIGS. 4A-4C.

Figure 5D:
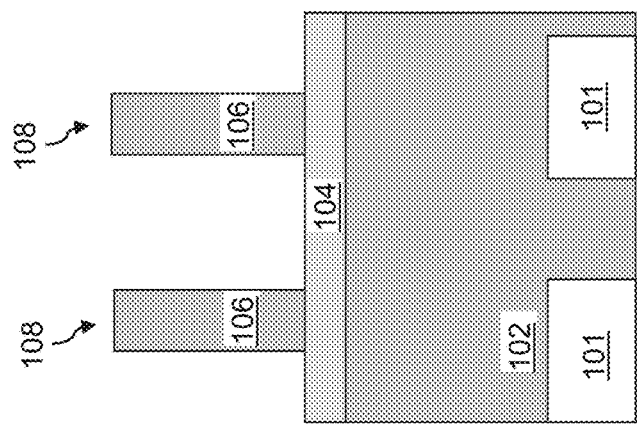
FIG. 5D is a vertical cross-section view of the exemplary structure along line C-C' in FIG. 5A.
Figure 5C:
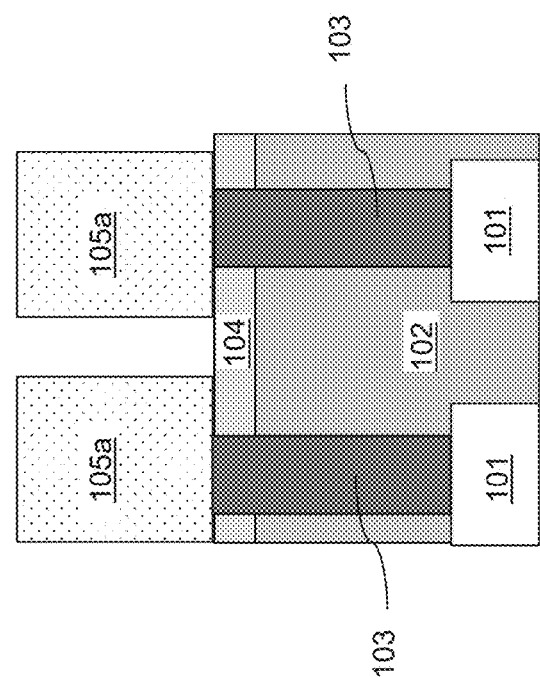
FIG. 5C is a vertical cross-section view of the exemplary structure along line B-B' in FIG. 5A.
Figure 5E:
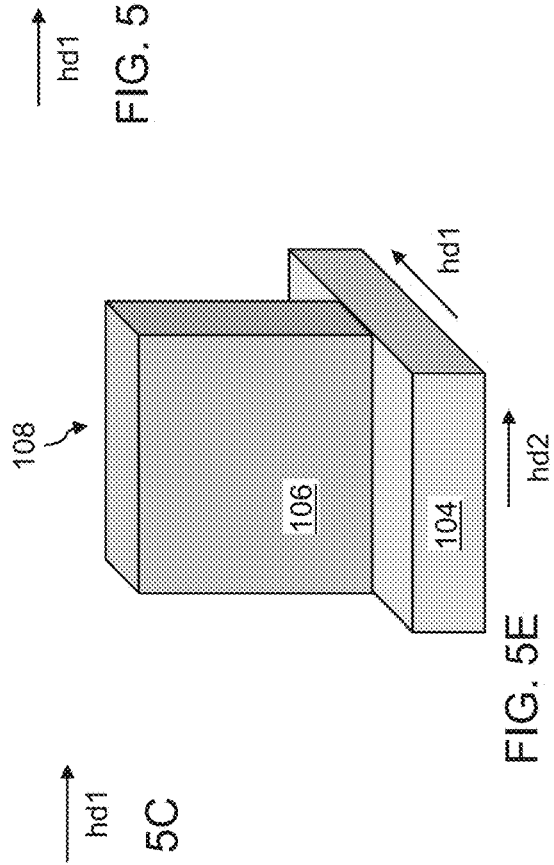
FIG. 5E is a perspective view showing a fin structure over a dielectric layer according to an embodiment of the present disclosure.

FIG. 5A is a top view of an exemplary structure during a process of forming a plurality of TFT devices following an etching process to remove portions of the third dielectric layer 106 and form fin structures 108 contacting the first electrodes 105a and the second electrodes 105b. FIG. 5B is a vertical cross-section view of the exemplary structure along line A-A' in FIG. 5A. FIG. 5C is a vertical cross-section view of the exemplary structure along line B-B' in FIG. 5A. FIG. 5D is a vertical cross-section view of the exemplary structure along line C-C' in FIG. 5A. FIG. 5E is a perspective view showing a fin structure 108 over the second dielectric layer 104.

Referring to FIGS. 5A-5E, an etch process may be used to etch the exemplary structure through the patterned mask 107 shown in FIGS. 4A-4C. The etch process may use an etch chemistry that may have a higher etch selectivity for the material of the third dielectric layer 106 relative to the material of the first electrodes 105a and the second electrodes 105b. In various embodiments, the etch rate of the third dielectric layer 106 during the etching process may be at least 5 times greater, such as at least 10 times greater, including 100 times greater or more, than the etch rate of the first electrodes 105a and the second electrodes 105b during the etching process. The etching process may etch through the portions of the third dielectric layer 106 that are exposed through the patterned mask 107 and expose the upper surface of the second dielectric layer 104. In embodiments in which the second dielectric layer 104 is not present, the etching process may expose the upper surface of the first dielectric layer 102.

The strip-shaped portions 107a and 107b of the patterned mask 107 may protect portions of the third dielectric layer 106 from being etched during the etching process. Following the etching process, the remaining portions of the third dielectric layer 106 may form fin structures 108 extending along horizontal direction hd2. Each fin structure 108 may contact at least one sidewall 109 of an electrode 105a, 105b. Referring to FIGS. 5A and 5B, the fin structures 108 may extend continuously between sidewalls 109 of the electrodes 105a, 105b that are adjacent to each other along horizontal direction hd2. Referring to FIGS. 5A, 5C and 5D, a width of the fin structures 108 along horizontal direction hd1 may be less than the width of the electrodes 105a, 105b along horizontal direction hd1. Thus, following the etching process, portions of the sidewalls 109 of the electrodes 105a, 105b that are contacted by a fin structure 108 may include exposed surfaces laterally adjacent to the fin structure 108. Following the etching process, the patterned mask 107 (see FIGS. 4A-4C) may be removed by a suitable process, such as by ashing or by dissolution with a solvent.

Figure 6C:
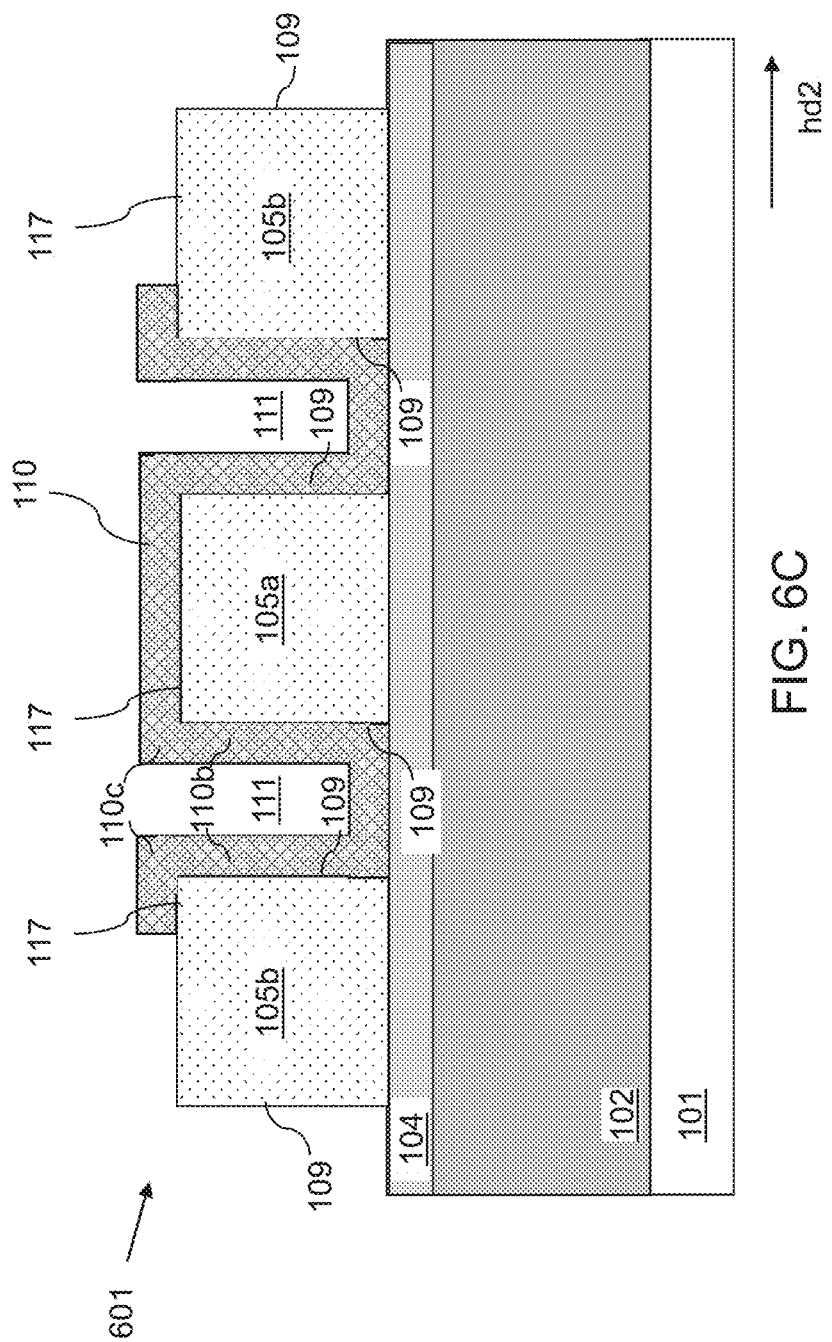
FIG. 6C is a vertical cross-section view of the exemplary structure along line B-B' in FIG. 6A.
Figures 6D, 6E:
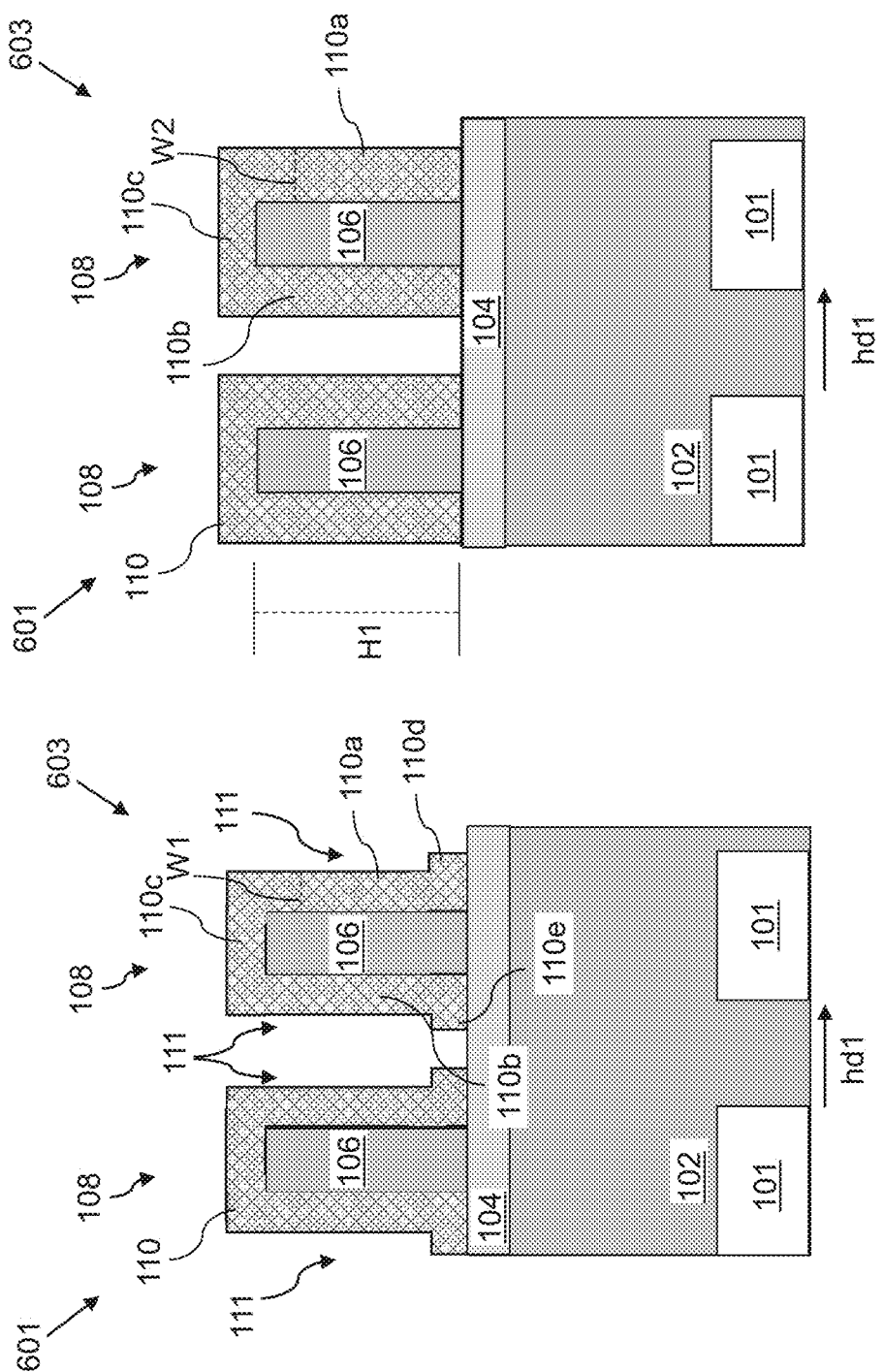
FIG. 6D is a vertical cross-section view of the exemplary structure along line C-C' in FIG. 6A.
FIG. 6E is a vertical cross-section view of the exemplary structure along line D-D' in FIG. 6A.

FIG. 6A is a top view of an exemplary structure during a process of forming a plurality of TFT devices showing a semiconductor channel layer 110 formed over the upper surfaces of the first electrodes 105a and the second electrodes 105b, and over the upper surface and side surfaces of the fin structures 108. FIG. 6B is a vertical cross-section view of the exemplary structure along line A-A' in FIG. 6A. FIG. 6C is a vertical cross-section view of the exemplary structure along line B-B' in FIG. 6A. FIG. 6D is a vertical cross-section view of the exemplary structure along line C-C' in FIG. 6A. FIG. 6E is a vertical cross-section view of the exemplary structure along line D-D' in FIG. 6A. FIG. 6F is a vertical cross-section view of the exemplary structure along line E-E' in FIG. 6A. FIG. 6G is a perspective view showing the semiconductor channel layer 110 over a fin structure 108.

Referring to FIGS. 6A-6G, the semiconductor channel layer 110 may include a suitable semiconductor material, such as indium zinc oxide (IZO), indium tin oxide (ITO), indium oxide (In2O3), gallium oxide (Ga2O3), indium gallium zinc oxide (IGZO), indium tungsten oxide (IWO), titanium oxide, aluminum doped zinc oxide (AZO), an oxide semiconductor material, a III-V semiconductor material (e.g., InP, InAs, GaAs, GaN, GaP, InSb, InGaAs, etc.), alloys thereof, and/or combinations thereof. Other suitable materials for the semiconductor channel layer 110 are within the contemplated scope of disclosure. The semiconductor channel layer 110 may be composed of a single layer of a semiconductor material, or may include a multi-layer structure. In some embodiments, a semiconductor channel layer 110 including a multi-layer structure may include multiple layers of semiconductor materials which may have different compositions. The semiconductor channel layer 110 may be formed by suitable deposition process as described above.

Referring to FIGS. 6A-6C, the semiconductor channel layer 110 may include a plurality of strip-shaped segments extending along horizontal direction hd2 and separated from one another along horizontal direction hd1. Each strip-shaped segment of the semiconductor channel layer 110 may be located over the upper surface 117 of a first electrode 105a and may contact the sidewalls 109 of the first electrode 105a that are also contacted by a fin structure 108. Each strip-shaped segment of the semiconductor channel layer 110 may extend from the sidewalls 109 of the first electrode 105a over the upper surfaces and the side surfaces of the fin structures 108, and over the upper surface of the second dielectric layer 104 adjacent to the fin structures 108, and may contact sidewalls 109 of the second electrodes 105b that face the first electrode 105a. Each strip-shaped segment of the semiconductor channel layer 110 may also extend over a portion of the upper surfaces 117 of the second electrodes 105b. The combination of a first electrode 105a, a pair of second electrodes 105b on opposite sides of the first electrode 105a, a pair of fin structures 108 extending between sidewalls 109 of the first electrode 105a and each of the second electrodes 105b and a strip-shaped segment of the semiconductor channel layer 110 located over upper surfaces 117 and sidewalls 109 of the first electrode 105a and the pair of second electrodes 105b, over the upper surfaces and side surfaces of the fin structures 108, and over a portion of the upper surface of the second dielectric layer 104 may form a layer stack 601, 603 over the upper surface of the second dielectric layer 104. As shown in FIGS. 6A, 6D, 6E and 6F, the exemplary structure may include a pair of layer stacks 601, 603 that may be laterally spaced from one another along horizontal direction hd1. In various embodiments, the fin structures 108 contacting the sidewalls 109 of the second electrodes 105b on the periphery of each layer stack 601, 603 may be removed to provide isolated layer stacks 601, 603 over the upper surface of the second dielectric layer 104.

In various embodiments, the semiconductor channel layer 110 may be formed by depositing a continuous layer of a suitable semiconductor material over the exemplary structure, including over the upper surfaces and side surfaces of the first electrodes 105a and the second electrodes 105b, over the upper surfaces and side surfaces of the fin structures 108, and over the exposed upper surface of the second dielectric layer 104. A patterned mask (not shown in FIGS. 6A-6G) may be formed over the upper surface of the continuous layer of semiconductor material, and the exemplary structure may be etched through the patterned mask to remove portions of the continuous layer of semiconductor material that are exposed through the mask and provide strip-shaped segments of the semiconductor channel layer 110 as shown in FIGS. 6A-6G. The etching process may also remove the fin structures 108 that contact the sidewalls 109 of the second electrodes 105b on the periphery of each layer stack 601, 603. Alternatively, a separate etching process may be used to remove the fin structures 108 that contact the sidewalls 109 of the second electrodes 105b on the periphery of the layer stacks 601, 603.

FIGS. 6C, 6E and 6F illustrate the area of contact between the semiconductor channel layer 110 and a sidewall 109 of the first electrode 105a. FIG. 6E is a vertical cross-section view of a fin structure 108 and the semiconductor channel layer 110 along the vertical plane in which the fin structure 108 and the semiconductor channel layer 110 contact a sidewall 109 of the first electrode 105a. As shown in FIG. 6E, the semiconductor channel layer 110 includes a first vertical portion 110a and a second vertical portion 110b that extend in a vertical direction over the side surfaces of the fin structure 108 and contact the upper surface of the second dielectric layer 104. A first horizontal portion 110c of the semiconductor channel layer 110 extends along horizontal direction hd1 between the first vertical portion 110a and the second vertical portion 110b of the semiconductor channel layer 110. Thus, the portions of the semiconductor channel layer 110 extending between respective sidewalls 109 of a first electrode 105a and a second electrode 105b may have a fin-shaped structure. In various embodiments, the first vertical portion 110a and the second vertical portion 110b of the semiconductor channel layer 110 may both contact the sidewall 109 of the first electrode 105a over the full vertical height H1 of the first electrode 105a as shown in the vertical cross-section view of FIG. 6F. In the embodiment shown in FIGS. 6A-6G, the upper surface 117 of the first electrode 105a is substantially coplanar with the upper surfaces of the fin structures 108 such that a lower surface of the first horizontal portion 110c of the semiconductor channel layer 110 may be substantially co-planar with the upper surface 117 of the first electrode 105a. In this exemplary embodiment, the first horizontal portion 110c of the semiconductor channel layer 110 may not contact the sidewall 109 of the first electrode 105a, but may extend along horizontal direction hd2 beyond the vertical plane of the sidewall 109 of the first electrode 105a, and may contact the upper surface 117 of the first electrode 105a, as shown in FIGS. 6B and 6C. In various embodiments, the semiconductor channel layer 110 may cover the entire upper surface 117 of the first electrode 105a.

Accordingly, in various embodiments, the two opposing sidewalls 109 of the first electrode 105a that are contacted by a fin structure 108 may each contact a pair of vertical portions 110a and 110b of the semiconductor channel layer 110 located on opposite sides of the respective fin structure 108. In embodiments, the vertical portions 110a and 110b of the semiconductor channel layer 110 may contact the sidewalls 109 of the first electrode 105a over the entire vertical height H1 of the first electrode 105a. A first horizontal portion 110c of the semiconductor channel layer 110 may extend between the respective vertical portions 110a and 110b of the semiconductor channel layer 110 and over the upper surface of the fin structure 108, and may extend beyond the vertical planes of the sidewalls 109 of the first electrode 105a to contact the upper surface 117 of the first electrode 105a. In embodiments, the first horizontal portion 110c of the semiconductor channel layer 110 may extend over the entire upper surface 117 of the first electrode 105a.

Similarly, the sidewalls 109 of the second electrodes 105b that contact a fin structure 108 may also contact a pair of vertical portions 110a and 110b of the semiconductor channel layer 110 located on opposite sides of the respective fin structures 108. In embodiments, the vertical portions 110a and 110b of the semiconductor channel layer 110 may contact the sidewalls 109 over the entire vertical height H1 of the respective second electrodes 105b. A first horizontal portion 110c of the semiconductor channel layer 110 may extend between the respective vertical portions 110a and 110b of the semiconductor channel layer 110 and over the upper surfaces of the respective fin structures 108, and may extend beyond the vertical planes of the sidewalls 109 of the second electrode 105b to contact a portion of the upper surfaces 117 of the respective second electrodes 105b.

In various embodiments, by forming the channel layer 110 over the upper surfaces and the side surfaces of fin structures 108 in each of the layer stacks 601, 603, a pair of vertical portions 110a and 110b of the channel layer 110 may contact the sidewalls 109 of the first electrode 105a and the sidewalls 109 of each second electrode 105b facing the first electrode 105a. The channel layer 110 may also contact the upper surfaces 117 of the first electrode 105a and each second electrode 105b in each of the layer stacks 601 and 603. This may increase a contact area between the semiconductor channel layer 110 and the source and drain electrodes 105b and 105a of the TFT devices to be subsequently formed, which may result in an increased driving current for the TFT devices without requiring any significant increase in the size of the TFT devices. Further, because the semiconductor channel layer 110 is deposited over the upper surfaces and the side surfaces of fin structures 108 that contact the sidewalls 109 of the electrodes 105a and 105b, misalignment between the semiconductor channel layer 110 and the electrodes 105a and 105b may be avoided and effective contact between the semiconductor channel layer 110 and each of the electrodes 105a and 105b may be maintained.

Referring to FIGS. 6A, 6C, 6D and 6G, the semiconductor channel layer 110 may also include indent portions 111 located between the first electrode 105a and each of the second electrodes 105b in each of the layer stacks 601, 603. As shown in FIG. 6A, for example, in each layer stack 601 and 603, the semiconductor channel layer 110 may include pairs of indent portions 111 located between the first electrode 105a and each of the second electrodes 105b.

FIG. 6D is a vertical cross-section view along line C-C' in FIG. 6A that shows indent portions 111 of the semiconductor channel layer 110 in each of the layer stacks 601 and 603. FIG. 6G is a perspective view showing a portion of the semiconductor channel layer 110 and a fin structure 108 located between a first electrode 105a and a second electrode 105b. Referring to FIGS. 6D and 6G, the semiconductor channel layer 110 may include a first vertical portion 110a over a first side surface of the fin structure 108, a second vertical portion 110b over a second side surface of the fin structure 108, and a first horizontal portion 110c extending over the upper surface of the fin structure 108 between the first vertical portion 110a and the second vertical portion 110b. The semiconductor channel layer 110 may also include a second horizontal portion 110d extending from the first vertical portion 110a over the upper surface of the second dielectric layer 104, and a third horizontal portion 110e extending from the second vertical portion 110b over the upper surface of the second dielectric layer 104. Above the second horizontal portion 110d and the third horizontal portion 110e of the semiconductor channel layer 110 may be void areas that may form respective indent portions 111 of the semiconductor channel layer 110 that are located between adjacent electrodes 105a and 105b within each layer stack 601, 603. As shown in FIGS. 6D and 6E, at each of the indent portions 111, the widths W1 of the first and second vertical portions 110a, 110b of the semiconductor channel layer 110 along horizontal direction hd1 may be less than the widths W2 of the first and second vertical portions 110a and 110b where the first and second vertical portions 110a and 110b of the semiconductor channel layer 110 contact the first electrode 105a and the second electrode 105b.

Figure 7A:
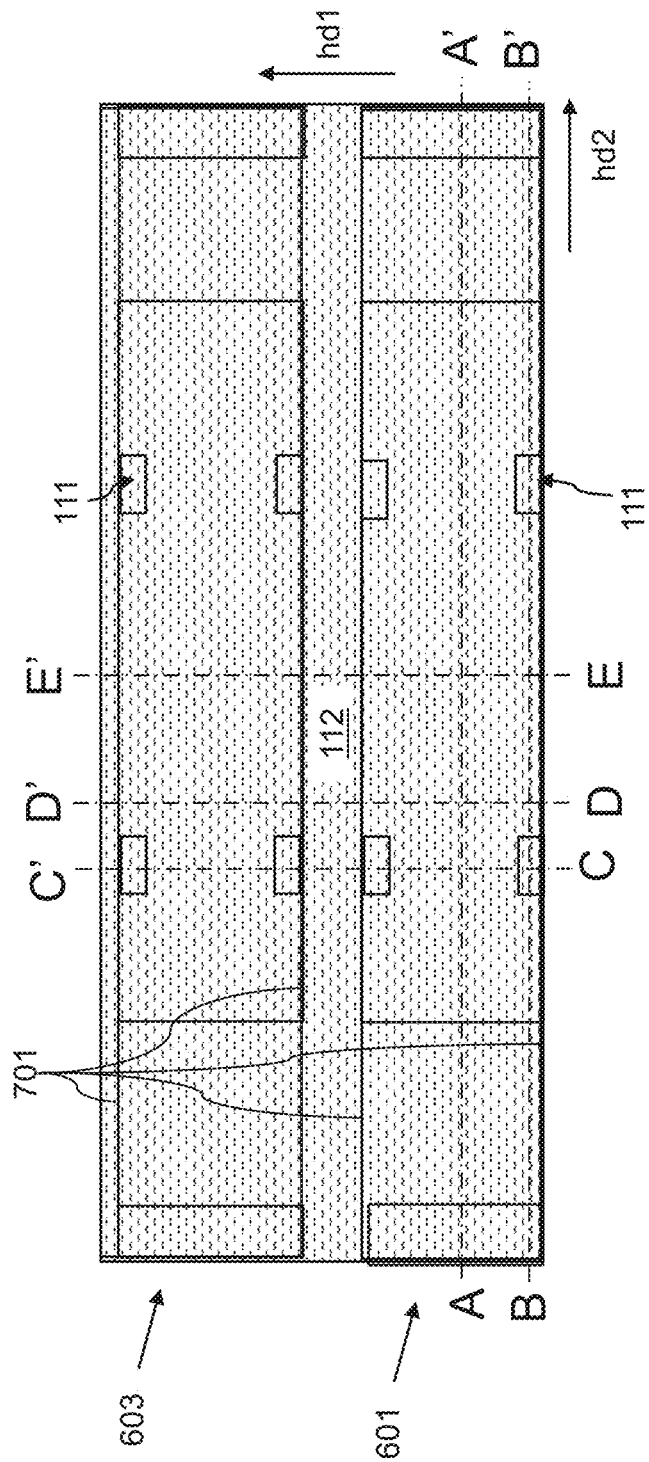
FIG. 7A is a top view of an exemplary structure during a process of forming a plurality of transistor devices showing a gate dielectric layer formed over the upper surfaces and the side surfaces of a plurality of layer stacks and over the upper surface of a dielectric layer according to an embodiment of the present disclosure.
Figure 7B:
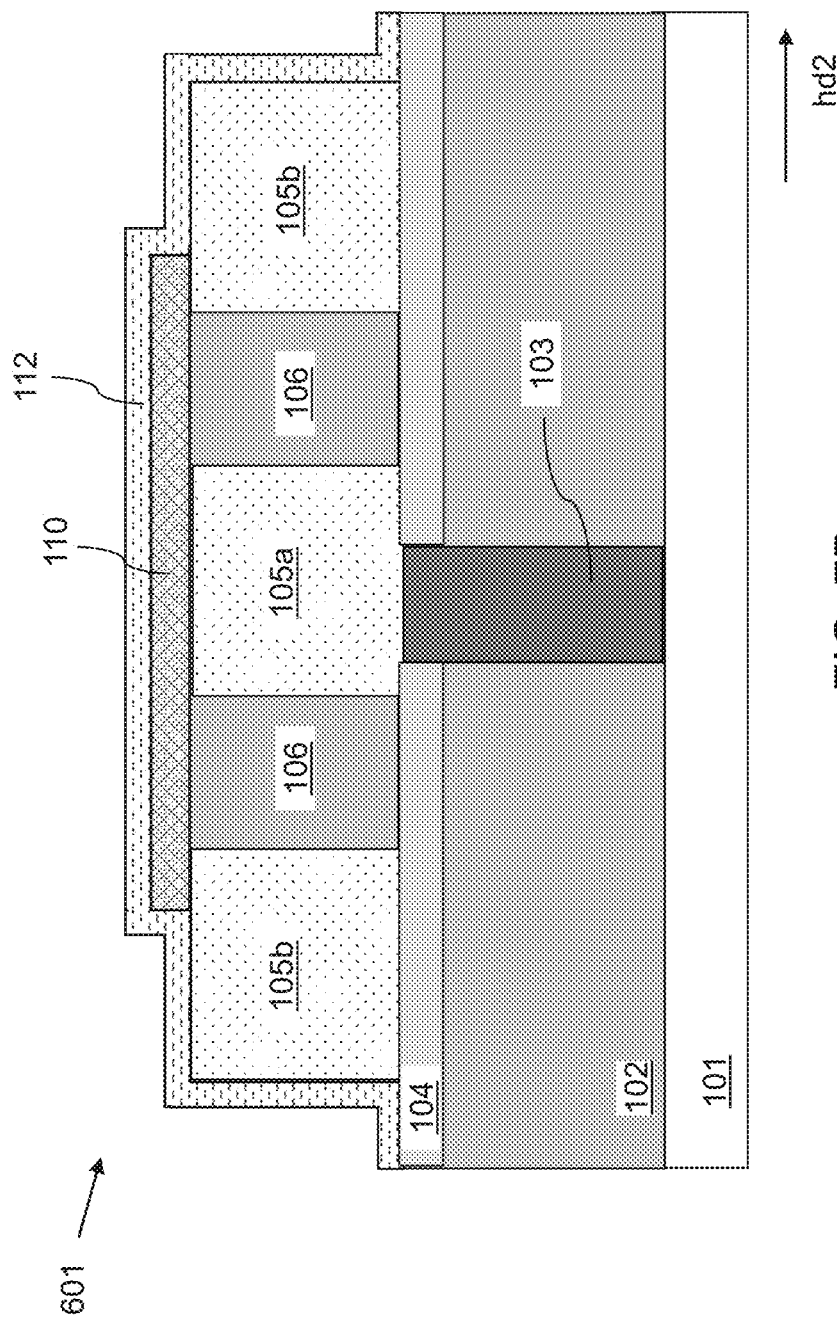
FIG. 7B is a vertical cross-section view of the exemplary structure along line A-A' in FIG. 7A.
Figure 7C:
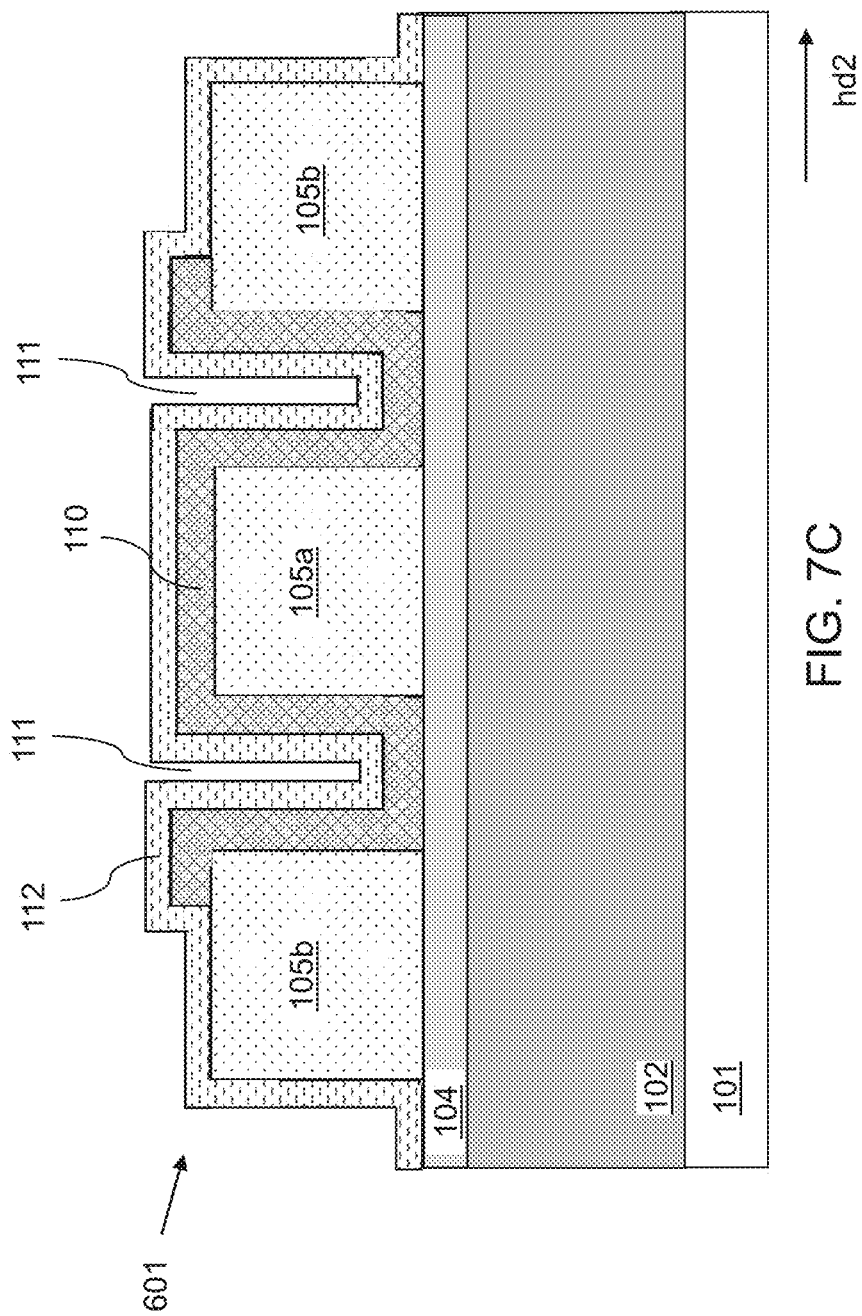
FIG. 7C is a vertical cross-section view of the exemplary structure along line B-B' in FIG. 7A.
Figure 7E:
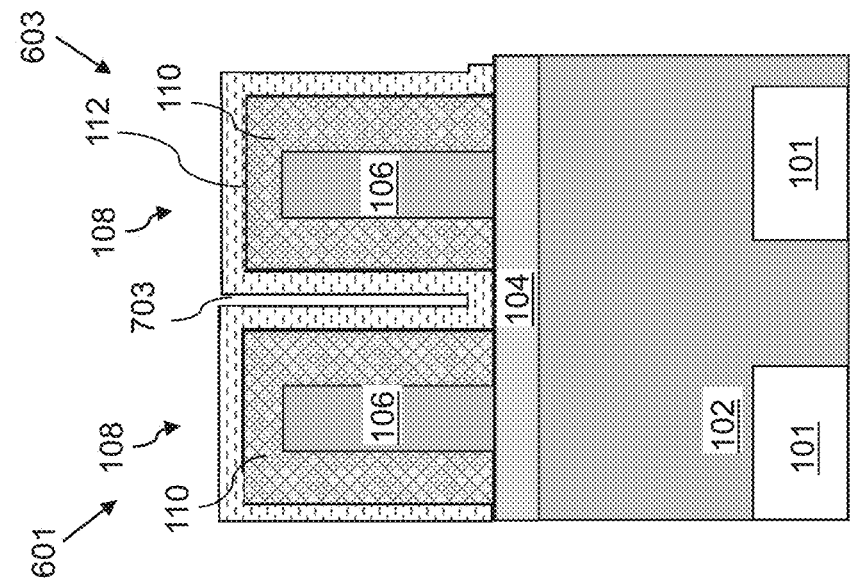
FIG. 7E is a vertical cross-section view of the exemplary structure along line D-D' in FIG. 7A.
Figure 7D:
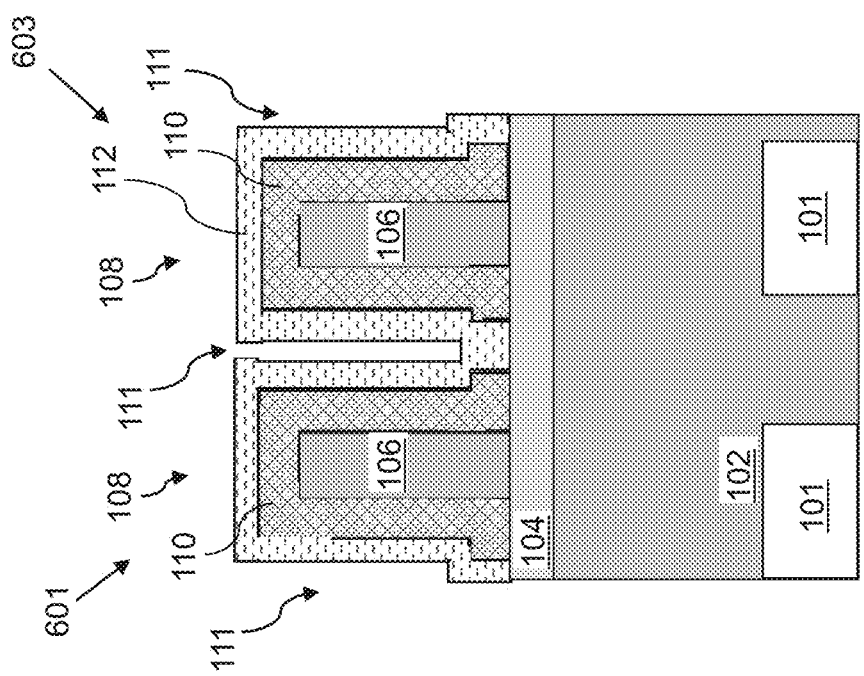
FIG. 7D is a vertical cross-section view of the exemplary structure along line C-C' in FIG. 7A.
Figure 7G:
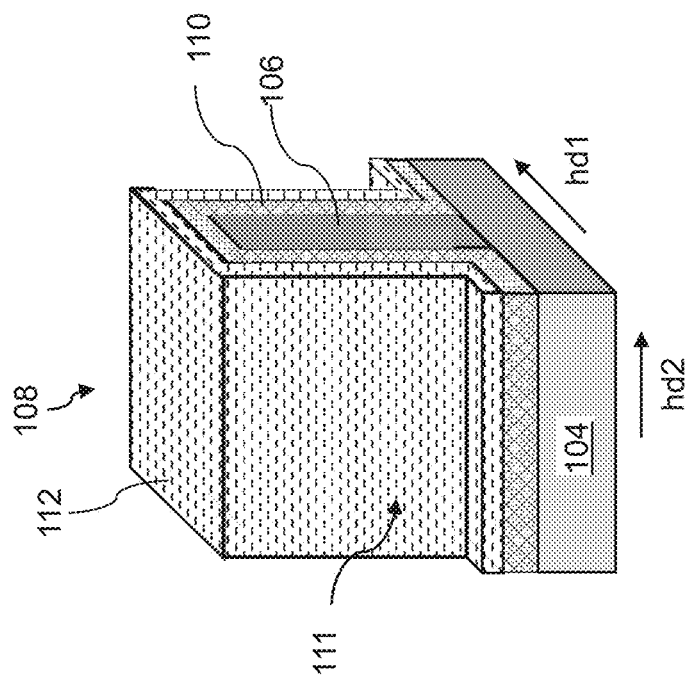
FIG. 7G is a perspective view showing the gate dielectric layer over a fin structure according to an embodiment of the present disclosure.
Figure 7F:
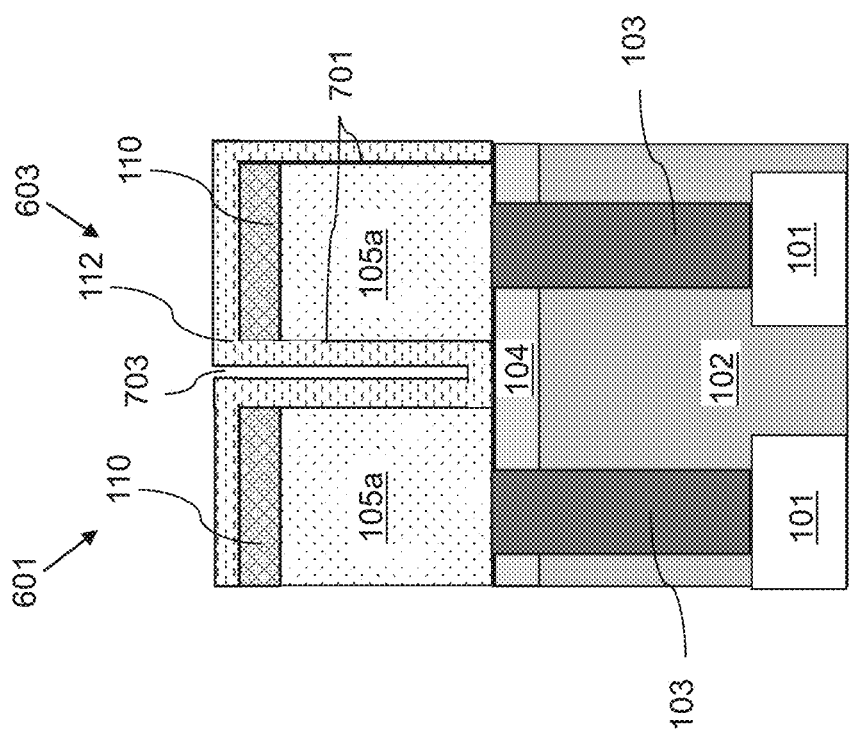
FIG. 7F is a vertical cross-section view of the exemplary structure along line E-E' in FIG. 7A.

FIG. 7A is a top view of an exemplary structure during a process of forming a plurality of TFT devices showing a gate dielectric layer 112 formed over the upper surfaces and the side surfaces of each of the layer stacks 601 and 603 and over the upper surface of the second dielectric layer 104. FIG. 7B is a vertical cross-section view of the exemplary structure along line A-A' in FIG. 7A. FIG. 7C is a vertical cross-section view of the exemplary structure along line B-B' in FIG. 7A. FIG. 7D is a vertical cross-section view of the exemplary structure along line C-C' in FIG. 7A. FIG. 7E is a vertical cross-section view of the exemplary structure along line D-D' in FIG. 7A. FIG. 7F is a vertical cross-section view of the exemplary structure along line E-E' in FIG. 7A. FIG. 7G is a perspective view showing the gate dielectric layer 112 over a fin structure 108.

Referring to FIGS. 7A-7G, the gate dielectric layer 112 may include a suitable dielectric material, such as silicon oxide, or the like, and/or a high-k dielectric material such as silicon nitride, hafnium oxide, hafnium silicon oxide, hafnium tantalum oxide, hafnium titanium oxide, hafnium zirconium oxide, tantalum oxide, aluminum oxide, hafnium dioxide-alumina, zirconium oxide, or the like. Other suitable dielectric materials are within the contemplated scope of disclosure.

In various embodiments, the gate dielectric layer 112 may be formed by conformally depositing a dielectric material over the exposed sidewalls 109 and upper surfaces 117 of the second electrodes 105b, over the upper surface and side surfaces of the semiconductor channel layer 110, over the exposed sidewalls of the first electrodes 105a, and over the exposed upper surface of the second dielectric layer 104. Referring to FIGS. 7A, 7C, 7D and 7G, in various embodiments, the gate dielectric layer 112 may partially fill the indent portions 111 of the semiconductor channel layer 110 located between the first electrode 105a and each of the second electrodes 105b in each layer stack 601 and 603. Referring to FIGS. 7A and 7F, the gate dielectric layer 112 may be located over sidewalls 701 of the electrodes 105a and 105b that extend parallel to horizontal direction hd1, and may cover the upper surface of the second dielectric layer 104 between adjacent layer stacks 601 and 603. Referring to FIGS. 7E and 7F, a gap 703 may be present between vertically-extending portions of the gate dielectric layer 112 that are located over respective side surfaces of the adjacent layer stacks 601 and 603. The gate dielectric layer 112 may be deposited using a suitable deposition process as described above.

Figure 8A:
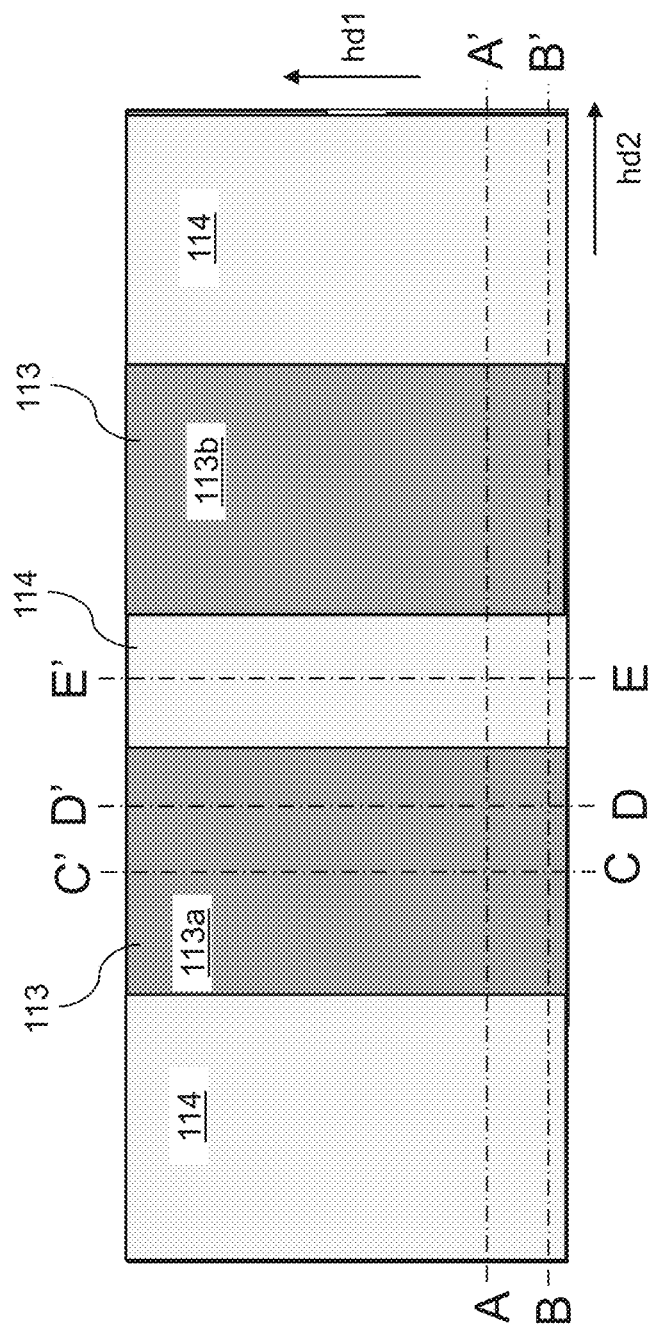
FIG. 8A is a top view of an exemplary structure during a process of forming a plurality of transistor devices showing a word line fill material and a dielectric material layer formed over the gate dielectric layer according to an embodiment of the present disclosure.
Figure 8B:
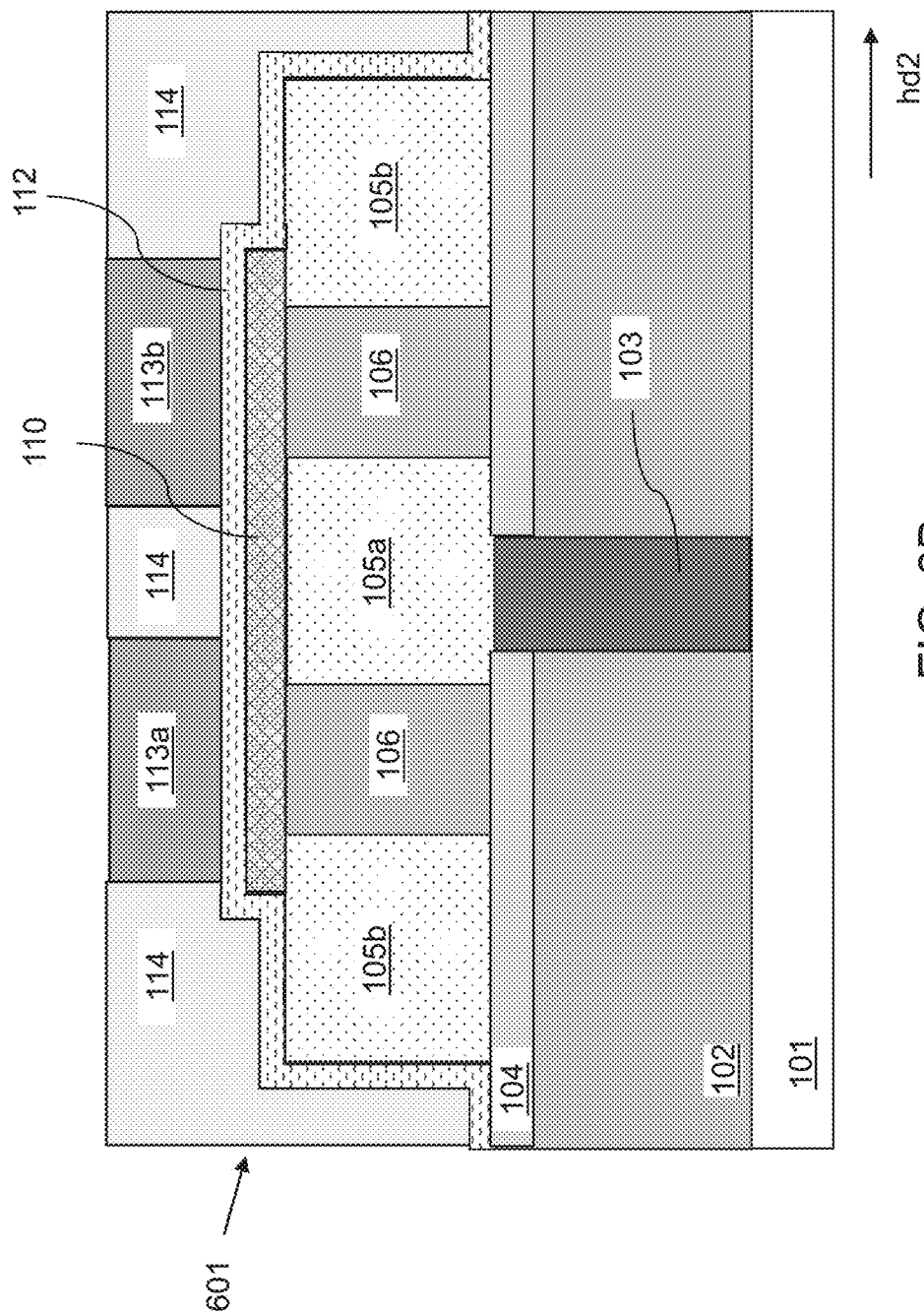
FIG. 8B is a vertical cross-section view of the exemplary structure along line A-A' in FIG. 8A.
Figure 8C:
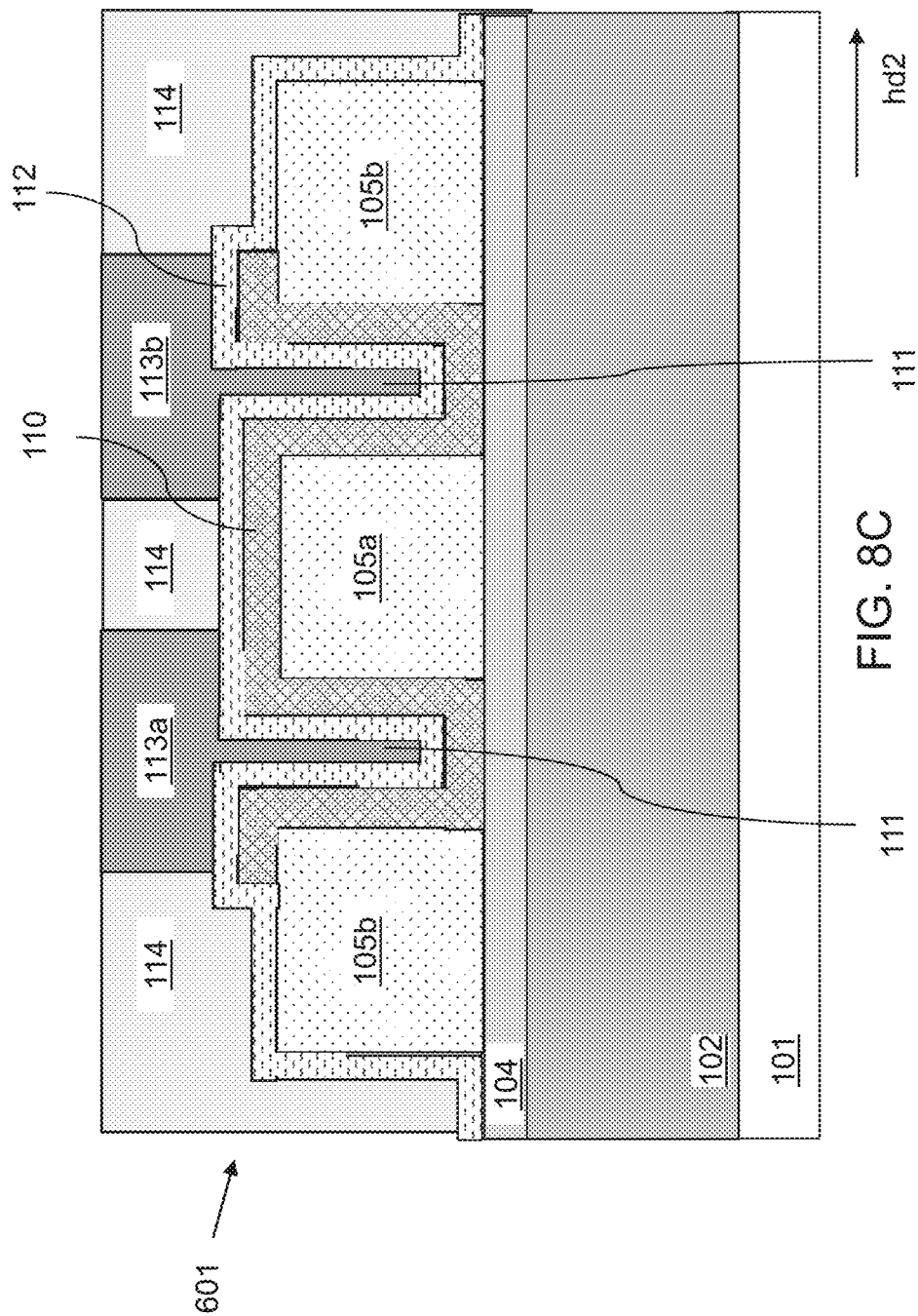
FIG. 8C is a vertical cross-section view of the exemplary structure along line B-B' in FIG. 8A.
Figure 8G:
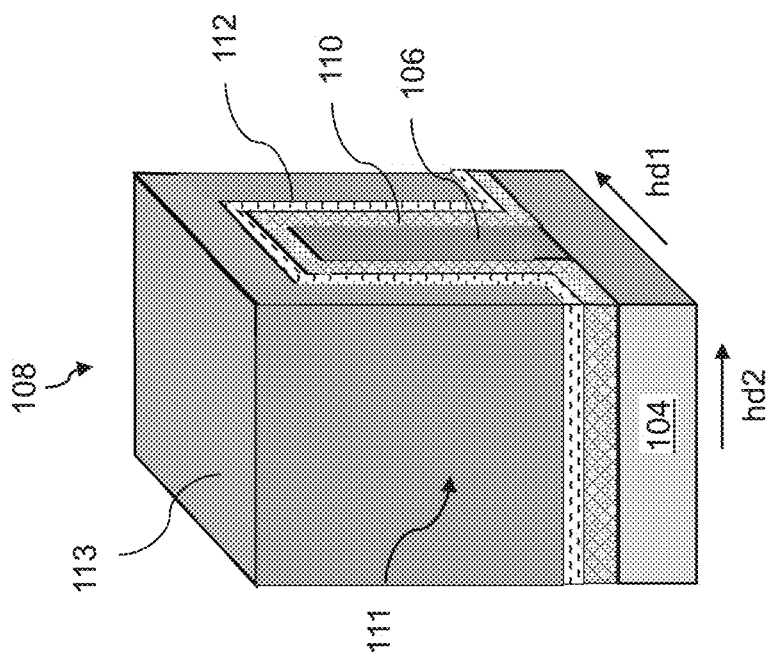
FIG. 8G is a perspective view showing the word line fill material over a fin structure according to an embodiment of the present disclosure.
Figure 8F:
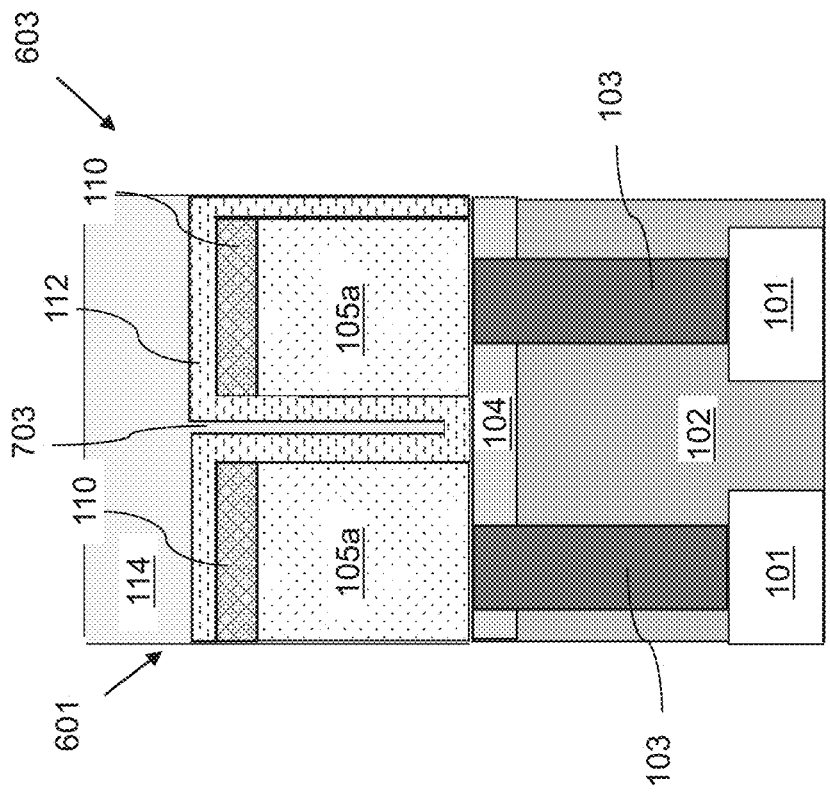
FIG. 8F is a vertical cross-section view of the exemplary structure along line E-E' in FIG. 8A.

FIG. 8A is a top view of an exemplary structure during a process of forming a plurality of TFT devices showing a word line fill material 113 and a dielectric material layer 114 formed over the gate dielectric layer 112. FIG. 8B is a vertical cross-section view of the exemplary structure along line A-A' in FIG. 8A. FIG. 8C is a vertical cross-section view of the exemplary structure along line B-B' in FIG. 8A. FIG. 8D is a vertical cross-section view of the exemplary structure along line C-C' in FIG. 8A. FIG. 8E is a vertical cross-section view of the exemplary structure along line D-D' in FIG. 8A. FIG. 8F is a vertical cross-section view of the exemplary structure along line E-E' in FIG. 8A. FIG. 8G is a perspective view showing the word line fill material 113 over a fin structure 108.

In various embodiments, the dielectric material layer 114 may include any suitable dielectric material as described above. The word line fill material 113 may include a sacrificial material that may be removed during a subsequent process of forming electrically conductive gate electrodes (which may also be referred to a "word lines") of the TFT devices. The word line fill material 113 may include any suitable sacrificial material, which may be a dielectric material, a semiconductor material, or other suitable materials. In various embodiments, the word line fill material 113 may include a material having a higher etch selectivity than the material(s) of the gate dielectric layer 112 and the dielectric material layer 114 during a subsequent etching process to remove the word line fill material 113. In one non-limiting embodiment, the word line fill material 113 may be composed of a nitride material, such as silicon nitride, and the dielectric material layer 114 may be composed of an oxide material, such as silicon oxide. Other suitable materials for the word line fill material 113 and the dielectric material layer 114 are within the contemplated scope of disclosure.

Referring to FIGS. 8A-8G, the word line fill material 113 may include a plurality of strip-shaped segments 113a and 113b extending along horizontal direction hd1 and separated from one another along horizontal direction hd2. Each strip-shaped segment 113a and 113b of the word line fill material 113 may extend continuously over a plurality of layer stacks 601 and 603 that are adjacent to one another along horizontal direction hd1. Referring to FIGS. 8A, 8B, 8C, 8D, 8E and 8G, the strip-shaped segments 113a and 113b may contact the gate dielectric layer 112 and may overlie the fin structures 108 in each layer stack 601, 603. The strip-shaped segments 113a and 113b may also overlie the fin-shaped portions of the semiconductor channel layer 110 as well as portions of the first electrode 105a and the second electrode 105b that contact the respective fin structures 108. Referring to FIGS. 8A, 8C, 8D and 8G, the strip-shaped segments 113a and 113b of the word line fill material 113 may fill the remaining volume of the indent portions 111 located between the first electrode 105a and the adjacent second electrodes 105b in each of the layer stacks 601, 603. Referring to FIG. 8E, the strip-shaped segments 113a and 113b of the word line fill material 113 may also fill the gap 703 between adjacent layer stacks 601 and 603 near the interface between the fin structures 108 and each of the electrodes 105a and 105b.

Referring to FIGS. 8A, 8B, 8C and 8F, the remaining portions of the exemplary structure that are not covered by a strip-shaped segment 113a, 113b of the word line fill material 113 may be covered by the dielectric material layer 114. The dielectric material layer 114 may be deposited over the gate dielectric layer 112 and may overlie portions of the upper surfaces and side surfaces of the second electrodes 105b, portions of the channel layer 110, and portions of the upper surfaces and side surfaces of the first electrodes 105a. Referring to FIG. 8F, the dielectric material layer 114 may fill portions of the gap 703 between the adjacent layer stacks 601 and 603.

In various embodiments, the word line fill material 113 and the dielectric material layer 114 may be formed by depositing a continuous layer of the word line fill material 113 over the gate dielectric layer 112. A patterned mask (not shown in FIGS. 8A-8G) may be formed over the upper surface of the continuous layer of word line fill material 113, and the exemplary structure may be etched through the patterned mask to remove portions of the continuous layer of word line fill material 113 that are exposed through the mask and provide discrete strip-shaped segments 113a, 113b of the word line fill material 113 as shown in FIGS. 8A-8G. The etching process may expose the gate dielectric layer 112 in regions of the exemplary structure that are not covered by the patterned mask. The etching process may use an etch chemistry that may have a higher etch selectivity for the word line fill material 113 relative to the material of the gate dielectric layer 112. In various embodiments, the etch rate of the word line fill material 113 during the etching process may be at least 5 times greater, such as at least 10 times greater, including 100 times greater or more, than the etch rate of the gate dielectric layer 112 during the etching process. Following the etching process, the patterned mask may be removed using a suitable process, such as by ashing or by dissolution using a solvent.

Following the etching process, the dielectric material layer 114 may be deposited over the exposed portions of the gate dielectric layer 112 and over the side surfaces and optionally over the upper surfaces of the strip-shaped segments 113a and 113b of the word line fill material 113. A planarization process, such as a chemical mechanical polishing (CMP) process may optionally be used to remove the dielectric material layer 114 from over the upper surfaces of the strip-shaped segments 113a and 113b and provide the exemplary structure as shown in FIGS. 8A-8G.

Figure 9A:
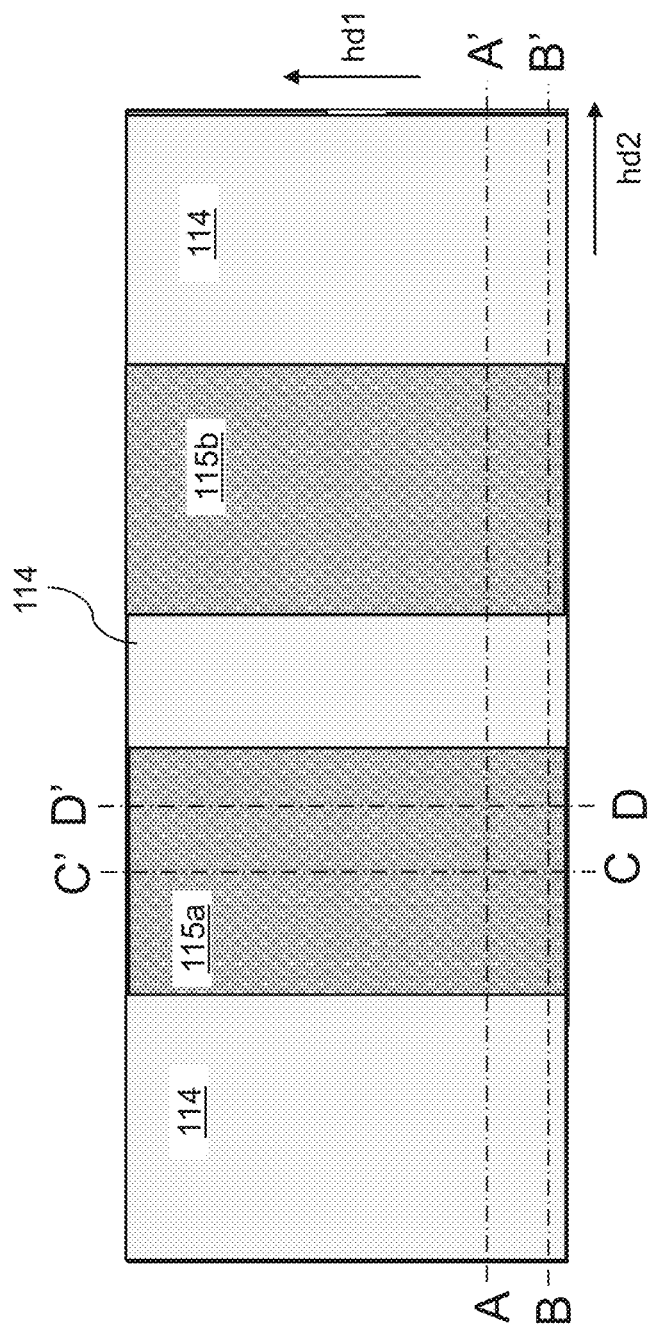
FIG. 9A is a top view of an exemplary structure during a process of forming a plurality of transistor devices showing a plurality of word lines separated by and laterally surrounded by the dielectric material layer according to an embodiment of the present disclosure.
Figure 9B:
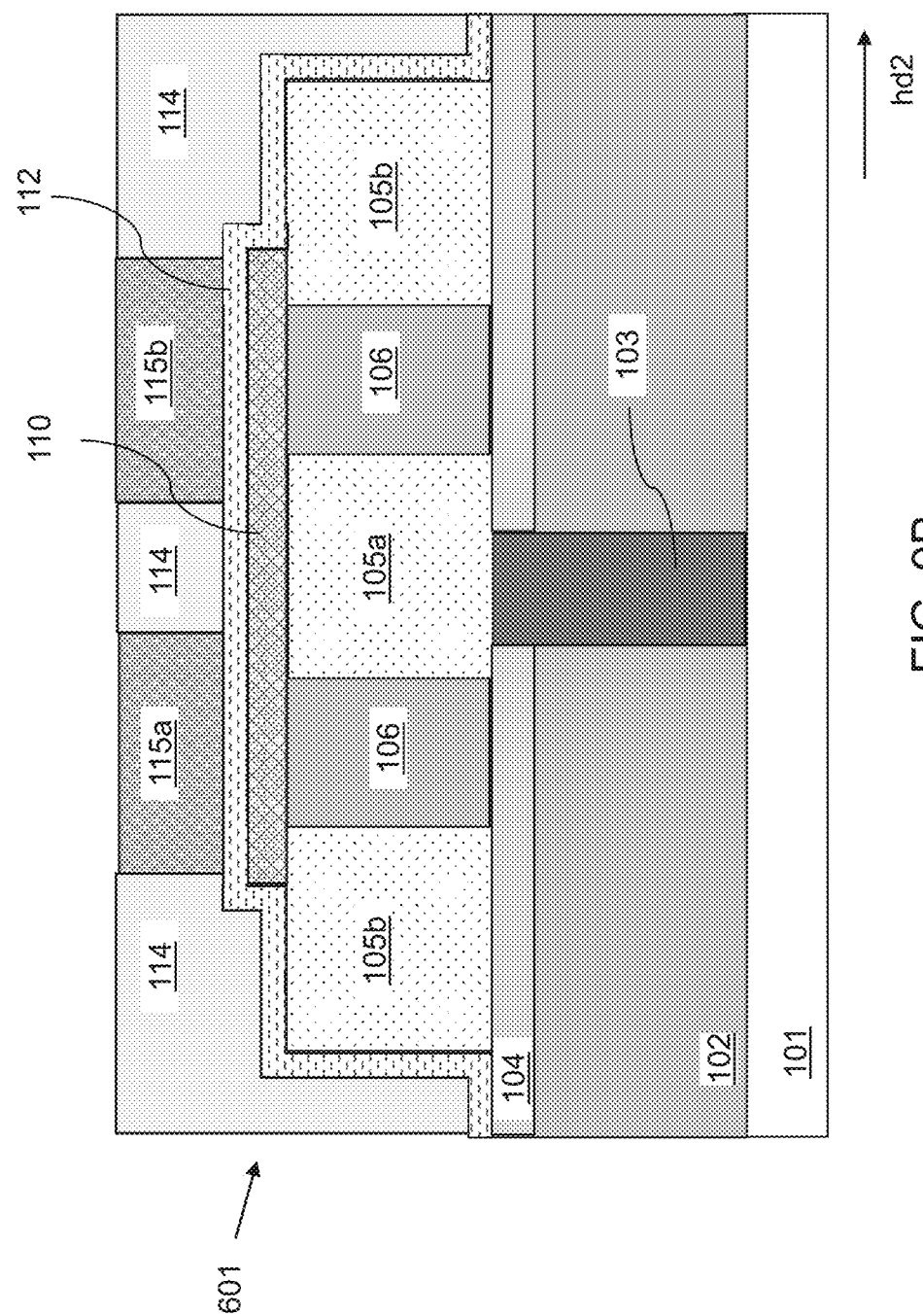
FIG. 9B is a vertical cross-section view of the exemplary structure along line A-A' in FIG. 9A.
Figure 9C:
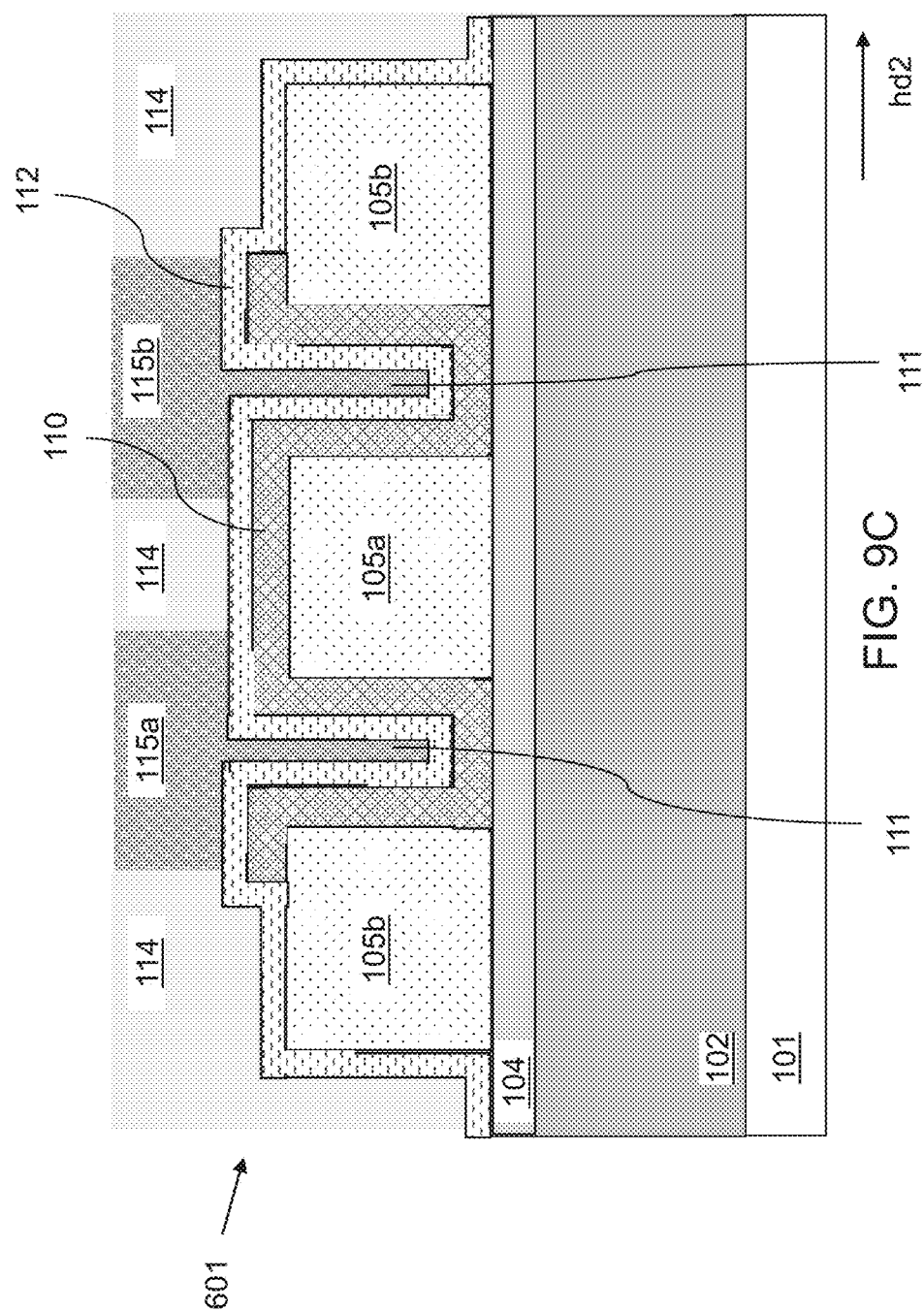
FIG. 9C is a vertical cross-section view of the exemplary structure along line B-B' in FIG. 9A.
Figure 9F:
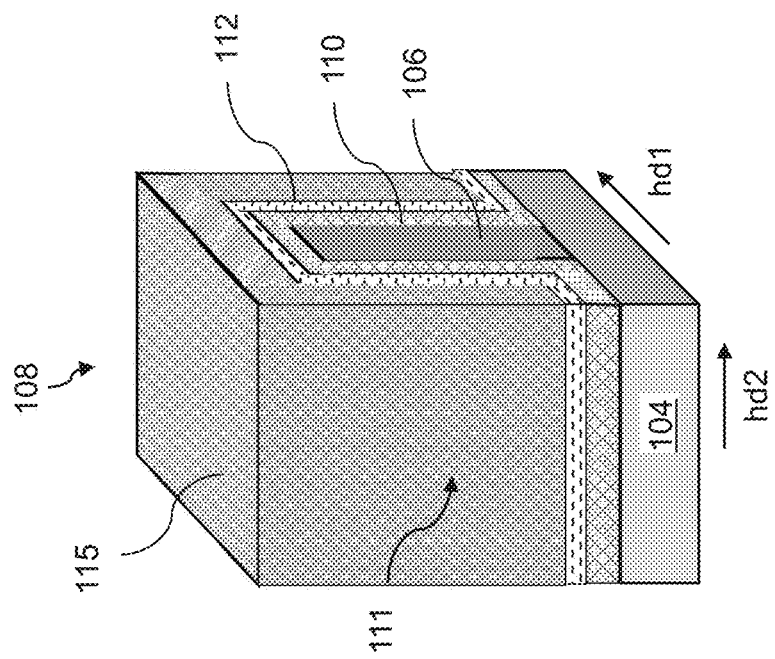
FIG. 9F is a perspective view showing a word line over a fin structure according to an embodiment of the present disclosure.

FIG. 9A is a top view of an exemplary structure during a process of forming a plurality of TFT devices showing a plurality of word lines 115a and 115b separated by and laterally surrounded by the dielectric material layer 114. FIG. 9B is a vertical cross-section view of the exemplary structure along line A-A' in FIG. 9A. FIG. 9C is a vertical cross-section view of the exemplary structure along line B-B' in FIG. 9A. FIG. 9D is a vertical cross-section view of the exemplary structure along line C-C' in FIG. 9A. FIG. 9E is a vertical cross-section view of the exemplary structure along line D-D' in FIG. 9A. FIG. 9F is a perspective view showing a word line 115 over a fin structure 108.

In various embodiments, the word lines 115a and 115b may include any suitable electrically conductive material, such as copper (Cu), aluminum (Al), zirconium (Zr), titanium (Ti), titanium nitride (TiN), tungsten (W), tantalum (Ta), tantalum nitride (TaN), molybdenum (Mo), ruthenium (Ru), palladium (Pd), platinum (Pt), cobalt (Co), nickel (Ni), iridium (Ir), iron (Fe), beryllium (Be), chromium (Cr), antimony (Sb), osmium (Os), thorium (Th), vanadium (V), alloys thereof, and combinations of the same. Other suitable electrically conductive materials for the word lines 115a and 115b are within the contemplated scope of disclosure.

Referring to FIGS. 9A-9F, the word lines 115a and 115b may extend along horizontal direction hd1 and may be separated from one another along horizontal direction hd2. Each word line 115a and 115b may extend continuously over a plurality of layer stacks 601 and 603 that are adjacent to one another along horizontal direction hd1. The word lines 115a and 115b may be surrounded by the dielectric material layer 114 over the lateral side surfaces of the word lines 115a and 115b. Referring to FIGS. 9A-9F, the word lines 115a and 115b may contact the gate dielectric layer 112 and may overlie the fin structures 108 in each layer stack 601, 603. The word lines 115a and 115b may overlie portions of the upper surfaces and side surfaces of the semiconductor channel layer 110, and may function as gate electrodes for the TFT devices to be subsequently formed. The word lines 115a and 115b may also overlie portions of the first electrodes 105a and the second electrodes 105b that contact the respective fin structures 108. Referring to FIGS. 9A, 9C, 9D and 9F, the word lines 115a and 115b may fill the remaining volume of the indent portions 111 located between the first electrode 105a and the adjacent second electrodes 105b in each of the layer stacks 601, 603. Portions of the word lines 115a and 115b located within the indent portions 111 may be surrounded by the gate dielectric layer 112 and the semiconductor channel layer 110 on three side surfaces and the bottom surface of the word line 115a, 115b. Referring to FIG. 9E, the word lines 115a and 115b may also fill the gap 703 between adjacent layer stacks 601 and 603 near the interface between the fin structures 108 and each of the electrodes 105a and 105b.

In various embodiments, the word lines 115a and 115b may be formed by selectively removing the word line fill material 113 from the exemplary structure using an etching process, such as a wet etching process. The etching process may use an etch chemistry that may have a higher etch selectivity for the word line fill material 113 relative to the material of the gate dielectric layer 112 and the dielectric material layer 114. In various embodiments, the etch rate of the word line fill material 113 during the etching process may be at least 5 times greater, such as at least 10 times greater, including 100 times greater or more, than the etch rate of the gate dielectric layer 112 and the dielectric material layer 114 during the etching process. The etching process may provide a plurality of trenches extending along horizontal direction hd1 and separated from one another along horizontal direction hd2. The gate dielectric layer 112 may be exposed on the bottom surfaces of the trenches and the dielectric material layer 114 may be exposed along the side surfaces of the trenches.

Following the etching process, the word lines 115a and 115b may be formed by depositing an electrically conductive material over the exemplary structure using a suitable deposition process as described above. The electrically conductive material may be deposited over the upper surface of the dielectric material layer 114 and may fill the trenches. Following the deposition of the electrically conductive material, a planarization process, such as a chemical mechanical polishing (CMP) process, may be used to remove the electrically conductive material from over the upper surface of the dielectric material layer 114 to provide discrete word lines 115a and 115b laterally surrounded by the dielectric material layer 114 as shown in FIGS. 9A-9F.

Figure 10B:
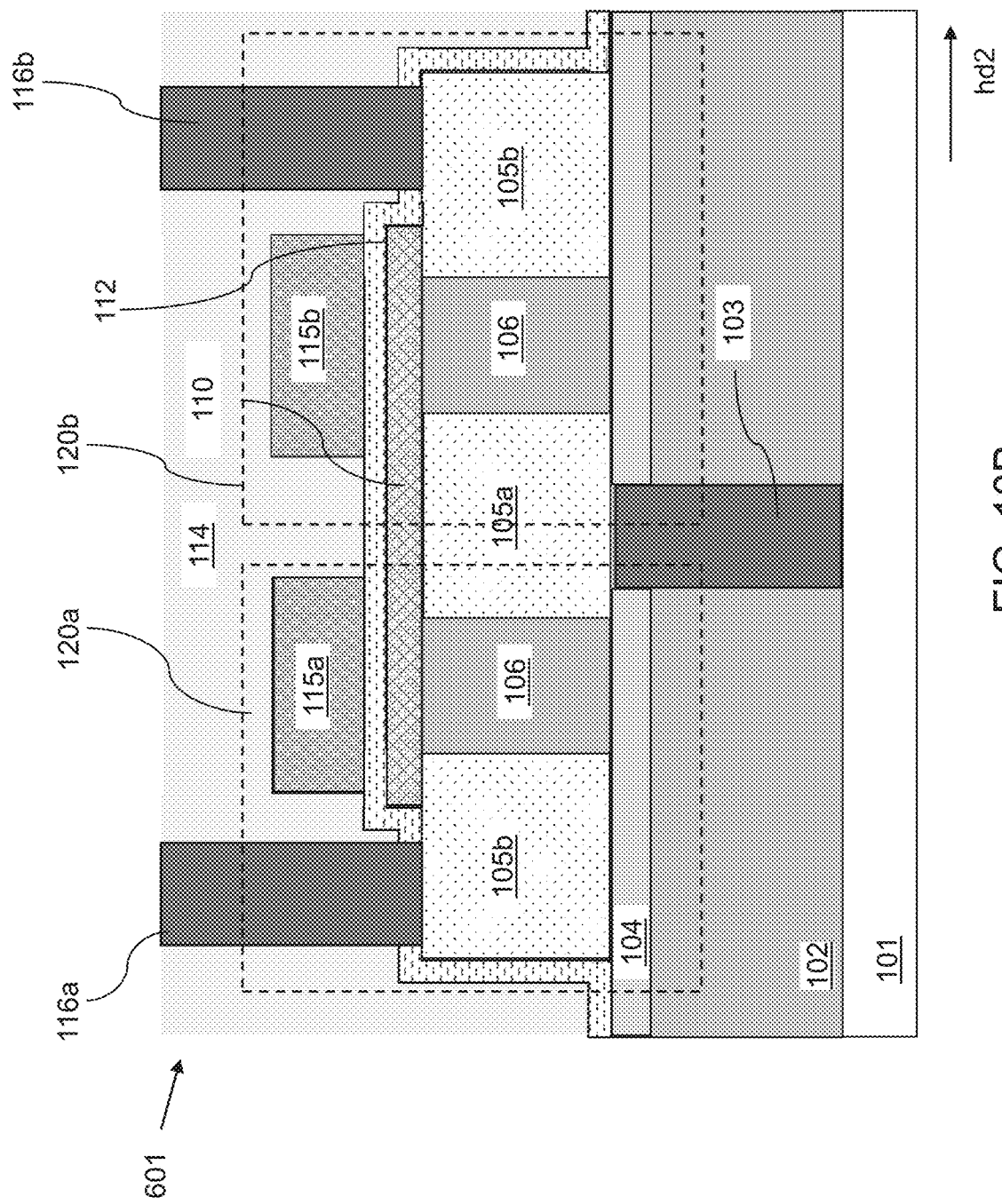
FIG. 10B is a vertical cross-section view of the exemplary structure along line A-A' in FIG. 10A.

FIG. 10A is a top view of an exemplary structure showing a plurality of TFT devices 120a-120d including conductive vias 116a-116d formed through the dielectric material layer 114 according to an embodiment of the present disclosure. FIG. 10B is a vertical cross-section view of the exemplary structure along line A-A' in FIG. 10A. FIG. 10C is a vertical cross-section view of the exemplary structure along line B-B' in FIG. 10A.

Referring to FIGS. 10A-10C, additional dielectric material may be deposited over the upper surfaces of the dielectric material layer 114 and over the upper surfaces of the word lines 115a and 115b shown in FIGS. 9A-9F to form a dielectric material layer 114 embedding the word lines 115a and 115b over the side surfaces and upper surfaces of the word lines 115a and 115b. The additional dielectric material may be the same material as the dielectric material layer 114 shown in FIG. 9A-9F, or may be a different dielectric material. The additional dielectric material may be deposited using a suitable deposition method as described above.

A plurality of conductive vias 116a, 116b, 116c and 116d may be formed through the dielectric material layer 114 and the gate dielectric layer 112, where each conductive via 116a, 116b, 116c and 116d may contact an upper surface of a second electrode 105b. In various embodiments, the conductive vias 116a-116d may be formed by forming a patterned mask (not shown in FIGS. 10A-10C) over upper surface of the dielectric material layer 114, where the patterned mask includes openings through the mask corresponding to the locations of conductive vias to be subsequently formed. The mask, which may include a layer of photoresist and/or a hard mask, may be patterned using a photolithographic technique to form the openings through the mask corresponding to the locations of the conductive vias to be subsequently formed. An etching process, such as an anisotropic etching process, may be used to etch the exemplary structure through the mask to form via openings extending through the dielectric material layer 114 and the gate dielectric layer 112. The etching process may expose the upper surface of a second electrode 105b at the bottom of each of the via openings. Following the etching process, the patterned mask may be removed using a suitable process, such as by ashing or by dissolution using a solvent. An electrically conductive material may then be deposited over the upper surface of the dielectric material layer 114 and within the via openings to contact the exposed upper surfaces of the second electrodes 105b. The electrically conductive material may be any suitable electrically conductive material, such as copper (Cu), aluminum (Al), zirconium (Zr), titanium (Ti), titanium nitride (TiN), tungsten (W), tantalum (Ta), tantalum nitride (TaN), molybdenum (Mo), ruthenium (Ru), palladium (Pd), platinum (Pt), cobalt (Co), nickel (Ni), iridium (Ir), iron (Fe), beryllium (Be), chromium (Cr), antimony (Sb), osmium (Os), thorium (Th), vanadium (V), alloys thereof, and combinations of the same.

Other suitable electrically conductive materials for the conductive vias 116a-116d are within the contemplated scope of disclosure. The electrically conductive material may be deposited using a suitable deposition process as described above.

A planarization process, such as chemical mechanical planarization (CMP) process, may be used to remove portions of the electrically conductive material from over the upper surface of the dielectric material layer 114, leaving discrete conductive vias 116a-116d extending through the dielectric material layer 114 and the gate dielectric layer 112 and contacting a second electrode 105b.

Referring again to FIGS. 10A-10C, a plurality of thin-film transistor (TFT) devices 120a, 120b, 120c, and 120d according to an embodiment of the present disclosure are shown. Each TFT device 120a-120d includes a first electrode 105a, which may be a drain electrode, a second electrode 105b, which may be a source electrode, and a fin structure 108 extending between and contacting respective sidewalls 109 of the first electrode 105a and the second electrode 105b. The fin structure 108 may include a dielectric material 106. A fin-shaped semiconductor channel layer 110 may be located over the upper surface and the side surfaces of the fin structure 108, and may extend continuously between the respective sidewalls 109 of the first electrode 105a and the second electrode 105b. The fin-shaped semiconductor channel layer 110 may include a first vertical portion 110a and a second vertical portion 110b over opposite side surfaces of the fin structure 108 which contact each of the respective sidewalls 109 of the first electrode 105a and the second electrode 105b. In embodiments, the first vertical portion 110a and the second vertical portion 110b of the semiconductor channel layer 110 may contact the respective sidewalls 109 of the first electrode 105a and the second electrode 105b over the entire vertical height of each of the sidewalls 109. In embodiments, the semiconductor channel layer may additionally include a first horizontal portion 110c that extends over an upper surface of the fin structure 108 and contacts at least a portion of the upper surfaces of each of the first electrode 105a and the second electrode 105b.

Each of the TFT devices 120a-120d may further include a gate electrode 115a, 115b located over the fin structure 108 and the fin-shaped semiconductor channel layer 110, and a gate dielectric layer 112 located between the fin-shaped semiconductor channel layer 110 and the gate electrode 115a, 115b. A first conductive via 103 may contact the first electrode 105a and a second conductive via 116a-116d may contact the second electrode 105b.

In the embodiment of FIGS. 10A-10C, each layer stack 601 and 603 of the exemplary structure may form a portion of two TFT devices 120a, 120b, 120c and 120d that may share a common electrode 105a, which may be a drain electrode. Alternatively, the common electrode 105a may be a source electrode, and each of the second electrodes 105b may be a drain electrode. Referring to FIGS. 10A-10C, the first electrode 105a of layer stack 601 may function as a common electrode of TFT devices 120a and 120b, and the first electrode 105a of layer stack 603 may function as a common electrode of TFT devices 120c and 120d.

FIGS. 11A-14D are sequential views of an exemplary structure during a process of forming a plurality of TFT devices according to an alternative embodiment of the present disclosure. The TFT devices in the embodiment of FIGS. 11A-14D may differ from the TFT devices in the embodiment of FIGS. 2A-10C described above in that the first horizontal portion 110c of the fin-shaped semiconductor channel layer 110 may contact the respective sidewalls 109 of the first electrode 105*a* and the second electrode 105*b*. Thus, the fin-shaped semiconductor channel layer 110 may contact the respective sidewalls 109 of the first electrode 105*a* and the second electrode 105*b* over a region of the semiconductor channel layer 110 having a shape similar to an inverted "U" that includes the first vertical portion 110*a* of the semiconductor channel layer 110, the second vertical portion 110*b* of the semiconductor channel layer 110, and at least part of the first horizontal portion 110*c* of the semiconductor channel layer 110. This may further increase the contact area between the channel layer 110 and the source and drain electrodes 105*b* and 105*a* of the TFT devices, which may provide an additional increase in the driving current for the TFT devices.

FIG. 11A is a top view of an exemplary structure during a process of forming a plurality of TFT devices showing first electrodes 105*a* and second electrodes 105*b* embedded in a third dielectric layer 106 according to various embodiments of the present disclosure. FIG. 11B is a vertical cross-section view of the exemplary structure along line A-A' in FIG. 11A. FIG. 11C is a vertical cross-section view of the exemplary structure along line B-B' in FIG. 11A.

The exemplary structure shown in FIGS. 11A-11C may be derived from the exemplary structure shown in FIGS. 3A-3C, thus repeated discussion of the structure and details of the bit lines 101, the first dielectric layer 102, the second dielectric layer 104, the conductive vias 103, the first electrodes 105*a*, the second electrodes 105*b* and the third dielectric layer 106 are omitted. The exemplary structure shown in FIGS. 11A-11C differs from the exemplary structure shown in FIGS. 3A-3C in that the upper surface of the third dielectric layer 106 is vertically recessed relative to the upper surfaces 117 of the first and second electrodes 105*a* and 105*b*. In various embodiments, the first electrodes 105*a* and the second electrodes 105*b* may be formed as described above with reference to FIGS. 3A-3C. Then, an etching process may be performed to recess the upper surface of the third dielectric layer 106 relative to the upper surfaces 117 of the first electrodes 105*a* and the second electrodes 105*b*. The etching process may use an etch chemistry that may have a higher etch selectivity for the material of the third dielectric layer 106 relative to the material of the first electrodes 105*a* and the second electrodes 105*b*. In various embodiments, the etch rate of the third dielectric layer 106 during the etching process may be at least 5 times greater, such as at least 10 times greater, including 100 times greater or more, than the etch rate of the first electrodes 105*a* and the second electrodes 105*b* during the etching process. Following the etching process, upper portions of the sidewalls 109 of the first electrodes 105*a* and the second electrodes 105*b* may be exposed above the recessed upper surface of the third dielectric layer 106.

FIG. 12A is a top view of an exemplary structure during a process of forming a plurality of TFT devices showing a patterned mask 107 over the upper surfaces of the first electrodes 105*a*, the second electrodes 105*b*, and the third dielectric layer 106. FIG. 12B is a vertical cross-section view of the exemplary structure along line A-A' in FIG. 12A.

The exemplary structure shown in FIGS. 12A and 12B may be derived from the exemplary structure shown in FIGS. 4A-4C, thus repeated discussion of the structure and details of the patterned mask 107, including strip-shaped mask portions 107*a* and 107*b* extending over the upper surface of the third dielectric layer 106 and the central portions of a first electrode 105*a* and the pair of second electrodes 105*b* on opposite sides of the first electrode 105*a*, are omitted. The exemplary structure shown in FIGS. 12A and 12B differs from the exemplary structure shown in FIGS. 4A-4C in that the strip-shaped mask portions 107*a* and 107*b* of the patterned mask 107 extend over the exposed portions of the sidewalls 109 of the first electrodes 105*a* and the second electrodes 105*b*.

FIG. 13A is a top view of an exemplary structure during a process of forming a plurality of TFT devices following an etching process to remove portions of the third dielectric layer 106 and form fin structures 108 contacting the first electrodes 105*a* and the second electrodes 105*b*. FIG. 13B is a vertical cross-section view of the exemplary structure along line A-A' in FIG. 13A. FIG. 13C is a vertical cross-section view of the exemplary structure along line B-B' in FIG. 13A. FIG. 13D is a vertical cross-section view of the exemplary structure along line C-C' in FIG. 13A.

Referring to FIGS. 13A-13D, an etch process may be used to etch the exemplary structure through the patterned mask 107 shown in FIGS. 12A-12C. The etch process may use an etch chemistry that may have a higher etch selectivity for the material of the third dielectric layer 106 relative to the material of the first electrodes 105*a* and the second electrodes 105*b*. In various embodiments, the etch rate of the third dielectric layer 106 during the etching process may be at least 5 times greater, such as at least 10 times greater, including 100 times greater or more, than the etch rate of the first electrodes 105*a* and the second electrodes 105*b* during the etching process. The etching process may etch through the portions of the third dielectric layer 106 that are exposed through the patterned mask 107 and expose the upper surface of the second dielectric layer 104. In embodiments in which the second dielectric layer 104 is not present, the etching process may expose the upper surface of the first dielectric layer 102.

The strip-shaped portions 107*a* and 107*b* of the patterned mask 107 may protect portions of the third dielectric layer 106 from being etched during the etching process. Following the etching process, the remaining portions of the third dielectric layer 106 may form fin structures 108 extending along horizontal direction hd2. Each fin structure 108 may contact at least one sidewall 109 of an electrode 105*a*, 105*b*. Referring to FIGS. 13A and 13B, the fin structures 108 may extend continuously between sidewalls 109 of the electrodes 105*a*, 105*b* that are adjacent to each other along horizontal direction hd2. Referring to FIGS. 13A, 13C and 13D, a width of the fin structures 108 along horizontal direction hd1 may be less than the width of the electrodes 105*a*, 105*b* along horizontal direction hd1. Thus, following the etching process, portions of the sidewalls 109 of the electrodes 105*a*, 105*b* that are contacted by a fin structure 108 may include exposed surfaces laterally adjacent to the fin structure 108.

Referring to FIGS. 13C and 13D, a vertical height H2 of the fin structures 108 may be less than a vertical height H1 of each of the first electrodes 105*a* and the second electrodes 105*b*. Thus, the fin structures 108 may contact the sidewalls 109 of the first electrodes 105*a* and the second electrodes 105*b* such that a portion of the sidewalls 109 above the upper surface of the fin structures 108 is exposed.

Figure 14A:
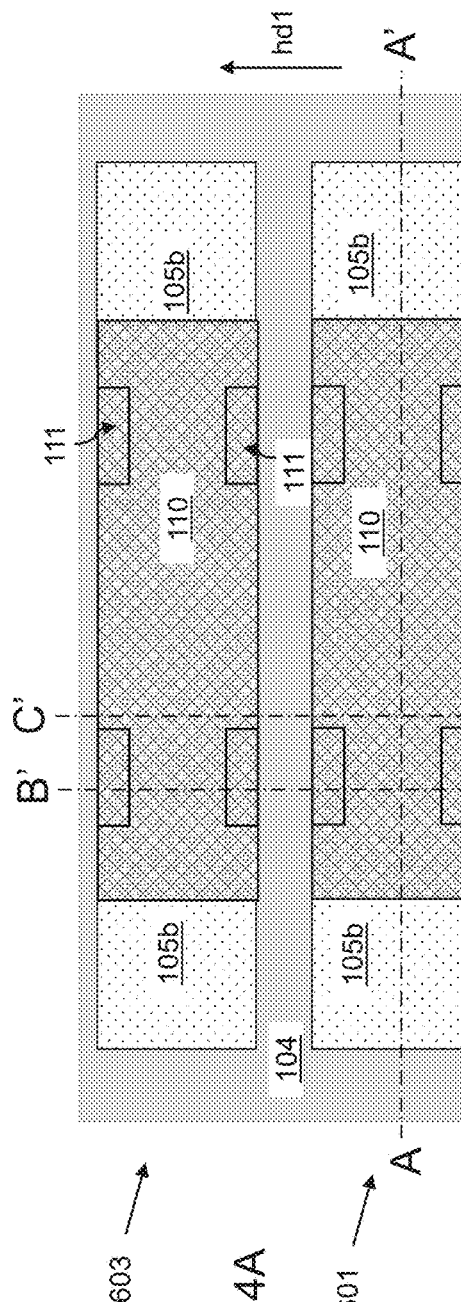
FIG. 14A is a top view of an exemplary structure during a process of forming a plurality of transistor devices showing a semiconductor channel layer formed over the upper surfaces of the first electrodes and the second electrodes, and over the upper surface and side surfaces of the fin structures and contacting sidewalls of the first electrodes and the second electrodes over vertical portions and a horizontal portion of the semiconductor channel layer according to an embodiment of the present disclosure.
Figure 14B:
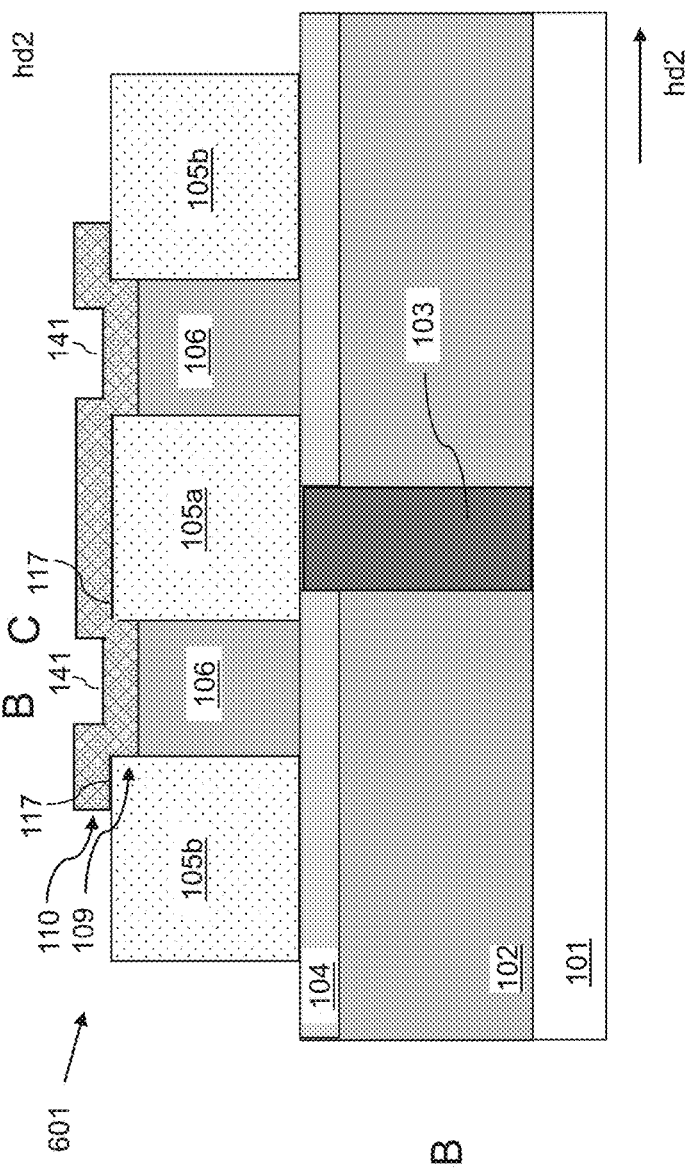
FIG. 14B is a vertical cross-section view of the exemplary structure along line A-A' in FIG. 14A.

FIG. 14A is a top view of an exemplary structure during a process of forming a plurality of TFT devices showing a semiconductor channel layer 110 formed over the upper surfaces of the first electrodes 105*a* and the second electrodes 105*b*, and over the upper surface and side surfaces of the fin structures 108. FIG. 14B is a vertical cross-section view of the exemplary structure along line A-A' in FIG. 14A. FIG. 14C is a vertical cross-section view of the exemplary structure along line B-B' in FIG. 14A. FIG. 14D is a vertical cross-section view of the exemplary structure along line C-C' in FIG. 14A.

The exemplary structure shown in FIGS. 14A-14C may be derived from the exemplary structure shown in FIGS. 6A-6C, thus repeated discussion of the structure and details of the semiconductor channel layer 110 are omitted. The exemplary structure shown in FIGS. 14A-14C differs from the exemplary structure shown in FIGS. 6A-6G in that the vertical height of the fin structures 108 is less than the vertical height of the first electrodes 105a and the second electrodes 105b. Thus, a portion of the sidewalls 109 of the first electrodes 105a and the second electrodes 105b located above the upper surface of the fin structures 108 is exposed during the formation of the semiconductor channel layer 110 and is contacted by the semiconductor channel layer.

FIG. 14D is a vertical cross-section view of a fin structure 108 and the semiconductor channel layer 110 along the vertical plane in which the fin structure 108 and the semiconductor channel layer 110 contact a sidewall 109 of a first electrode 105a. As shown in FIG. 14D, the vertical height of the fin structure 108 is less than the vertical height H1 of the first electrode 105a. Accordingly, the fin-shaped portion of the semiconductor channel layer 110 contacts the sidewall 109 of the first electrode 105a over the entire region of the semiconductor channel layer 110 below dotted line 140. Thus, the fin-shaped semiconductor channel layer 110 may contact the respective sidewalls 109 of the first electrodes 105a and the second electrodes 105b over a region of the semiconductor channel layer 110 having a shape similar to an inverted "U" that includes the first vertical portion 110a of the semiconductor channel layer 110, the second vertical portion 110b of the semiconductor channel layer 110, and at least part of the first horizontal portion 110c of the semiconductor channel layer 110. This may further increase the contact area between the channel layer 110 and the source and drain electrodes 105b and 105a of the TFT devices, which may provide an additional increase in the driving current for the TFT devices. The portion of the semiconductor channel layer 110 located above the dotted line 140 shown in FIG. 14D may continue beyond the vertical plane of the sidewall 109 of the electrodes 105a, 105b and may extend over and contact the upper surface 117 of the electrode 105a, 105b.

Referring to FIGS. 14A-14C, portions of the semiconductor channel layer 110 located between respective sidewalls 109 of the first electrodes 105a and the second electrodes 105a may include a recessed upper surface 141. The recessed upper surface 141 of the semiconductor channel layer 110 may be in addition to and may correspond to the locations of the indent portions 111 of the semiconductor channel layer 110 as described above with reference to FIGS. 6A-6G.

Subsequently, the processing steps of FIGS. 7A-10C may be performed to form a gate dielectric layer 112 over the layer stacks 601 and 603 and over the upper surface of the second dielectric layer 104, form a word line fill material 113 and a dielectric material layer 114 over the gate dielectric layer 112, form word lines 115a and 115b overlying the fin structures 108 and the fin-shaped portions of the semiconductor channel layer 110, and form conductive vias 116a-116d contacting the upper surfaces 117 of the second electrodes 105b to provide a plurality of TFT devices 120a-120d.

Figure 15:
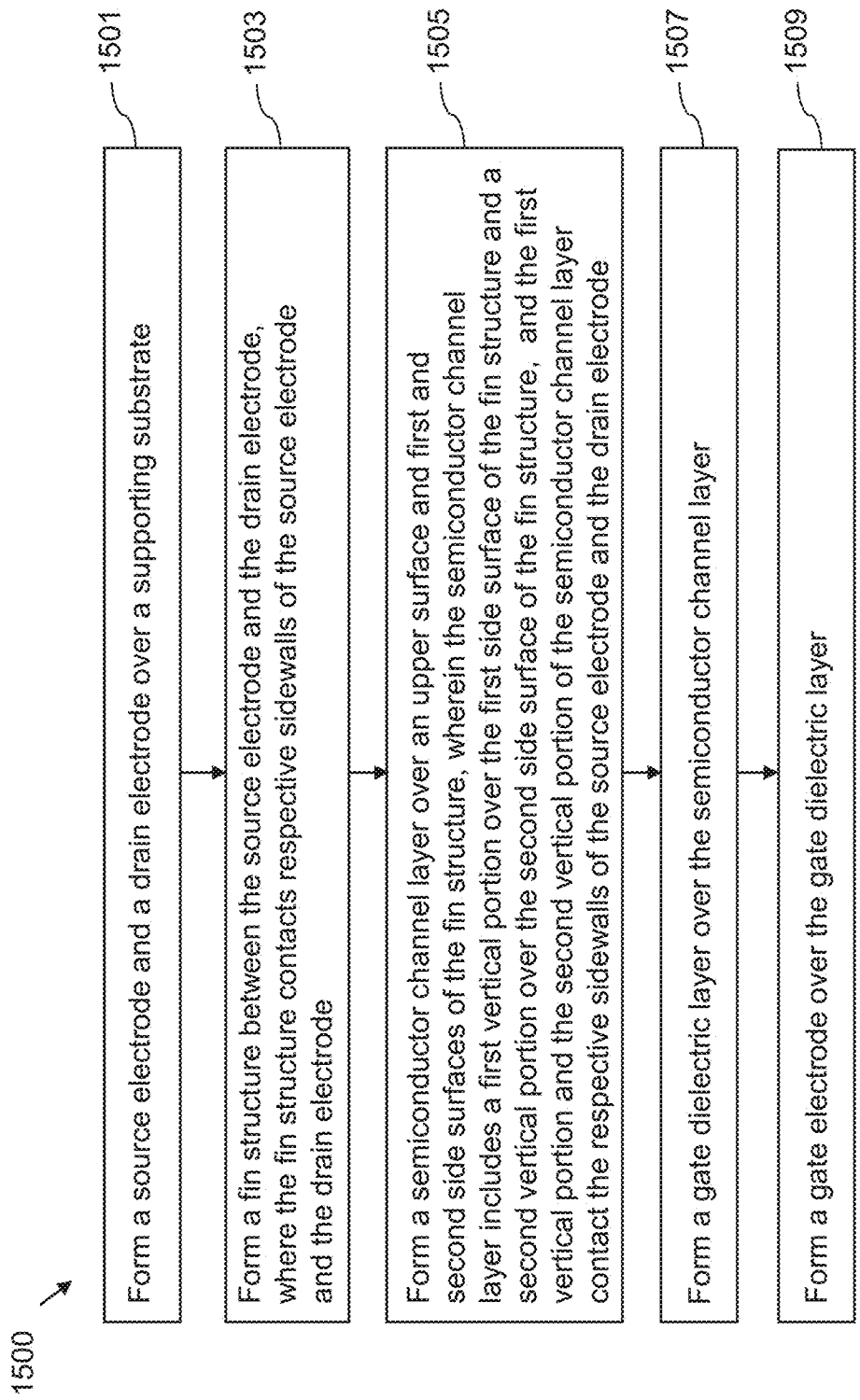
FIG. 15 is a flow diagram illustrating steps of a method of forming a TFT device according to various embodiments of the present disclosure.

FIG. 15 is a flow diagram illustrating steps of a method 1500 of forming a thin-film transistor (TFT) device, such as the TFT devices 120a-120d shown in FIGS. 10A-10C, according to various embodiments of the present disclosure. Referring to FIGS. 1A-3C and 15, in step 1501 of method 1500, a source electrode 105b and a drain electrode 105a may be formed over a supporting substrate 8. Referring to FIGS. 4A-5B, 11A-13D and 15, in step 1503 of method 1500, a fin structure 108 may be formed between the source electrode 105b and the drain electrode 105a, where the fin structure 108 contacts respective sidewalls 109 of the source electrode 105b and the drain electrode 105a. Referring to FIGS. 6A-6G and 14A-15, in step 1505 of method 1500, a semiconductor channel layer 110 may be formed over an upper surface, a first side surface, and a second side surface of the fin structure 108, wherein the semiconductor channel layer 110 includes a first vertical portion 110a over the first side surface of the fin structure 108 and a second vertical portion 110b over the second side surface of the fin structure 108, and the first vertical portion 110a and the second vertical portion 110b of the semiconductor channel layer 110 contact the respective sidewalls 109 of the source electrode 105b and the drain electrode 105a. Referring to FIGS. 7A-7G and 15, in step 1507 of method 1500, a gate dielectric layer 112 may be formed over the semiconductor channel layer 110. Referring to FIGS. 8A-9F, in step 1509 of method 1500, a gate electrode 115a, 115b may be formed over the gate dielectric layer 112.

Referring to all drawings and according to various embodiments of the present disclosure, a semiconductor structure 120a-120d may include a source electrode 105b, a drain electrode 105a, a fin structure 108 extending between and contacting respective sidewalls 109 of the source electrode 105b and the drain electrode 105a, a semiconductor channel layer 110 over the upper surface, a first side surface and a second side surface of the fin structure 108, where the semiconductor channel layer 110 may include a first vertical portion 110a over the first side surface of the fin structure 108 and a second vertical portion 110b over the second side surface of the fin structure 108, and the first vertical portion 110a and the second vertical portion 110b of the semiconductor channel layer 110 contact the respective sidewalls 109 of the source electrode 105b and the drain electrode 105a, a gate dielectric layer 112 over the semiconductor channel layer 110, and a gate electrode 115a, 115b over the gate dielectric layer 112.

In an embodiment, the fin structure 108 includes a dielectric material 106.

In another embodiment, the first vertical portion 110a and the second vertical portion 110b of the semiconductor channel layer 110 contact the respective sidewalls 109 of the source electrode 105b and the drain electrode 105a over the full vertical height H1 of the respective sidewalls 109 of the source electrode 105b and the drain electrode 105a.

In another embodiment, the upper surface of the fin structure 108 is co-planar with the upper surfaces 117 of the source electrode 105b and the drain electrode 105a, and the semiconductor channel layer 110 includes a first horizontal portion 110c over the upper surface of the fin structure 108 extending between the first vertical portion 110a and the second vertical portion 110b of the semiconductor channel layer 110, and the first horizontal portion 110c of the semiconductor channel layer 110 extends beyond the vertical planes of the respective sidewalls 109 of the source electrode 105b and the drain electrode 105a and contacts the respective upper surfaces 117 of each of the source electrode 105b and the drain electrode 105a.

In another embodiment, a vertical height H2 of the upper surface of the fin structure 108 is less than a vertical height H1 of the upper surfaces 117 of the source electrode 105b and the drain electrode 105a, and the semiconductor channel layer 110 includes a first horizontal portion 110c over the upper surface of the fin structure 108 extending between the first vertical portion 110a and the second vertical portion 110b of the semiconductor channel layer 110, and the first horizontal portion 110c of the semiconductor channel layer 110 contacts the respective sidewalls 109 of the source electrode 105b and the drain electrode 105a above the upper surface of the fin structure 108.

In another embodiment, the first horizontal portion 110c of the semiconductor channel layer 110 extends beyond the vertical planes of the respective sidewalls 109 of the source electrode 105b and the drain electrode 105a and contacts the respective upper surfaces 117 of each of the source electrode 105b and the drain electrode 105a.

In another embodiment, the semiconductor channel layer 110 includes indent portions 111 located between the source electrode 105b and the drain electrode 105a, where the width dimensions of the first and second vertical portions 110a, 110b of the semiconductor channel layer 110 in the indent portions 111 are less than the width dimensions of the first and second vertical portions 110a, 110b of the semiconductor channel layer 110 where the first and second vertical portions 110a, 110b of the semiconductor channel layer 110 contact the respective sidewalls 109 of the source electrode 105b and the drain electrode 105a.

In another embodiment, the semiconductor channel layer 110 includes a second horizontal portion 110d extending from the first vertical portion 110a and a third horizontal portion 110e extending from the second vertical portion 110b, where the indent portions 111 include void areas of the semiconductor channel layer 110 located over the second horizontal portion 110d and the third horizontal portion 110e.

In another embodiment, the gate dielectric layer 112 extends into and partially fills the indent portions 111 of the semiconductor channel layer 110, and the gate electrode 115a, 115b fills the remaining volume of the indent portions 111 such that portions of the gate electrode 115a, 115b located within the indent portions 111 are surrounded by the gate dielectric layer 112 and the semiconductor channel layer 110 on three side surfaces and the bottom surface of the gate electrode 115a, 115b.

In another embodiment, the source electrode 105b, the drain electrode 105a, the fin structure 108, the semiconductor channel layer 110, and the gate dielectric layer 112 are located over and contact an upper surface of a first dielectric layer 102, the semiconductor structure further including a conductive via 103 coupled to a bit line 101 that extends through the first dielectric layer 102 and contacts a lower surface of the drain electrode 105a.

In another embodiment, the semiconductor structure further includes a second dielectric layer 104 located over an upper surface and lateral side surfaces of the gate electrode 115a, 115b, and a second conductive via 116a-116d extending through the second dielectric layer 104 and the gate dielectric layer 112 and contacting an upper surface 117 of the source electrode 105b.

An additional embodiment is drawn to a semiconductor structure including a layer stack 601, 603 over a dielectric layer 104, the layer stack 601, 603 including a first electrode 105a, a pair of second electrodes 105b located on opposite sides of the first electrode 105a and laterally separated from the first electrode 105a along a first horizontal direction hd2, a pair of fin structures 108 extending along the first horizontal direction hd2, each fin structure 108 extending between and contacting a sidewall 109 of the first electrode 105a and a sidewall of a respective second electrode 105b of the pair of second electrodes 105b, and a semiconductor channel layer 110 located over an upper surface 117 and a sidewall 109 of a second electrode 105b of the pair of second electrodes 105b, an upper surface and side surfaces of a fin structure 108 of the pair of fin structures 108, an upper surface 117 and two opposing sidewalls 109 of the first electrode 105a, an upper surface and side surfaces of the other fin structure 108 of the pair of fin structures 108, and a sidewall 109 and an upper surface 117 of the other second electrode 105b of the pair of second electrodes 105b, a gate dielectric layer 112 over the upper surface and side surfaces of the layer stack 601, 603, and a pair of conductive word lines 115a, 115b over the gate dielectric layer 112 and extending along a second horizontal direction hd1, perpendicular to the first horizontal direction hd2, and laterally spaced from one another along the first horizontal direction hd2, where each conductive word line 115a, 115b of the pair of conductive word lines 115a, 115b extends over a respective fin structure 108 of the pair of fin structures 108 of the layer stack 601, 603.

In an embodiment, the layer stack 601, 603 is first layer stack 601, 603, and the semiconductor structure further includes a second layer stack 601, 603 over the dielectric layer 104 and laterally separated from the first layer stack 601, 603 along the second horizontal direction hd1, the second layer stack 601, 603 including a first electrode 105a, a pair of second electrodes 105b located on opposite sides of the first electrode 105a and laterally separated from the first electrode 105a along a first horizontal direction hd2, a pair of fin structures 108 extending along the first horizontal direction hd2, each fin structure 108 extending between and contacting a sidewall 109 of the first electrode 105a and a sidewall of a respective second electrode 105b of the pair of second electrodes 105b, and a semiconductor channel layer 110 located over an upper surface 117 and a sidewall 109 of a second electrode 105b of the pair of second electrodes 105b, an upper surface and side surfaces of a fin structure 108 of the pair of fin structures 108, an upper surface 117 and two opposing sidewalls 109 of the first electrode 105a, an upper surface and side surfaces of the other fin structure 108 of the pair of fin structures 108, and a sidewall 109 and an upper surface 117 of the other second electrode 105b of the pair of second electrodes 105b, and where the gate dielectric layer 112 extends over the upper surface and side surfaces of the second layer stack 601, 601 and over the upper surface of the dielectric layer 104 between the first layer stack 601, 603 and the second layer stack 601, 603, and each of the conductive word lines 115a, 115b of the pair of conductive word lines 115a, 115b extends continuously along the second horizontal direction hd1 over a respective fin structure 108 of the pair of fin structures 108 of the first layer stack 601, 603 and a respective fin structure 108 of the pair of fin structures 108 of the second layer stack 601, 603.

In another embodiment, the semiconductor structure further includes a first conductive bit line 101 extending along the first horizontal direction hd2 below a lower surface of the first layer stack 601, 603, a second conductive bit line 101 extending along the first horizontal direction hd2 below a lower surface of the second layer stack 601, 603, a first conductive via 103 extending from the first conductive bit line 101 through the dielectric layer 104 and contacting a lower surface of the first electrode 105a of the first layer stack 601, 603, and a second conductive via 103 extending from the second conductive bit line 101 through the dielectric layer 104 and contacting a lower surface of the first electrode 105a of the second layer stack 601, 603.

In another embodiment, the semiconductor structure further includes a second dielectric layer 104 over the gate dielectric layer 112 and laterally surrounding the pair of conductive word lines 115a, 115b, and a plurality of conductive vias 116a-116d extending through the second dielectric layer 104 and the gate dielectric layer 112 and contacting an upper surface 117 of each of the second electrodes 105b of the first layer stack 601, 603 and the second layer stack 601, 603.

In another embodiment, the first electrode 105a of the first layer stack 601, 603 is a common electrode of a first pair of thin-film transistor devices 120a-120d, and the first electrode 105a of the second layer stack 601, 603 is a common electrode of a second pair of thin-film transistor devices 120a-120d.

An additional embodiment is drawn to a method of fabricating a semiconductor structure that includes forming a source electrode 105b and a drain electrode 105a over a supporting substrate 8, forming a fin structure 108 between the source electrode 105b and the drain electrode 105a, where the fin structure 108 contacts respective sidewalls 109 of the source electrode 105b and the drain electrode 105a, forming a semiconductor channel layer 110 over an upper surface and first and second side surfaces of the fin structure 108, where the semiconductor channel layer 110 includes a first vertical portion 110a over a first side surface of the fin structure 108 and a second vertical portion 110b over the second side surface of the fin structure 108, and the first vertical portion 110a and the second vertical portion 110b of the semiconductor channel layer 110 contact the respective sidewalls 109 of the source electrode 105b and the drain electrode 105a, forming a gate dielectric layer 112 over the semiconductor channel layer 110, and forming a gate electrode 115a. 115b over the gate dielectric layer 112.

In an embodiment, forming the source electrode 105b and the drain electrode 105a includes forming a dielectric layer 106 over the supporting substrate 8, forming a patterned mask over the dielectric layer 106 including openings through the mask to expose an upper surface of the dielectric layer 106 at the bottom of each opening, performing an etching process through the patterned mask to remove portions of the dielectric layer 106 that are exposed through the openings in the mask to provide openings through the dielectric layer 106, removing the patterned mask, and forming a conductive material within the openings through the dielectric layer to provide a source electrode 105b and a drain electrode 105a laterally surrounded by the dielectric layer 106

In another embodiment, forming the fin structure 108 includes forming a patterned mask 107 over the upper surfaces of the source electrode 105b, the drain electrode 105a and the dielectric layer 106, where the patterned mask 107 includes a strip-shaped mask portion 107a, 107b over the upper surface of the dielectric layer 106 extending between the source electrode 105b and the drain electrode 105a, and performing an etching process through the patterned mask 107 to remove portions of the dielectric layer 106 that are exposed through the patterned mask 107, where a remaining portion of the dielectric layer 106 underlying the strip-shaped portion 107a, 107b of the patterned mask 107 forms the fin structure 108 extending between the source electrode 105b and the drain electrode 105a.

In another embodiment, the method further includes performing an additional etching process to vertically recess the upper surface of the dielectric layer 106 relative to the upper surfaces 117 of the source electrode 105b and the drain electrode 105a such that a vertical height H2 of the fin structure 108 is less than a vertical height H1 of the source electrode 105b and the drain electrode 105a, where the semiconductor channel layer 110 further includes a horizontal portion 110c extending over the upper surface of the fin structure 108 between the first vertical portion 110a and the second vertical portion 110b of the semiconductor channel layer 110, and the horizontal portion 110c of the semiconductor channel layer 110 contacts the respective sidewalls 109 of the source electrode 105b and the drain electrode 105a.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a source electrode;
   a drain electrode;
   a fin structure extending between and contacting respective sidewalls of the source electrode and the drain electrode;
   a semiconductor channel layer over an upper surface, a first side surface and a second side surface of the fin structure, wherein the semiconductor channel layer comprises a first vertical portion over the first side surface of the fin structure and a second vertical portion over the second side surface of the fin structure, and wherein the first vertical portion and the second vertical portion of the semiconductor channel layer contact the respective sidewalls of the source electrode and the drain electrode;
   a gate dielectric layer over the semiconductor channel layer; and
   a gate electrode over the gate dielectric layer.

2. The semiconductor structure of claim 1, wherein the fin structure comprises a dielectric material.

3. The semiconductor structure of claim 1, wherein the first vertical portion and the second vertical portion of the semiconductor channel layer contact the respective sidewalls of the source electrode and the drain electrode over a full vertical height of the respective sidewalls of the source electrode and the drain electrode.

4. The semiconductor structure of claim 1, wherein the upper surface of the fin structure is co-planar with respective upper surfaces of each of the source electrode and the drain electrode, and wherein the semiconductor channel layer comprises a first horizontal portion over the upper surface of the fin structure extending between the first vertical portion and the second vertical portion of the semiconductor channel layer, and the first horizontal portion of the semiconductor channel layer extends beyond a vertical plane of the each of the respective sidewalls of the source electrode and the drain electrode and contacts the respective upper surfaces of each of the source electrode and the drain electrode.

5. The semiconductor structure of claim 1, wherein a vertical height of the upper surface of the fin structure is less than a vertical height of respective upper surfaces of each of the source electrode and the drain electrode, and wherein the semiconductor channel layer comprises a first horizontal portion over the upper surface of the fin structure extending between the first vertical portion and the second vertical portion of the semiconductor channel layer, and the first horizontal portion of the semiconductor channel layer contacts the respective sidewalls of the source electrode and the drain electrode above the upper surface of the fin structure.

6. The semiconductor structure of claim 5, wherein the first horizontal portion of the semiconductor channel layer extends beyond a vertical plane of each of the respective sidewalls of the source electrode and the drain electrode to contact the respective upper surfaces of each of the source electrode and the drain electrode.

7. The semiconductor structure of claim 1, wherein the semiconductor channel layer comprises indent portions located between the source electrode and the drain electrode, wherein width dimensions of the first vertical portion and second vertical portion of the semiconductor channel layer in the indent portions are less than a width dimension of each of the first vertical portion and the second vertical portion of the semiconductor channel layer where the first vertical portion and second vertical portion of the semiconductor channel layer contact the respective sidewalls of the source electrode and the drain electrode.

8. The semiconductor structure of claim 7, wherein the semiconductor channel layer comprises a second horizontal portion extending from the first vertical portion and a third horizontal portion extending from the second vertical portion, wherein the indent portions comprise void areas of the semiconductor channel layer located over the second horizontal portion and the third horizontal portion.

9. The semiconductor structure of claim 7, wherein the gate dielectric layer extends into and partially fills the indent portions of the semiconductor channel layer, and the gate electrode fills a remaining volume of the indent portions such that portions of the gate electrode located within the indent portions are surrounded by the gate dielectric layer and the semiconductor channel layer on three side surfaces and a bottom surface of the gate electrode.

10. The semiconductor structure of claim 1, wherein the source electrode, the drain electrode, the fin structure, the semiconductor channel layer, and the gate dielectric layer are located over and contact an upper surface of a first dielectric layer, the semiconductor structure further comprising a conductive via coupled to a bit line that extends through the first dielectric layer and contacts a lower surface of the drain electrode.

11. The semiconductor structure of claim 10, further comprising a second dielectric layer located over an upper surface and lateral side surfaces of the gate electrode, and a second conductive via extending through the second dielectric layer and the gate dielectric layer and contacting an upper surface of the source electrode.

12. A semiconductor structure, comprising:
a layer stack over a dielectric layer, the layer stack comprising:
a first electrode;
a pair of second electrodes located on opposite sides of the first electrode and laterally separated from the first electrode along a first horizontal direction;
a pair of fin structures extending along the first horizontal direction, each fin structure extending between and contacting a sidewall of the first electrode and a sidewall of a respective second electrode of the pair of second electrodes; and
a semiconductor channel layer located over an upper surface and a sidewall of a second electrode of the pair of second electrodes, an upper surface and side surfaces of a first fin structure of the pair of fin structures, an upper surface and two opposing sidewalls of the first electrode, an upper surface and side surfaces of a second fin structure of the pair of fin structures, and a sidewall and an upper surface of another second electrode of the pair of second electrodes;
a gate dielectric layer over an upper surface and side surfaces of the layer stack; and
a pair of conductive word lines over the gate dielectric layer and extending along a second horizontal direction, perpendicular to the first horizontal direction, and laterally spaced from one another along the first horizontal direction, wherein each conductive word line of the pair of conductive word lines extends over a respective fin structure of the pair of fin structures of the layer stack.

13. The semiconductor structure of claim 12, wherein the layer stack comprises a first layer stack, and the semiconductor structure further comprises a second layer stack over the dielectric layer and laterally separated from the first layer stack along the second horizontal direction, the second layer stack comprising:
a first electrode;
a pair of second electrodes located on opposite sides of the first electrode and laterally separated from the first electrode along the first horizontal direction;
a pair of fin structures extending along the first horizontal direction, each fin structure extending between and contacting a sidewall of the first electrode and a sidewall of a respective second electrode of the pair of second electrodes; and
a semiconductor channel layer located over an upper surface and a sidewall of a second electrode of the pair of second electrodes, an upper surface and side surfaces of a fin structure of the pair of fin structures, an upper surface and two opposing sidewalls of the first electrode, an upper surface and side surfaces of another fin structure of the pair of fin structures, and a sidewall and an upper surface of another second electrode of the pair of second electrodes, and wherein:
the gate dielectric layer extends over an upper surface and side surfaces of the second layer stack and over an upper surface of the dielectric layer between the first layer stack and the second layer stack, and
each conductive word line of the pair of conductive word extends continuously along the second horizontal direction over a respective fin structure of the pair of fin structures of the first layer stack and a respective fin structure of the pair of fin structures of the second layer stack.

14. The semiconductor structure of claim 13, further comprising:
a first conductive bit line extending along the first horizontal direction below a lower surface of the first layer stack;
a second conductive bit line extending along the first horizontal direction below a lower surface of the second layer stack;
a first conductive via extending from the first conductive bit line through the dielectric layer and contacting a lower surface of the first electrode of the first layer stack; and
a second conductive via extending from the second conductive bit line through the dielectric layer and contacting a lower surface of the first electrode of the second layer stack.

15. The semiconductor structure of claim 14, further comprising:
- a second dielectric layer over the gate dielectric layer and laterally surrounding the pair of conductive word lines; and
- a plurality of conductive vias extending through the second dielectric layer and the gate dielectric layer and contacting a respective upper surface of each of the pair of second electrodes of the first layer stack and the second layer stack.

16. The semiconductor structure of claim 15, wherein the first electrode of the first layer stack comprises a common electrode of a first pair of transistor devices, and the first electrode of the second layer stack comprises a common electrode of a second pair of transistor devices.

17. A semiconductor structure, comprising:
- a first electrode;
- a second electrode;
- a fin structure extending between the first electrode and the second electrode and contacting a sidewall of the first electrode and a sidewall of the second electrode;
- a semiconductor channel layer over an upper surface, a first side surface and a second side surface of the fin structure and contacting the sidewall of the first electrode and the sidewall of the second electrode;
- a gate dielectric layer over the semiconductor channel layer; and
- a gate electrode over the gate dielectric layer.

18. The semiconductor structure of claim 17, wherein the fin structure comprises a dielectric material.

19. The semiconductor structure of claim 17, wherein the semiconductor channel layer contacts an upper surface of the first electrode and an upper surface of the second electrode.

20. The semiconductor structure of claim 17, wherein a vertical height of the upper surface of the fin structure is less than a vertical height of respective upper surfaces of each of the first electrode and the second electrode, wherein a portion of the semiconductor channel layer located over the upper surface of the fin structure extends continuously between the sidewall of the first electrode and the sidewall of the second electrode.

* * * * *